United States Patent
Gonzalez et al.

(10) Patent No.: US 9,793,421 B2
(45) Date of Patent: Oct. 17, 2017

(54) SYSTEMS, METHODS AND APPARATUS FOR PRECISION AUTOMATION OF MANUFACTURING SOLAR PANELS

(71) Applicant: SolarCity Corporation, San Mateo, CA (US)

(72) Inventors: Pablo Gonzalez, Fremont, CA (US); Jiunn Benjamin Heng, San Jose, CA (US); Bobby Yang, Los Altos Hills, CA (US); Peter P. Nguyen, San Jose, CA (US); Christoph Erben, Los Gatos, CA (US)

(73) Assignee: SolarCity Corporation, San Mateo, CA (US)

( * ) Notice: Subject to any disclaimer, the term of this patent is extended or adjusted under 35 U.S.C. 154(b) by 0 days.

(21) Appl. No.: 14/960,328

(22) Filed: Dec. 4, 2015

(65) Prior Publication Data

US 2016/0163914 A1    Jun. 9, 2016

Related U.S. Application Data

(60) Provisional application No. 62/088,509, filed on Dec. 5, 2014, provisional application No. 62/143,694, filed on Apr. 6, 2015.

(51) Int. Cl.
*B23P 19/04*    (2006.01)
*H01L 31/0224*    (2006.01)
(Continued)

(52) U.S. Cl.
CPC ...... *H01L 31/022433* (2013.01); *B23P 19/04* (2013.01); *H01L 31/049* (2014.12);
(Continued)

(58) Field of Classification Search
CPC ..... H01L 31/1876; H02S 20/25; H02S 50/10; B32P 19/04
See application file for complete search history.

(56) References Cited

U.S. PATENT DOCUMENTS

| 2,938,938 A | 5/1960 | Dickson, Jr. |
| 3,094,439 A | 6/1963 | Mann et al. |

(Continued)

FOREIGN PATENT DOCUMENTS

| CN | 104276750 A | 1/2015 |
| DE | 3238187 A1 | 4/1984 |

(Continued)

OTHER PUBLICATIONS

Nowlan, et al, "Advanced Automation Techniques for Interconnecting Thin Silicon Solar Cells," World Conference on Photovoltaic Energy, Waikoloa, Hawaii, Dec. 1994, IEEE, vol. Conf. 1, pp. 828-831.

(Continued)

*Primary Examiner* — Daniel McNally
(74) *Attorney, Agent, or Firm* — Kilpatrick Townsend & Stockton LLP

(57) ABSTRACT

Systems and methods for manufacturing solar panels are disclosed. Solar cells are placed on a conveyor that transports the cells from a start point to an end point. A laser scribing module scribes the cells at a predetermined depth. A paste dispensing module deposits a predetermined amount of conductive paste on the surface of the solar cells. A cleaving apparatus divides the cells into smaller strips. A shingling module creates a string of cells by overlapping the strips. A targeted annealing module cures the paste, and a layup module places the strings on a backsheet. A glass cover is then added to one side of the strings.

12 Claims, 47 Drawing Sheets

(51) Int. Cl.
*H01L 31/05* (2014.01)
*H01L 31/0443* (2014.01)
*H01L 31/049* (2014.01)
*H01L 31/18* (2006.01)
*H02S 20/25* (2014.01)
*H02S 50/10* (2014.01)

(52) U.S. Cl.
CPC ...... *H01L 31/0443* (2014.12); *H01L 31/0504* (2013.01); *H01L 31/0516* (2013.01); *H01L 31/188* (2013.01); *H01L 31/1876* (2013.01); *H02S 20/25* (2014.12); *H02S 50/10* (2014.12); *Y02B 10/12* (2013.01); *Y02E 10/50* (2013.01)

(56) References Cited

U.S. PATENT DOCUMENTS

| | | |
|---|---|---|
| 3,116,171 A | 12/1963 | Nielsen et al. |
| 3,340,096 A | 9/1967 | Mann et al. |
| 3,375,141 A | 3/1968 | Julius |
| 3,459,597 A | 8/1969 | Baron |
| 3,679,132 A | 7/1972 | Vehe et al. |
| 4,049,167 A | 9/1977 | Guissard |
| 4,420,361 A | 12/1983 | Valimont et al. |
| 4,428,518 A | 1/1984 | Abel |
| 4,435,719 A | 3/1984 | Snaper |
| 4,450,033 A | 5/1984 | Little |
| 4,561,541 A * | 12/1985 | Lawrence ............ H01L 31/048 136/290 |
| 4,577,051 A | 3/1986 | Hartmann |
| 4,652,693 A | 3/1987 | Bar-On |
| 4,877,460 A | 10/1989 | Flödl |
| 5,000,655 A | 3/1991 | Pate |
| 5,069,195 A | 12/1991 | Barozzi |
| 5,118,361 A | 6/1992 | Fraas et al. |
| 5,151,377 A | 9/1992 | Hanoka et al. |
| 5,178,685 A | 1/1993 | Borenstein et al. |
| 5,411,897 A | 5/1995 | Harvey et al. |
| 5,593,532 A | 1/1997 | Falk |
| 6,017,804 A | 1/2000 | Freund et al. |
| 6,171,933 B1 | 1/2001 | Xu et al. |
| 6,232,545 B1 | 5/2001 | Samaras et al. |
| 6,248,948 B1 | 6/2001 | Nakagawa et al. |
| 6,303,853 B1 | 10/2001 | Fraas et al. |
| 6,369,316 B1 | 4/2002 | Plessing et al. |
| 6,441,297 B1 | 8/2002 | Keller et al. |
| 6,538,193 B1 | 3/2003 | Fraas |
| 6,620,645 B2 | 9/2003 | Chandra et al. |
| 6,803,513 B2 | 10/2004 | Beernink et al. |
| 6,841,728 B2 | 1/2005 | Jones et al. |
| 6,919,530 B2 | 7/2005 | Borgeson et al. |
| 7,310,865 B2 | 12/2007 | Cole et al. |
| 7,323,634 B2 | 1/2008 | Speakman |
| 7,328,534 B2 | 2/2008 | Dinwoodie |
| 7,388,146 B2 | 6/2008 | Fraas et al. |
| 7,635,810 B2 | 12/2009 | Luch |
| 7,749,351 B2 | 7/2010 | Kataoka et al. |
| 7,749,883 B2 | 7/2010 | Meeus |
| 7,772,484 B2 | 8/2010 | Li et al. |
| 7,777,128 B2 | 8/2010 | Montello et al. |
| 7,825,329 B2 | 11/2010 | Basol |
| 7,829,781 B2 | 11/2010 | Montello et al. |
| 7,829,785 B2 | 11/2010 | Basol |
| 7,872,192 B1 | 1/2011 | Fraas et al. |
| 7,872,193 B2 | 1/2011 | Ogawa et al. |
| 7,906,365 B2 | 3/2011 | Sonobe |
| 7,956,337 B2 | 6/2011 | Svidenko et al. |
| 7,998,760 B2 | 8/2011 | Tabe |
| 8,024,854 B2 | 9/2011 | Lu et al. |
| 8,034,653 B2 | 10/2011 | Kannou |
| 8,052,036 B2 | 11/2011 | Chikaki |
| 8,071,420 B2 | 12/2011 | Su et al. |
| 8,076,568 B2 | 12/2011 | Luch et al. |
| 8,110,737 B2 | 2/2012 | Luch |
| 8,152,044 B2 | 4/2012 | Kawagoe et al. |
| 8,168,880 B2 | 5/2012 | Jacobs et al. |
| 8,196,798 B2 | 6/2012 | Luechinger et al. |
| 8,209,920 B2 | 7/2012 | Krause et al. |
| 8,220,685 B1 | 7/2012 | Lindsey, Jr. et al. |
| 8,222,513 B2 | 7/2012 | Luch |
| 8,227,723 B2 | 7/2012 | Benson et al. |
| 8,253,009 B2 | 8/2012 | Reinisch |
| 8,298,363 B2 | 10/2012 | Hashimoto et al. |
| 8,334,162 B2 | 12/2012 | Catalano et al. |
| 8,343,795 B2 | 1/2013 | Luo et al. |
| 8,469,345 B2 | 6/2013 | Samac et al. |
| 8,513,095 B1 | 8/2013 | Funcell et al. |
| 8,586,857 B2 | 11/2013 | Everson et al. |
| 8,657,991 B2 | 2/2014 | Potter et al. |
| 8,691,326 B2 | 4/2014 | Kojo et al. |
| 8,735,206 B2 | 5/2014 | Sumitomo et al. |
| 8,796,541 B2 | 8/2014 | Iwade et al. |
| 8,816,513 B2 | 8/2014 | Romig et al. |
| 8,847,063 B2 | 9/2014 | Terreau et al. |
| 8,912,429 B2 | 12/2014 | Wudu |
| 8,916,415 B2 | 12/2014 | Biro et al. |
| 8,921,684 B2 | 12/2014 | Shimizu |
| 8,945,986 B2 | 2/2015 | Romig et al. |
| 2001/0026349 A1 | 10/2001 | Furukawa et al. |
| 2002/0050672 A1 | 5/2002 | Moncavage |
| 2002/0056473 A1 | 5/2002 | Chandra et al. |
| 2003/0000571 A1 | 1/2003 | Wakuda et al. |
| 2003/0044539 A1 | 3/2003 | Oswald |
| 2003/0121228 A1 | 7/2003 | Stoehr et al. |
| 2003/0201007 A1 | 10/2003 | Fraas et al. |
| 2004/0036731 A1 | 2/2004 | Ready et al. |
| 2004/0247790 A1 | 12/2004 | Moriyama |
| 2005/0056213 A1 | 3/2005 | Iimori et al. |
| 2005/0056713 A1 | 3/2005 | Tisone et al. |
| 2005/0257823 A1 | 11/2005 | Zwanenburg |
| 2006/0289566 A1 | 12/2006 | Heerdt et al. |
| 2007/0151966 A1 | 7/2007 | Schwenke et al. |
| 2007/0169806 A1 | 7/2007 | Fork et al. |
| 2007/0169812 A1 | 7/2007 | Robinson et al. |
| 2007/0283997 A1 | 12/2007 | Hachtmann et al. |
| 2007/0294883 A1 | 12/2007 | Napetschnig |
| 2008/0035618 A1 | 2/2008 | Bruland |
| 2008/0213979 A1 | 9/2008 | Kannou |
| 2008/0230115 A1 | 9/2008 | Kannou |
| 2009/0097956 A1 | 4/2009 | Landes et al. |
| 2009/0139557 A1 | 6/2009 | Rose et al. |
| 2009/0167817 A1 | 7/2009 | Orr |
| 2009/0255565 A1 | 10/2009 | Britt et al. |
| 2009/0314334 A1 | 12/2009 | Saha |
| 2009/0314751 A1 | 12/2009 | Manens et al. |
| 2009/0324903 A1 | 12/2009 | Rumsby |
| 2010/0037932 A1 | 2/2010 | Erez et al. |
| 2010/0043863 A1 | 2/2010 | Wudu et al. |
| 2010/0071752 A1 | 3/2010 | Vellore et al. |
| 2010/0147364 A1 | 6/2010 | Gonzalez et al. |
| 2010/0184244 A1 | 7/2010 | Hunt |
| 2010/0190275 A1 | 7/2010 | Repmann et al. |
| 2010/0193014 A1 | 8/2010 | Johnson et al. |
| 2010/0218799 A1 | 9/2010 | Stefani |
| 2010/0221435 A1 | 9/2010 | Fork et al. |
| 2010/0224230 A1 | 9/2010 | Luch et al. |
| 2010/0269891 A1 | 10/2010 | Kinard et al. |
| 2010/0273279 A1 | 10/2010 | Su et al. |
| 2011/0033970 A1 | 2/2011 | Manens et al. |
| 2011/0065226 A1 * | 3/2011 | Luo ............ H01L 31/048 438/67 |
| 2011/0136265 A1 | 6/2011 | Shigenobu et al. |
| 2011/0156188 A1 | 6/2011 | Tu et al. |
| 2011/0179619 A1 | 7/2011 | Weigl |
| 2011/0198322 A1 | 8/2011 | Manens et al. |
| 2011/0239450 A1 | 10/2011 | Basol et al. |
| 2011/0259419 A1 | 10/2011 | Hagemann et al. |
| 2011/0262627 A1 | 10/2011 | Schwenke et al. |
| 2011/0284070 A1 | 11/2011 | Suzuki |
| 2011/0290300 A1 | 12/2011 | Battenhausen |
| 2012/0000502 A1 | 1/2012 | Wiedeman et al. |
| 2012/0028404 A1 | 2/2012 | Frey |
| 2012/0040487 A1 | 2/2012 | Asthana et al. |
| 2012/0049430 A1 | 3/2012 | Aceti et al. |

(56) References Cited

U.S. PATENT DOCUMENTS

| | | |
|---|---|---|
| 2012/0060911 A1 | 3/2012 | Fu et al. |
| 2012/0080508 A1* | 4/2012 | Schultz ............... B23K 1/0016 228/179.1 |
| 2012/0125391 A1 | 5/2012 | Pinarbasi et al. |
| 2012/0145218 A1 | 6/2012 | Son et al. |
| 2012/0152349 A1 | 6/2012 | Cao et al. |
| 2012/0181259 A1 | 7/2012 | Kwong et al. |
| 2012/0196029 A1 | 8/2012 | Nelson |
| 2010/0218805 A1 | 9/2012 | Everett et al. |
| 2012/0240985 A1 | 9/2012 | Hashimoto |
| 2012/0240995 A1 | 9/2012 | Coakley |
| 2012/0248497 A1 | 10/2012 | Zhou et al. |
| 2012/0279548 A1 | 11/2012 | Münch et al. |
| 2012/0288983 A1 | 11/2012 | Chu et al. |
| 2012/0312791 A1 | 12/2012 | Harley et al. |
| 2012/0318319 A1 | 12/2012 | Pinarbasi et al. |
| 2012/0318340 A1 | 12/2012 | Heng et al. |
| 2012/0325282 A1 | 12/2012 | Snow et al. |
| 2013/0052768 A1 | 2/2013 | Gee et al. |
| 2013/0065353 A1 | 3/2013 | Albrecht et al. |
| 2013/0095578 A1 | 4/2013 | Baccini et al. |
| 2013/0096710 A1 | 4/2013 | Pinarbasi et al. |
| 2013/0112234 A1 | 5/2013 | Ishii |
| 2013/0113156 A1 | 5/2013 | Keller |
| 2013/0122616 A1* | 5/2013 | Degroot ............... H01L 22/14 438/17 |
| 2013/0122639 A1 | 5/2013 | DeGroot et al. |
| 2013/0126576 A1 | 5/2013 | Marshall et al. |
| 2013/0136565 A1 | 5/2013 | Amsden et al. |
| 2013/0139869 A1 | 6/2013 | Nuernberger et al. |
| 2013/0152996 A1 | 6/2013 | DeGroot et al. |
| 2013/0167910 A1 | 7/2013 | DeGroot et al. |
| 2013/0206213 A1 | 8/2013 | He et al. |
| 2013/0206221 A1 | 8/2013 | Gannon et al. |
| 2013/0237000 A1 | 9/2013 | Tabe et al. |
| 2013/0255766 A1 | 10/2013 | Shin et al. |
| 2013/0272833 A1 | 10/2013 | Duncan et al. |
| 2013/0319499 A1 | 12/2013 | Yokochi et al. |
| 2013/0340813 A1 | 12/2013 | Momozaki et al. |
| 2014/0054795 A1 | 2/2014 | Romig et al. |
| 2014/0115894 A1 | 5/2014 | Gamboa |
| 2014/0124013 A1 | 5/2014 | Morad et al. |
| 2014/0124014 A1 | 5/2014 | Morad et al. |
| 2014/0127856 A1 | 5/2014 | Romig et al. |
| 2014/0134777 A1 | 5/2014 | Hashimoto |
| 2014/0138421 A1 | 5/2014 | Gagnon et al. |
| 2014/0150844 A1 | 6/2014 | Azechi et al. |
| 2014/0186975 A1 | 7/2014 | Buller et al. |
| 2014/0196768 A1 | 7/2014 | Heng et al. |
| 2014/0352777 A1 | 12/2014 | Hachtmann et al. |
| 2014/0353894 A1 | 12/2014 | DesJardien et al. |
| 2014/0373892 A1 | 12/2014 | Bergmann et al. |
| 2015/0004740 A1 | 1/2015 | Cho |
| 2015/0013596 A1 | 1/2015 | Matsumoto et al. |
| 2015/0076214 A1 | 3/2015 | Kodama et al. |
| 2015/0090314 A1 | 4/2015 | Yang et al. |
| 2015/0144180 A1 | 5/2015 | Baccini et al. |
| 2015/0270410 A1 | 9/2015 | Heng et al. |
| 2015/0349145 A1 | 12/2015 | Morad et al. |
| 2015/0349153 A1 | 12/2015 | Morad et al. |
| 2015/0349161 A1 | 12/2015 | Morad et al. |
| 2015/0349162 A1 | 12/2015 | Morad et al. |
| 2015/0349167 A1 | 12/2015 | Morad et al. |
| 2015/0349168 A1 | 12/2015 | Morad et al. |
| 2015/0349169 A1 | 12/2015 | Morad et al. |
| 2015/0349170 A1 | 12/2015 | Morad et al. |
| 2015/0349171 A1 | 12/2015 | Morad et al. |
| 2015/0349172 A1 | 12/2015 | Morad et al. |
| 2015/0349173 A1 | 12/2015 | Morad et al. |
| 2015/0349174 A1 | 12/2015 | Morad et al. |
| 2015/0349175 A1 | 12/2015 | Morad et al. |
| 2015/0349176 A1 | 12/2015 | Morad et al. |
| 2015/0349190 A1 | 12/2015 | Morad et al. |
| 2015/0349193 A1 | 12/2015 | Morad et al. |
| 2015/0349701 A1 | 12/2015 | Morad et al. |
| 2015/0349702 A1 | 12/2015 | Morad et al. |
| 2015/0349703 A1 | 12/2015 | Morad et al. |
| 2016/0158890 A1 | 6/2016 | Gonzalez et al. |
| 2016/0163907 A1 | 6/2016 | Gonzalez et al. |
| 2016/0163908 A1 | 6/2016 | Gonzalez et al. |
| 2016/0163909 A1 | 6/2016 | Gonzalez et al. |
| 2016/0163910 A1 | 6/2016 | Gonzalez et al. |
| 2016/0163912 A1 | 6/2016 | Gonzalez et al. |
| 2016/0163913 A1 | 6/2016 | Gonzalez et al. |

FOREIGN PATENT DOCUMENTS

| | | | |
|---|---|---|---|
| DE | 4030713 A1 | 4/1992 | |
| DE | 102009044060 A1 | 3/2011 | |
| DE | 102012003455 A1 | 8/2013 | |
| EP | 1057542 A2 | 12/2000 | |
| EP | 1205982 A2 | 5/2002 | |
| EP | 1770791 A1 | 4/2007 | |
| EP | 1816684 A2 | 8/2007 | |
| EP | 1973168 A2 | 9/2008 | |
| EP | 2362430 A1 | 8/2011 | |
| EP | 2439782 A1 | 4/2012 | |
| EP | 2 340 556 B1 | 8/2012 | |
| EP | 2521190 A1 | 11/2012 | |
| EP | 2634818 A1 | 9/2013 | |
| EP | 2677550 A1 | 12/2013 | |
| JP | S59 117235 A | 7/1984 | |
| JP | H09 19918 A | 1/1997 | |
| JP | H11 79770 A | 3/1999 | |
| JP | H11 192616 A | 7/1999 | |
| JP | 2010 128407 A | 6/2010 | |
| JP | 2011 026136 A | 2/2011 | |
| JP | WO 2012127932 A1 * | 9/2012 | ......... H01L 31/0504 |
| JP | 2012-256738 A | 12/2012 | |
| KR | 20100064698 A | 6/2010 | |
| KR | 20120096322 A | 8/2012 | |
| KR | 20130034910 A | 4/2013 | |
| KR | 20130084516 A | 7/2013 | |
| KR | 101396151 B1 | 5/2014 | |
| WO | 9617387 A1 | 6/1996 | |
| WO | 0044051 | 1/2000 | |
| WO | 01/41967 A1 | 6/2001 | |
| WO | 03/098704 A1 | 11/2003 | |
| WO | 2008089657 A1 | 7/2008 | |
| WO | 2008/152678 A1 | 12/2008 | |
| WO | 2009/047815 A1 | 4/2009 | |
| WO | 2011/017572 A2 | 2/2011 | |
| WO | 2012/087462 A1 | 6/2012 | |
| WO | 2013020590 A1 | 2/2013 | |
| WO | 2013/068982 A1 | 5/2013 | |
| WO | 2013/105750 A1 | 7/2013 | |
| WO | 2013/138802 A1 | 9/2013 | |
| WO | 2013/175535 A1 | 11/2013 | |
| WO | 2014/002229 A1 | 1/2014 | |
| WO | 2014074826 A2 | 5/2014 | |
| WO | 2014124495 A1 | 8/2014 | |
| WO | 2015/106170 A2 | 7/2015 | |
| WO | 2015/183827 A2 | 12/2015 | |

OTHER PUBLICATIONS

"Solar Cell: History, Technology, Trends and Status", retrieved from the Internet on Dec. 7, 2015, from http://www.eai.in/ref/global/ae/sol/celltech/cell_tech.html, 16 pages.

Non-Final Office Action for U.S. Appl. No. 14/804,306, mailed Oct. 20, 2015, 14 pages.

First Action Interview Pilot Program Pre-Interview Communication for U.S. Appl. No. 14/826,129 mailed Dec. 22, 2015, 5 pages.

Non-Final Office Action for U.S. Appl. No. 14/866,776, mailed Jan. 20, 2016, 10 pages.

International Search Report and Written Opinion for International PCT Application No. PCT/US2015/064138, mailed Mar. 10, 2016, 13 pages.

International Search Report and Written Opinion for International PCT Application No. PCT/US2015/064090, mailed Mar. 14, 2016, 13 pages.

(56) References Cited

OTHER PUBLICATIONS

Non-Final Office Action for U.S. Appl. No. 14/866,806, mailed Mar. 15, 2016, 26 pages.
International Search Report and Written Opinion for International PCT Application No. PCT/US2015/064083, mailed Mar. 18, 2016, 12 pages.
International Search Report and Written Opinion for International PCT Application No. PCT/US2015/064060, mailed Mar. 24, 2016, 12 pages.
International Search Report and Written Opinion for International PCT Application No. PCT/US2015/064137, mailed Mar. 31, 2016, 14 pages.
International Search Report and Written Opinion for International PCT Application No. PCT/US2015/064116, mailed Apr. 4, 2016, 13 pages.
International Search Report and Written Opinion for International PCT Application No. PCT/US2015/064136, mailed Apr. 13, 2016, 13 pages.
International Search Report and Written Opinion for International PCT Application No. PCT/US2015/064072, mailed Apr. 18, 2016, 13 pages.
First Action Interview Office Action Summary for U.S. Appl. No. 14/826,129 mailed Jun. 2, 2016, 7 pages.
Final Office Action for U.S. Appl. No. 14/804,306, mailed Jun. 17, 2016, 17 pages.
Final Office Action for U.S. Appl. No. 14/866,776, mailed Jul. 14, 2016, 10 pages.
Unpublished U.S. Appl. No. 14/804,306, filed Jul. 20, 2015, by Pablo Gonzalez et al. (57 pages).
Unpublished U.S. Appl. No. 14/826,129, filed Aug. 13, 2015, by Pablo Gonzalez et al. (66 pages).
Unpublished U.S. Appl. No. 14/866,776, filed Sep. 25, 2015, by Pablo Gonzalez et al. (52 pages).
Unpublished U.S. Appl. No. 14/866,806, filed Sep. 25, 2015, by Pablo Gonzalez et al. (53 pages).
Unpublished U.S. Appl. No. 14/866,817, filed Sep. 25, 2015, by Pablo Gonzalez et al. (47 pages).
Unpublished U.S. Appl. No. 14/877,870, filed Oct. 7, 2015, by Pablo Gonzalez et al. (51 pages).
Unpublished U.S. Appl. No. 14/930,616, filed Nov. 2, 2015, by Pablo Gonzalez (54 pages).
Floedl, H. et al., "Komplexe Herstellverfahren und Hochleistungsstrukturen für kostengünstige kristalline Silicium-Dünnschicht-Solarzellen," (English translation: "Complex methods of production and high efficiency structures for cost-effective crystalline thin-film silicon solar cells Final report"), Forschungsbericht. Bundesministerium für Forschung und Technologie (BMFT), Dec. 1992, Germany, retrieved from the Internet on Oct. 12, 2015, from http://www.opengrey.eu/item/display/10068/200783?lang=en (Abstract Only), 2 pages.
"Solar Cell Technologies| History, Working, Business Opportunities and Production Line," Webite of Energy Alternatives India (EAI), Tamilnadu, India. Retrieved from the Internet on Feb. 4, 2016, from http://webcache.googleusercontent.com/search?q=cache:4yv5UCQoCnMJ:www.eai.in/ref/global/ae/sol/celltech/cell_tech.html+&cd=3&hl=en&ct=clnk&gl=us (Google cache of http://www.eai.in/ref/global/ae/sol/celltech/cell_tech.html), 16 pages.
Final Office Action for U.S. Appl. No. 14/866,806, mailed Sep. 16, 2016, 29 pages.
Final Office Action for U.S. Appl. No. 14/826,129, mailed Oct. 26, 2016, 11 pages.
Notice of Allowance for U.S. Appl. No. 14/866,776, mailed Dec. 5, 2016, 10 pages.
Notice of Allowance for U.S. Appl. No. 14/866,776, mailed Jan. 18, 2017, 7 pages.
Non-Final Office Action for U.S. Appl. No. 14/804,306, mailed Jan. 27, 2017, 21 pages.
Non-Final Office Action for U.S. Appl. No. 14/866,817, mailed Feb. 9, 2017, 8 pages.
Notice of Allowance for U.S. Appl. No. 14/826,129, mailed Feb. 15, 2017, 9 pages.
Final Office Action for U.S. Appl. No. 14/804,306, mailed Apr. 27, 2017, 21 pages.
Non-Final Office Action for U.S. Appl. No. 14/877,870, dated Jul. 10, 2017, 10 pages.

* cited by examiner

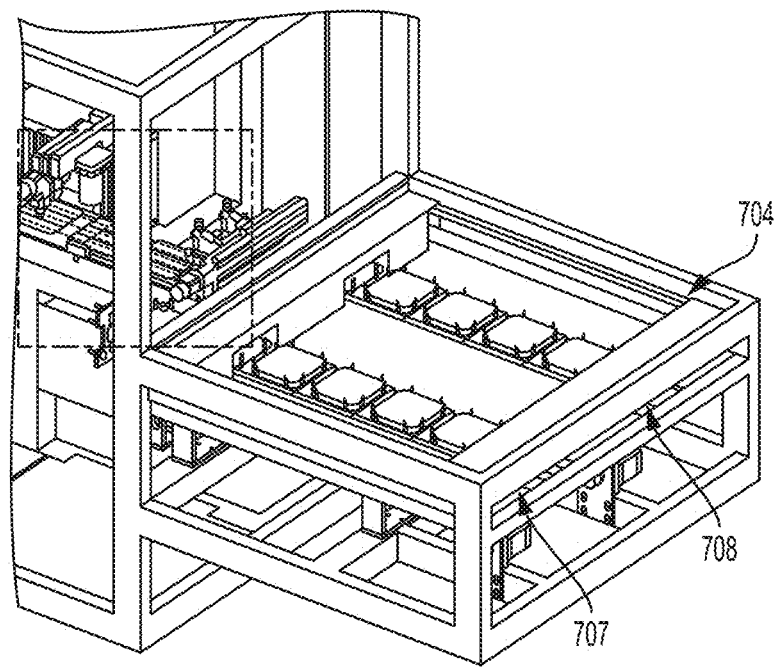
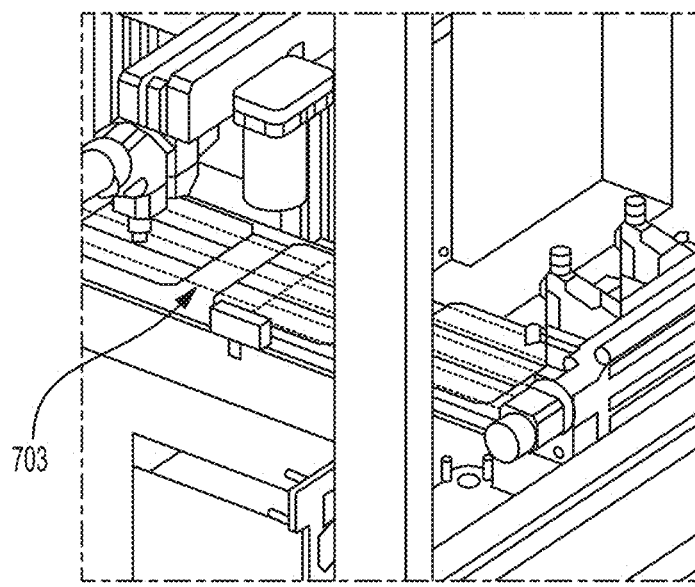
FIG. 7B

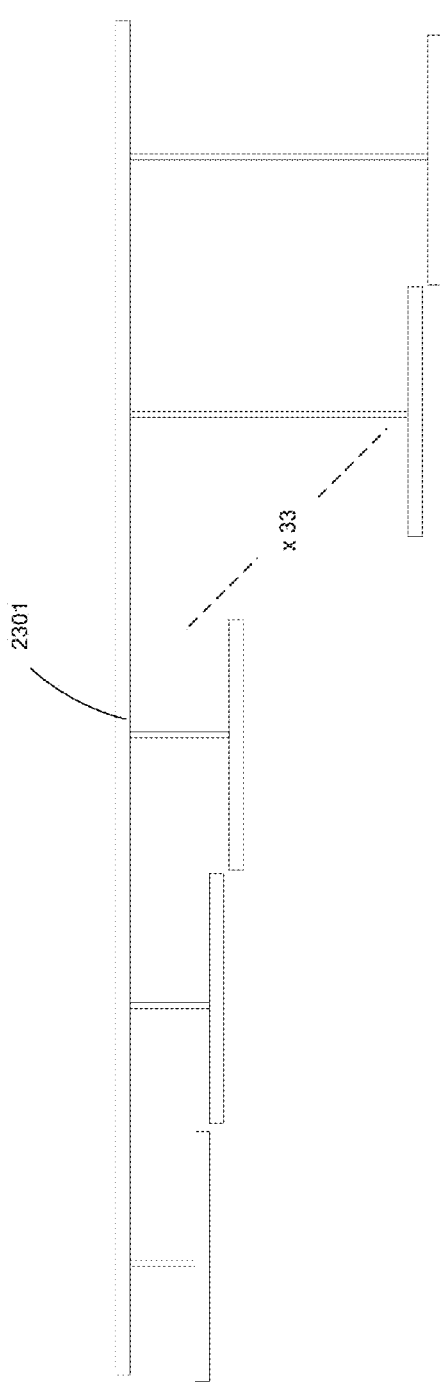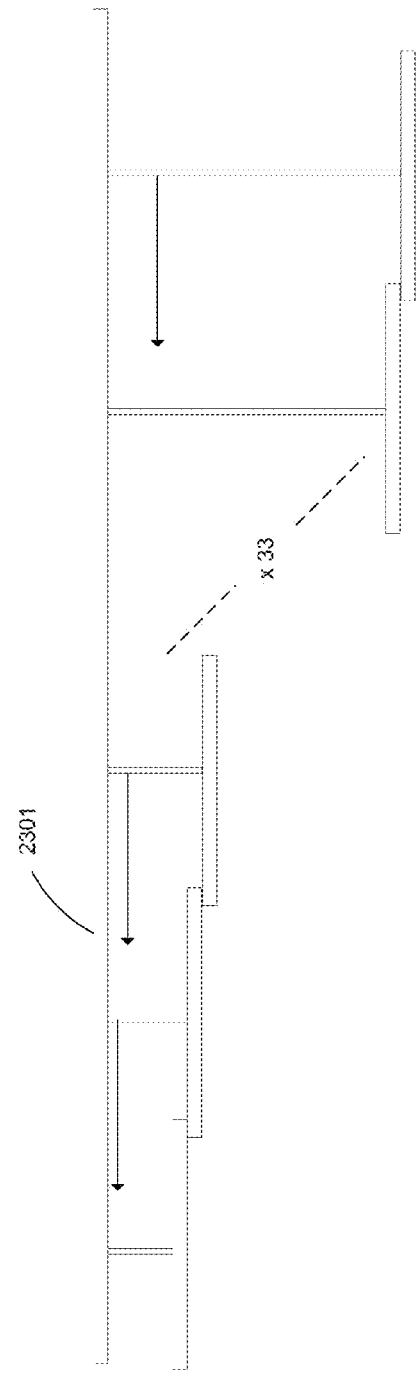

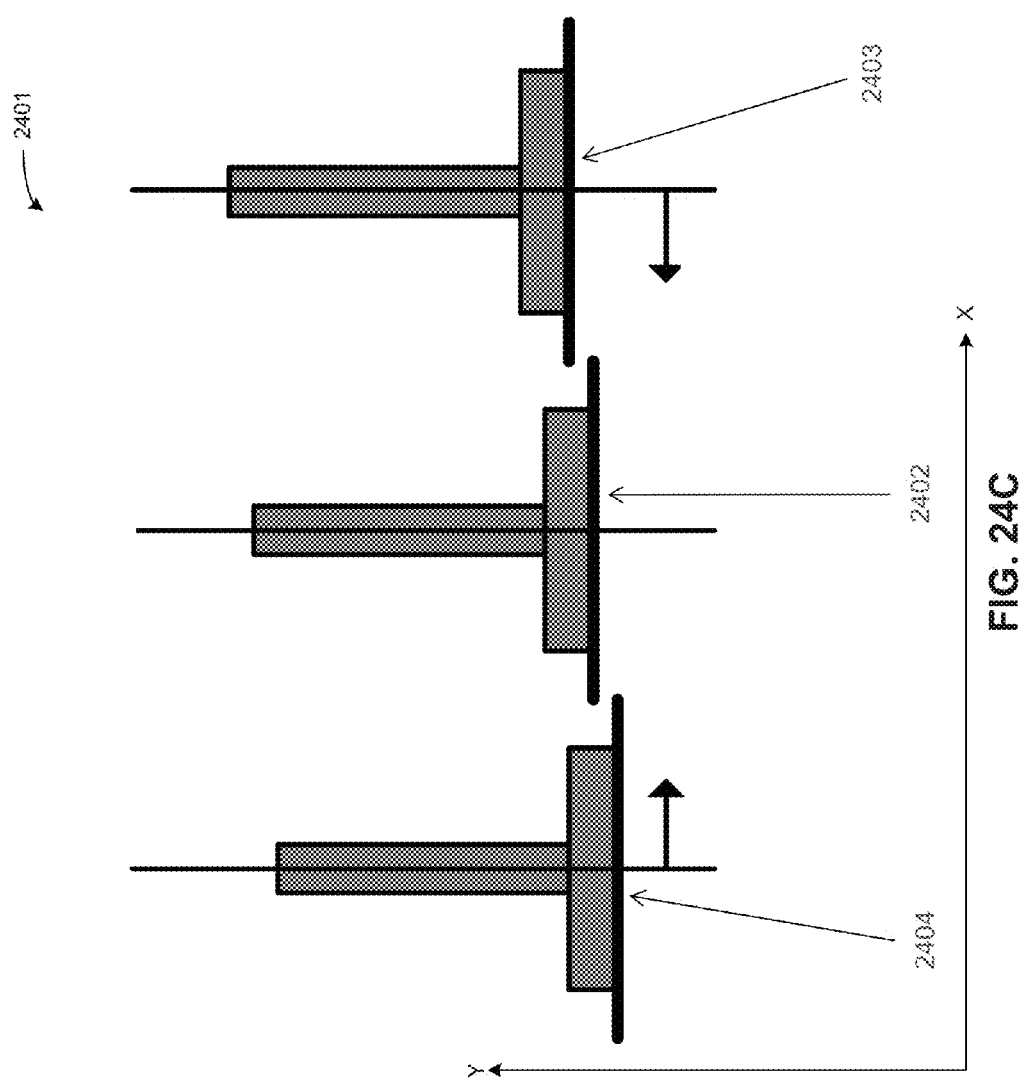

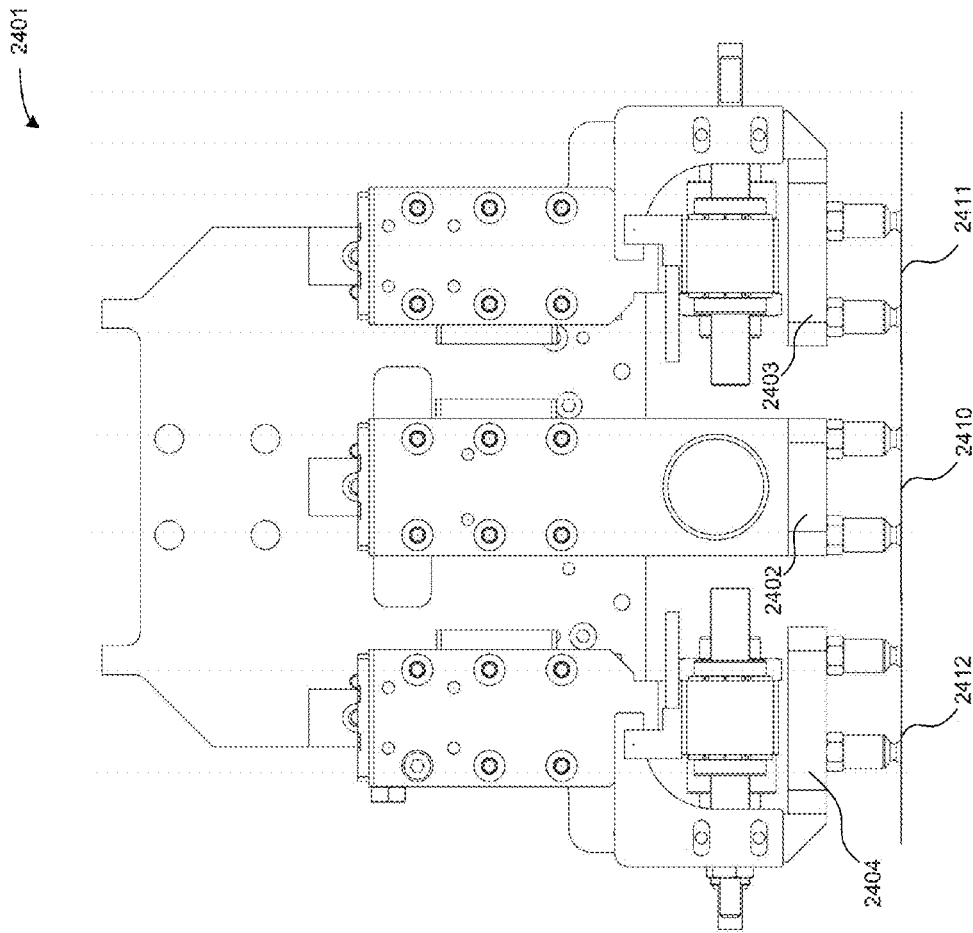

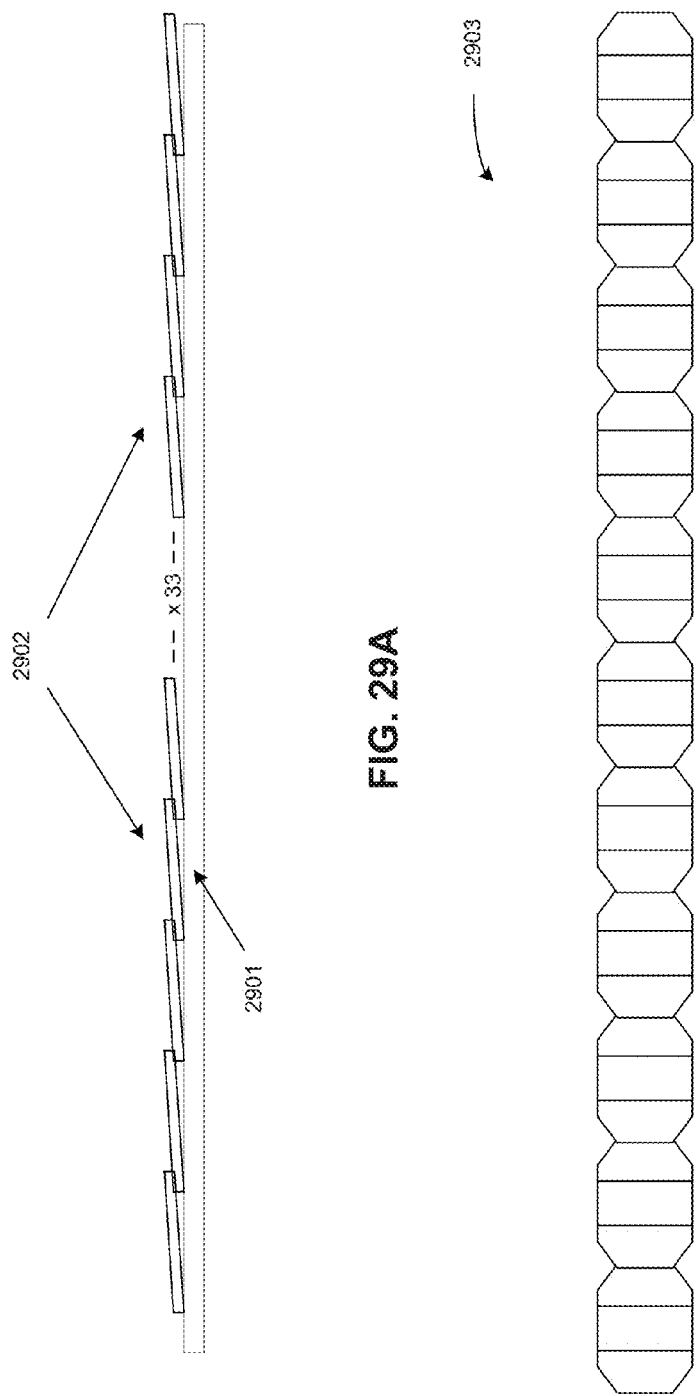

SYSTEMS, METHODS AND APPARATUS FOR PRECISION AUTOMATION OF MANUFACTURING SOLAR PANELS

CROSS-REFERENCES TO RELATED APPLICATIONS

This application claims the benefit of priority under 35 U.S.C. §119(e) to U.S. Provisional Patent Application No. 62/088,509, entitled "SYSTEM, METHOD, AND APPARATUS FOR AUTOMATIC MANUFACTURING OF SOLAR PANELS," filed Dec. 5, 2014; and U.S. Provisional Patent Application No. 62/143,694, entitled "SYSTEMS AND METHODS FOR PRECISION AUTOMATION OF MANUFACTURING SOLAR PANELS," filed Apr. 6, 2015, disclosures of which are incorporated herein by reference in their entirety for all purposes.

FIELD OF THE INVENTION

Embodiments of the invention pertain to methods, systems and apparatus for automated manufacturing of solar panels.

DEFINITIONS

"Solar cell" or "cell" is a photovoltaic structure capable of converting sun light into electricity. A cell may have any size and any shape. A solar cell may be created from a variety of materials. A solar cell may be in the form of a silicon wafer having a photovoltaic structure. It may be a glass with a photovoltaic structure that may be formed by one or more thin-film layers. In addition, a solar cell may be a plastic or any other material capable of supporting a photovoltaic structure on its surfaces.

"Solar cell strip" or "strip" is a segment of a solar cell. A solar cell may be divided into a number of strips. A strip may have any shape and any size. The width and height of a strip may the same or different.

"String of shingled cells," "string of shingled strips," "shingled string," or "string" may be formed by electrically and/or physically connecting a number of strips or a number of solar cells. For example, a string may be created by overlapping two or more strips. Two or more strips may be electrically connected in series and/or in parallel.

BACKGROUND OF THE INVENTION

The negative environmental impact of fossil fuels and their rising cost have resulted in a dire need for cleaner, cheaper alternative energy sources. Among different forms of alternative energy sources, solar power has been favored for its cleanness and wide availability.

A solar cell converts light into electricity using the photovoltaic effect. There are several basic solar cell structures, including a single p-n junction, p-i-n/n-i-p, and multi-junction. A typical single p-n junction structure includes a p-type doped layer and an n-type doped layer. Solar cells with a single p-n junction can be homojunction solar cells or heterojunction solar cells. If both the p-doped and n-doped layers are made of similar materials (materials with equal band gaps), the solar cell is called a homojunction solar cell. In contrast, a heterojunction solar cell includes at least two layers of materials of different bandgaps. A p-i-n/n-i-p structure includes a p-type doped layer, an n-type doped layer, and an intrinsic (undoped) semiconductor layer (the i-layer) sandwiched between the p-layer and the n-layer. A multi junction structure includes multiple single junction structures of different bandgaps stacked on top of one another.

In a solar cell, light is absorbed near the p-n junction generating carriers. The carriers diffuse into the p-n junction and are separated by the built-in electric field, thus producing an electrical current across the device and external circuitry. An important metric in determining a solar cell's quality is its energy-conversion efficiency, which is defined as the ratio between power converted (from absorbed light to electrical energy) and power collected when the solar cell is connected to an electrical circuit. High efficiency solar cells are essential in reducing cost to produce solar energies.

In practice, multiple individual solar cells are interconnected, assembled, and packaged together to form a solar panel, which can be mounted onto a supporting structure. Multiple solar panels can then be linked together to form a solar system that generates solar power. Depending on its scale, such a solar system can be a residential roof-top system, a commercial roof-top system, or a ground-mount utility-scale system. Note that, in such systems, in addition to the energy conversion efficiency of each individual cell, the ways cells are electrically interconnected within a solar panel also determine the total amount of energy that can be extracted from each panel. Due to the serial internal resistance resulting from the inter-cell connections, an external load can only extract a limited percentage of the total power generated by a solar panel.

Continuous strings of solar cells that form a solar panel exist. Each string includes several solar cells that overlap one another. This overlapping technique is referred to as "shingling." U.S. patent application Ser. No. 14/510,008, filed Oct. 8, 2014 and entitled "Module Fabrication of Solar Cells with Low Resistivity Electrodes," describes several technical advantages that result from shingled cells.

Manufacturing a shingled panel can involve connecting two solar cells by overlapping the cells so that the metal layers on each side of the overlapped cells establish an electrical connection. This process is repeated for a number of successive cells until one string of shingled cells is created. A number of strings are then connected to each other and placed in a frame. One form of shingled panel, as described in the above-noted patent application, includes a series of solar cell strips created by dividing solar cells into smaller pieces (i.e. the strips). These smaller strips are then shingled to form a string.

One problem that arises in manufacturing such shingled panels is that the assembly of shingled strings of solar cells requires precise alignment of the cells to ensure proper electrical connection. Given the level of precision needed to create a shingled string, it is not feasible to manufacture such solar panels in volume manually.

BRIEF SUMMARY OF THE INVENTION

Embodiments of the invention are directed to systems and methods for precision automation of shingled panels by utilizing automated electro-mechanical systems that act in concert to manufacture shingled solar panels.

Several embodiments are described to allow one of ordinary skill in the art to appreciate the general subject matters that this specification covers. For ease of reading, every possible variation and/or embodiment is not covered in this section. Therefore, this summary should not be construed to limit the scope of the invention.

System, apparatus and methods for precision automated assembly and manufacturing of solar panels are provided.

Solar cells can have more than one metal layer on each side. The metal layers can collect electrons and holes that result from the photovoltaic reaction that occurs when the sun light is absorbed by the photovoltaic structure of a cell. Each side of the solar cell can include metal layers that are wider than the others. These wider metal layers are sometimes called "busbars" while the smaller metal layers are often referred to as "fingers."

The metal layers can be arranged in a manner such that when a solar cell is divided into two or more smaller solar cell strips, each smaller strip has at least one busbar and a number of fingers to harvest the generated electricity by the solar cell. Additionally, at least one side of a strip can have a busbar that runs substantially along the length of the strip. The other side of the strip can also have a busbar that runs substantially along the length of the strip, but at the opposite end of the busbar on the first side. When the strips are shingled together, one busbar of one strip can be electrically and physically connected to a busbar on another strip. This process can be repeated multiple times to form a string of shingled strips.

An automated system for manufacturing shingled solar panels can include a storage and loading mechanism that stores a number of solar cells. A robotic arm can place the solar cells from the storage mechanism on a conveyor that transports the cells through a series of stations. Each station may include one or more electro-mechanical system that performs an operation on the solar cells. An exemplary series of operations will now be described according to one embodiment.

The cells can be passed through a laser scribe module that scribes the cells up to a predetermined depth and or length along one or more predetermined regions on the surface of the cells. This module may be positioned, for example, above the conveyor that transports the cells and can emit a laser beam that penetrates the solar cells while being moved, or between movements, by the conveyor.

A paste dispensing module can deposit a number of conductive paste droplets, or one or more strands of paste, on the busbars of the solar cells as they are transported by the conveyor. The paste dispensing module may be positioned above the conveyor that transports the cells and deposits the paste on the surface of the busbars.

A mechanical arm can lift the cells and place them on a cleaving apparatus that divides the cells into a number of solar cell strips. The cleaving apparatus can have a flat surface that supports a middle portion of a cell, and another surface adjacent to or connected to the flat surface at an angle. An actuator can then push one or more portions of the cell against the cleaving apparatus causing the cell to break along the scribed lines, forming two or more strips.

Two or more mechanical arms can then lift the strips and align them in a stepped formation. The alignment into a stepped formation may be done before, during or after lifting of the strips. In the stepped formation, the busbars of adjacent strips may be substantially aligned. The mechanical arms then place the strips on a surface of a platform and form a shingle. The conductive paste that was previously applied on the busbars can adhere the two strips. This process is repeated until a string of shingled cells is formed.

As an optional step, before adding a strip to a string, the strips may be tested for structural and/or electrical integrity. The testing can involve using a probe to establish an electrical connection between two metal contacts of one strip. In one embodiment, the probe can apply a voltage to the busbar while the cell is placed on a grounded surface. A current running through the cell can then be measured to determine whether the cell functions as expected.

A conductive tab can be attached to at least one end of the string of shingled cells. The conductive tab can be attached to a busbar on one side of the string and provide an electrical contact on the opposite side of the string. If each strip has at least one busbar on each side, the busbars at the far ends of the shingled string are normally positioned on opposite sides of the string. However, preferably a string should be electrically accessible from the same side. The tab allows one of the busbars at one end to be electrically accessible from the other side.

The overlapping areas of the shingled string can then be thermally cured by a targeted annealing module. The string can be placed on a platform with several openings that allow access to the string from underneath the platform. The targeted annealing module can then apply several heat-treating bars from the top and the bottom of the string. The heat can be applied to targeted locations on the string where the strips overlap. These overlapping areas also may be proximate to where the conductive paste is disposed on the busbars. The heat-treating bars can then cure the paste between the busbars of two adjacent strips.

Each string can be placed on a backsheet and the strings can be electrically connected to form a shingled solar panel. An automated lifting mechanism can be used to place a backsheet on a platform. A paste dispensing mechanism can apply paste on one or more locations of the backsheet. The strings can then be attached to the backsheet via the paste. Heat can then be applied to the backsheet to cure the paste. The platform that supports the backsheet can then be rotated from a face-up position to a face-down position. When the platform is rotated, the backsheet can then be placed on a glass, or other transparent surface, that supports the front side of the panel exposed to sun light.

The backsheet can be designed in a way that allows electrical access to various locations of the panel. A junction box can then be attached to the back of the backsheet. The panel may then be covered by a frame to complete the assembly process.

It will be understood by those skilled in the art that the order of the above processes may vary, and one or more of processes may be eliminated as appropriate.

BRIEF DESCRIPTION OF THE DRAWINGS

FIG. 7B shows placement of solar cells on a conveyor according an embodiment of the invention.

FIG. 23A shows lifting solar cells to form a shingled assembly according to an embodiment of the invention.

FIG. 23B shows lifting solar cells to form a shingled assembly according to an embodiment of the invention.

FIG. 24C shows a shingling module for assembly of shingled strings of solar cells according to an embodiment of the invention.

FIG. 24E shows a shingling module for assembly of shingled strings of solar cells according to an embodiment of the invention.

FIGS. 29A and 29B show an annealing process according to an embodiment of the invention.

DETAILED DESCRIPTION OF THE INVENTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the disclosure. Thus, the invention is not limited to the embodiments described and shown.

Embodiments of the invention provide methods, systems and apparatus for precision automated assembly and manufacturing of shingled solar panels. During fabrication, conventional solar cells comprising multi-layer semiconductor structures may first be fabricated using conventional silicon wafers. In some embodiments, the multi-layer semiconductor structure can include a double-sided tunneling heterojunction solar cell. The solar cells can have a standard size, such as the standard 5-inch or 6-inch squares. In some embodiments, the solar cells may be 6×6 inch square-shaped cells. Subsequently, front- and back-side metal grids may be deposited on the front and back surfaces of the solar cells respectively to complete the bifacial solar cell fabrication (see FIGS. 1A and 1B).

In some embodiments, depositing the front- and back-side metal grids may include electroplating of a Cu grid, which may be subsequently coated with Ag or Sn. In other embodiments, one or more seed metal layers, such as a seed Cu or Ni layer, can be deposited onto the multi-layer structures using a physical vapor deposition (PVD) technique to improve adhesion and ohmic contact quality of the electroplated Cu layer. Different types of metal grids can be formed, including, but not limited to: a metal grid with a single busbar at the center and a metal grid with a single busbar at the cell edge. In the "edge-busbar" configuration, the busbars at the front and back surfaces of the solar cells may be placed at opposite edges, respectively.

Because standard 5- or 6-inch solar cells may be divided into smaller strips, which can involve a laser-based scribe-and-cleave process, special patterns for the metal grid may be used. First, the metal grid layout allows a conventional cell to be divided into multiple smaller strips. Second, due to the malleability of the Cu grid, it can be difficult to cleave a wafer across the Cu grid lines. Therefore, as illustrated in FIGS. 1A and 1B, when depositing the metal grid, blank spaces can be reserved to facilitate the subsequent cell-dividing process.

Figure 1A:
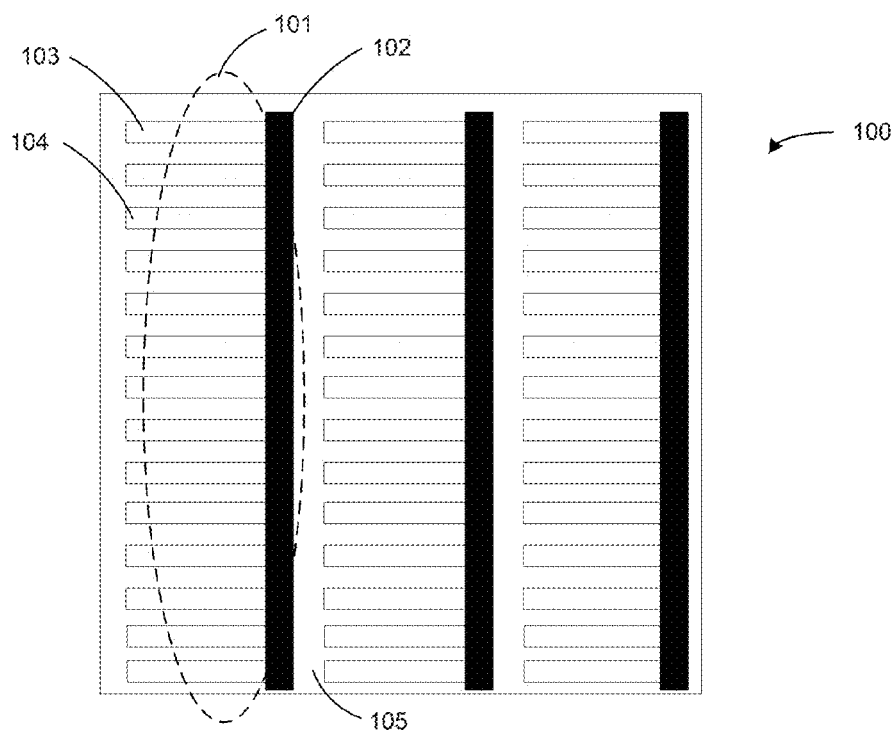
FIG. 1A shows a solar cell according to an embodiment of the invention.

FIG. 1A shows an exemplary metal grid pattern on the front surface of a solar cell, according to one embodiment. In the example shown in FIG. 1A, metal grid 100 includes three sub-grids, such as sub-grid 101. Each sub-grid may be designed to be the front-side grid for the strip of cell. Hence, the three sub-grid configuration allows the solar cell to be divided into three strips of cells. Various types of metal grid patterns can be used for each sub-grid, such as a conventional grid pattern with double busbars, a single center-busbar grid pattern, a single edge-busbar grid pattern, etc. In the example shown in FIG. 1A, the sub-grids have a single edge-busbar pattern.

Figure 1B:
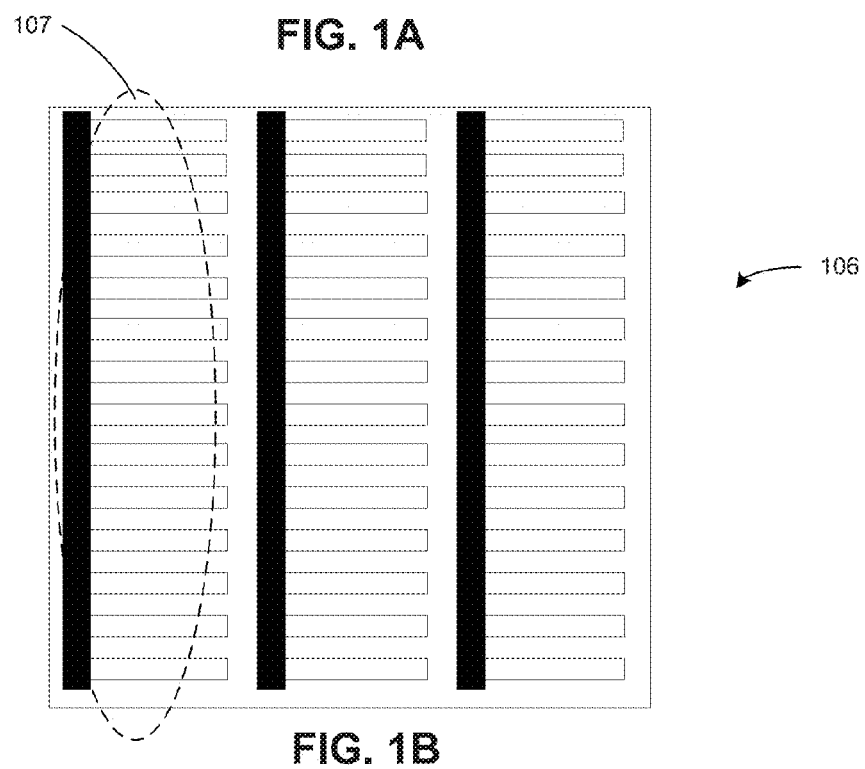
FIG. 1B shows a solar cell according to an embodiment of the invention.

In the embodiment shown in FIGS. 1A and 1B, each sub-grid includes an edge-busbar running along the longer edge of the corresponding strip of cell and a number of parallel finger lines running in a direction parallel to the shorter edge of the solar cell strip. For example, sub-grid 101 includes an edge-busbar 102, and a number of finger lines, such as finger lines 103 and 104. To facilitate a subsequent laser-based scribe-and-cleave process, a predefined blank space (with no metal deposition) is placed between the adjacent sub-grids.

For example, blank space 105 may be defined to separate sub-grid 101 from its adjacent sub-grid. In some embodiments, the width of the blank space, such as blank space 105, can be between 0.5 mm and 2 mm. There is a tradeoff between a wider space that leads to an easier scribing operation and a narrower space that leads to more effective current collection. In one embodiment, the width of such a blank space may be 1 mm.

FIG. 1B shows an exemplary metal grid pattern on the back surface of a solar cell. In the example shown in FIG. 1B, back metal grid 106 includes three sub-grids, such as sub grid 107. For the strips of cells to be bifacial, the backside sub-grid may correspond to the front side sub-grid. In this example, the front side of the cell includes three sub-grids, and each sub-grid has a single edge-busbar. In the embodiment shown in FIGS. 1A and 1B, the front and backside sub-grids have similar patterns except that the front and back edge-busbars are located adjacent to opposite edges of the strip of cell. In other words, in the example shown in FIGS. 1A and 1B, the busbar on the front side of the strip is located at one edge of the front surface, and the busbar on the back side is located at the opposite edge of the back surface. In addition, the locations of the blank spaces in back metal grid 106 correspond to locations of the blank spaces in front metal grid 100, such that the Cu grid lines do not interfere with the subsequent wafer-cutting process.

Subsequent to depositing the front and back metal grid, each solar cell may be divided into multiple smaller cells. Various techniques can be used to divide the cells. In some embodiments, a laser-based scribe-and-cleave technique is used. More specifically, a high-power laser beam may be used to scribe the surface of the solar cell at the desired locations (such as blank space 105) to a pre-determined depth, followed by applying appropriate force to cleave the scribed solar cell into multiple smaller cells. The depth can be about 30 to 50 microns in one embodiment, or 20% of the total thickness of the cell in another embodiment.

Figure 1C:
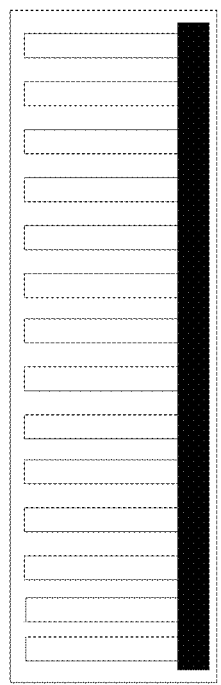
FIG. 1C shows a solar cell resulting from dividing the cell shown in FIGS. 1A and 1B, according to an embodiment of the invention.
Figure 1D:
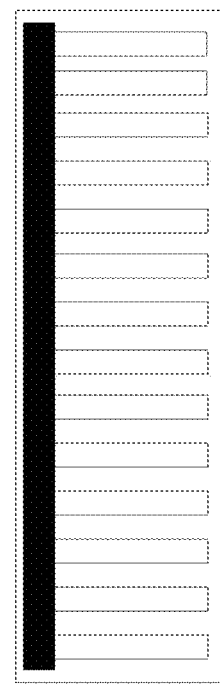
FIG. 1D shows a solar cell resulting from dividing the cell shown in FIGS. 1A and 1B, according to an embodiment of the invention.

In one embodiment, in order to prevent damage to the emitter junction, laser scribing may be performed on the surface corresponding to the surface field layer. For example, if the emitter junction is at the front surface of the solar cell, the laser scribing may be applied to the back surface of the solar cell. In another embodiment, only certain predetermined portions of the cell are laser scribed. For example, only the outer edges of the cells are laser scribed and the cleave process will then result in division of the cell into strips along a line in blank space 105. In another embodiment, the cells may be divided by applying temperature differential instead of, or in addition to, laser scribe. In this embodiment, one side of the cell can be exposed to low temperature while another side can be exposed to high temperature. As a result of the temperature differential between two regions, the cell breaks at the point in between the two regions having different temperatures. FIG. 1C shows the front side of a strip (region 101 shown in FIG. 1A) that is obtained after cleaving the cell 100. FIG. 1D shows the backside which corresponds to region 107 in FIG. 1B.

Figure 2A:
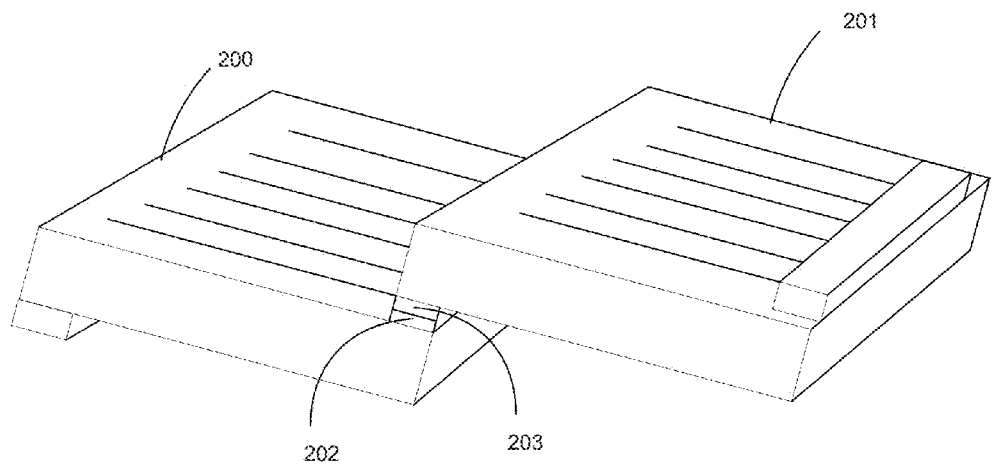
FIG. 2A shows formation of shingled solar panel according to an embodiment of the invention.
Figure 2B:
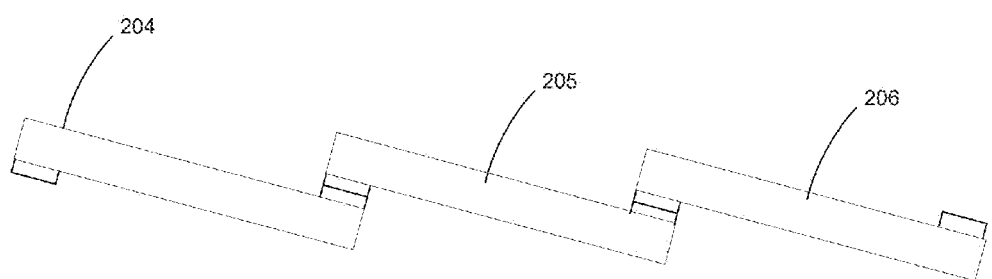
FIG. 2B shows formation of shingled solar panel according to an embodiment of the invention.

After the formation of the smaller cells, a number of the smaller cells may be connected together in series to form a solar cell string. In some embodiments, two rows of smaller cells with each row including 32 smaller cells are connected in series to form a U-shaped string. In some embodiments, depending on the busbar configuration, the conventional stringing process may be modified. For the single edge-busbar configuration as shown in FIGS. 2A and 2B, each solar cell may be rotated 90 degrees, and a single tab that is as long as the long edge of the smaller cell and is between 3 and 12 mm in width can be used to connect two adjacent smaller cells. In some embodiments, the width of the single tab can be between 3 and 5 mm. Detailed descriptions of connecting two adjacent smaller cells using a single tab can be found in U.S. patent application Ser. No. 14/153,608, entitled "MODULE FABRICATION OF SOLAR CELLS WITH LOW RESISTIVITY ELECTRODES," by inventors Jiunn Benjamin Heng, Jianming Fu, Zheng Xu, and Bobby Yang and filed 13 Jan. 2014, the disclosure of which is incorporated by reference in its entirety herein.

FIG. 2A shows a series of solar cells arranged such that they form a "shingled" pattern. FIG. 2A shows the serial connection between two adjacent smaller cells with a single edge-busbar per surface. In FIG. 2A, the strip of solar cell 200 and the strip of solar cell 201 are coupled to each other via edge-busbar 202 located at the top surface of the solar cell strip 200, and an edge-busbar 203 located at the bottom surface of the solar cell strip 201. More specifically, in one embodiment, the bottom surface of the strip 201 partially overlaps with the top surface of the strip 200 at the edge in such a way that bottom edge-busbar 203 is placed on top of and in electrical contact with top edge-busbar 202.

In some embodiments, the edge-busbars that are in contact with each other are soldered together to enable the serial electrical connection between adjacent solar cell strips. In further embodiments, the soldering may happen concurrently with a lamination process, during which the edge-overlapped solar cell strips are placed in between a front-side cover and a back-side cover along with appropriate sealant material. The sealant material can include adhesive polymer, such as ethylene vinyl acetate (EVA). During lamination, heat and pressure are applied to cure the sealant, sealing the solar cells between the front-side and back-side covers. The same heat and pressure can result in the edge-busbars that are in contact, such as edge-busbars 202 and 203, being soldered together. If the edge-busbars include a top Sn layer, there is no need to insert additional soldering or adhesive materials between the top and bottom edge busbars (such as edge-busbars 202 and 203) of adjacent solar cells. Also note that because the smaller cells are relatively flexible, the pressure used during the lamination process can be relatively large without the worry that the cells may crack under such pressure. In some embodiments, the pressure applied during the lamination process can be above 1.0 atmospheres, for example 1.2 atmospheres.

In some embodiments, the edge-busbars are connected via a conductive paste. In one embodiment, a conductive paste may include a conductive metallic core that is surrounded by a resin. When the paste is applied to a metal layer such as the busbar, the metallic core establishes an electrical connection with the metal layer while the resin that surrounds the metallic core functions as an adhesive. In another embodiment, a conductive paste may be in a form of a resin that includes a number of conductive particles such as Ag. The conductive particles may be coated with a protection layer that evaporates when the paste is thermally cured and thereby result in electrical conductivity between the conductive particles that are suspended inside the resin.

FIG. 2B shows the side-view of a string of shingled strips. In FIG. 2B, strip 204 partially overlaps adjacent strip 205, which also partially overlaps (on its opposite end) cell 206. Such a string forms a pattern that is similar to roof shingles. In some embodiments, the three strips shown in FIG. 2B may be part of a standard 6-inch square or a pseudo-square solar cell, with each strip of solar cell having a dimension of 2 inches by 6 inches. Compared with an undivided 6-inch solar cell, the partially overlapped strips provide roughly the same photo-generation area, but can lead to less power being consumed by the series resistance due to the reduced current.

In one embodiment, the overlapping may be kept to a minimum to minimize shading that may be caused by the overlapping and maximize the surface area that will be exposed to sun light. In some embodiments, the single busbars (both at the top and the bottom surface) may be placed at the very edge of the strip (as shown in FIG. 2B), thus minimizing the overlapping. To ensure that strips in two adjacent strings are connected in series, the two adjacent strings may have opposite shingle patterns. Moreover, a wide metal tab can be used to serially connect the end strips at the two adjacent strings. Detailed descriptions of serially connecting solar cells in a shingled pattern can be found in U.S. patent application Ser. No. 14/510,008, filed on Oct. 8, 2014 and entitled "Module Fabrication of Solar Cells with Low Resistivity Electrodes," the disclosure of which is incorporated herein by reference in its entirety.

Figure 2C:
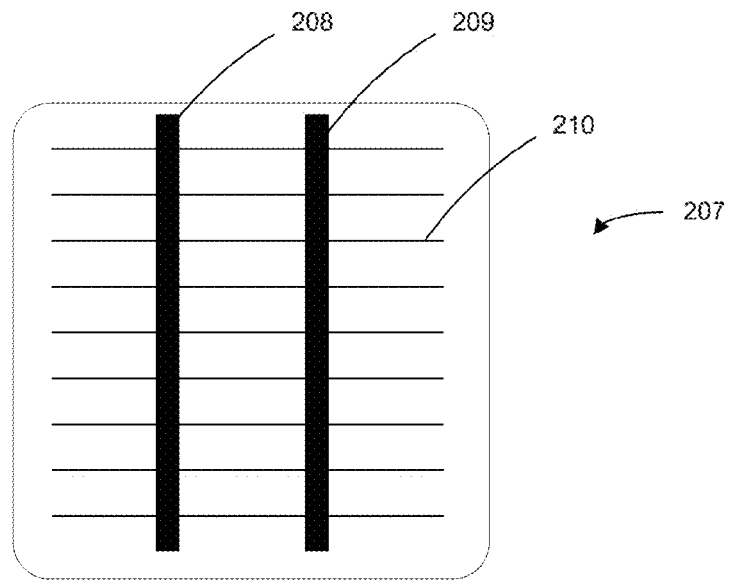
FIG. 2C shows a solar cell, according to an embodiment of the invention.
Figure 2D:
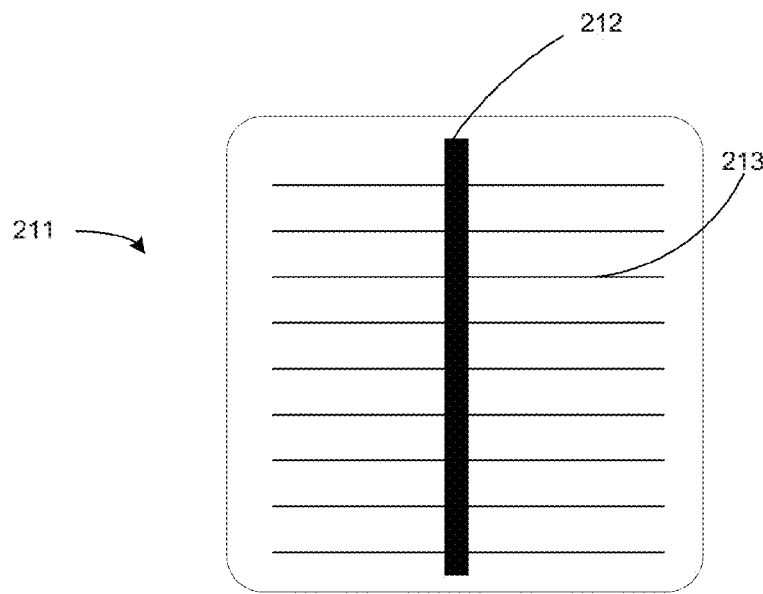
FIG. 2D shows a solar cell, according to an embodiment of the invention.

Solar cells may have a variety of metal grid pattern. FIGS. 2C and 2D show two exemplary solar cells with different metal grids. FIG. 2C shows solar cell 207 having two busbars 208 and 209 and a number of fingers 210. As shown in FIG. 2C, busbars are parallel with respect to each other and substantially run along the length of the solar cell. FIG. 2D shows solar cell 211 having one busbar 212 and a number of fingers 213. As shown in FIG. 2D busbar 212 is in the middle of the solar cell 211. However, the busbar may be located at any location on the surface of the cell and in any orientation.

Figure 3:
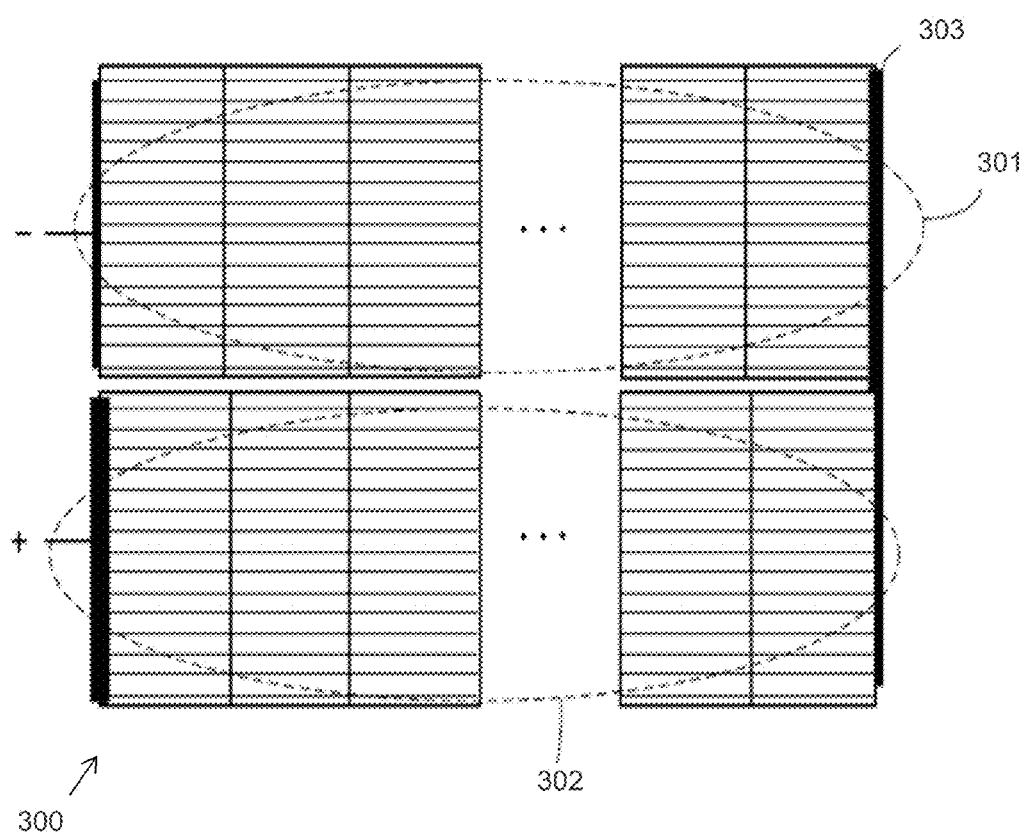
FIG. 3 shows formation of shingled solar panel according to an embodiment of the invention.

FIG. 3 shows the top view of an exemplary string of shingled cells that includes two strings, according to one embodiment. In FIG. 3, string 300 includes two sub-strings, top string 301 and bottom string 302. Each string includes a number of strips of cells arranged in a shingled pattern. The serial connection is made by the overlapping the busbars at the edge of each strip. As a result, when viewing from the top, no busbar is visible on each strip. In FIG. 3, metal tab 303 couples the top edge-busbar of the strip at the end of string 301 to the bottom busbar at the end of the string 302. At the left end of the strings, lead wires can be soldered onto the top and bottom edge busbars of the end smaller cells, forming the output electrode of string 300 to enable electrical connections between string 302 and other strings.

Subsequent to the formation of multiple strings, the multiple strings are laid out next to each other to form a panel. In some embodiments, three U-shaped strings are laid out next to each other to form a panel that includes 6 strings of strips of cells. After laying out the strings, the front-side cover is applied. In some embodiments, the front-side cover may be made of glass.

Figure 4:
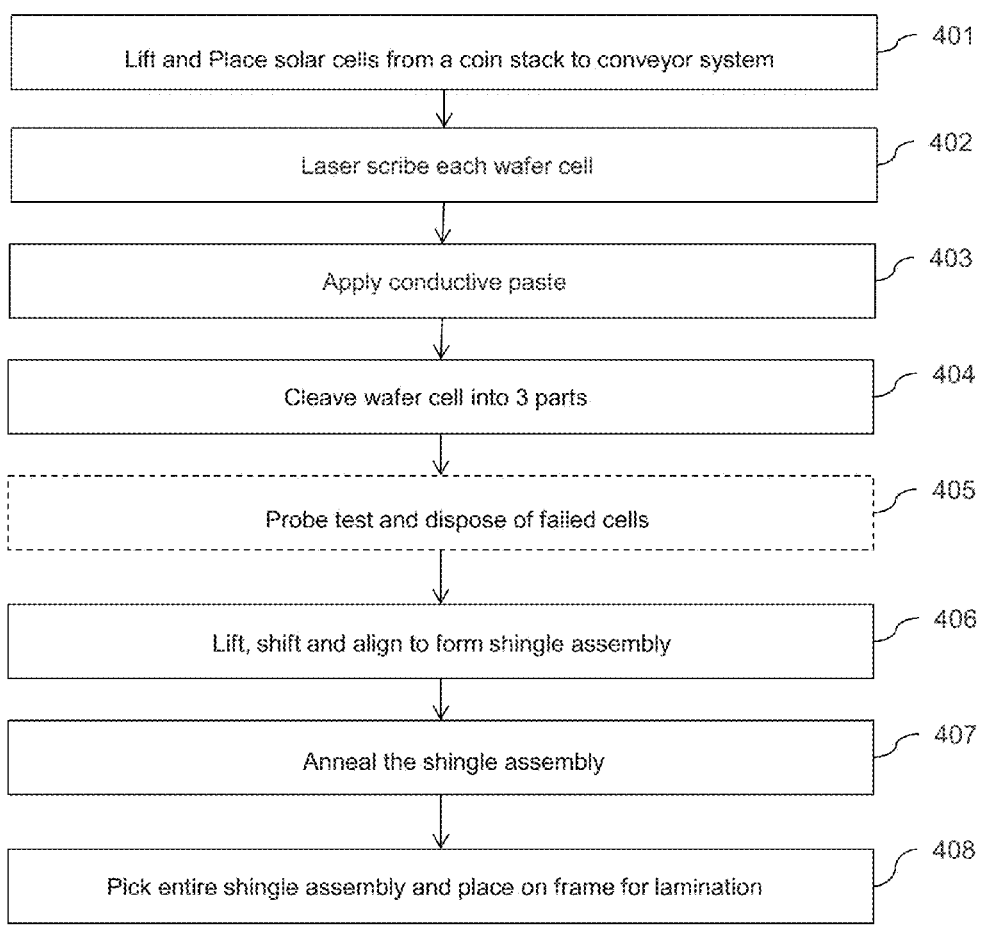
FIG. 4 shows a flowchart describing a precision automated assembly process for solar panels.

The automated processes, methods, systems and apparatus for assembly of the "shingled" solar panel that was described above will now be described according to the embodiments. FIG. 4 shows a flowchart that describes the steps involved in the automated process for assembly of the shingled solar panel. It will be understood by those skilled in the art that the order of the steps may be switched and/or some of the steps may be combined. The flowchart of FIG. 4 is one example of the automated assembly process and is not intended to be limiting. Furthermore, the specific operation(s) described within each of the steps may be changed with other operations that achieve similar result. For example, the laser scribing in step 402 that divides the cells may instead be replaced by temperature differential operation described above. Thus, it will be understood by those skilled in the art that various other operation(s) disclosed in this application may be used instead of those shown in FIG. 4. The process will now be described with reference to FIG. 4 and other corresponding figures that show each of the steps in FIG. 4.

Figure 5:
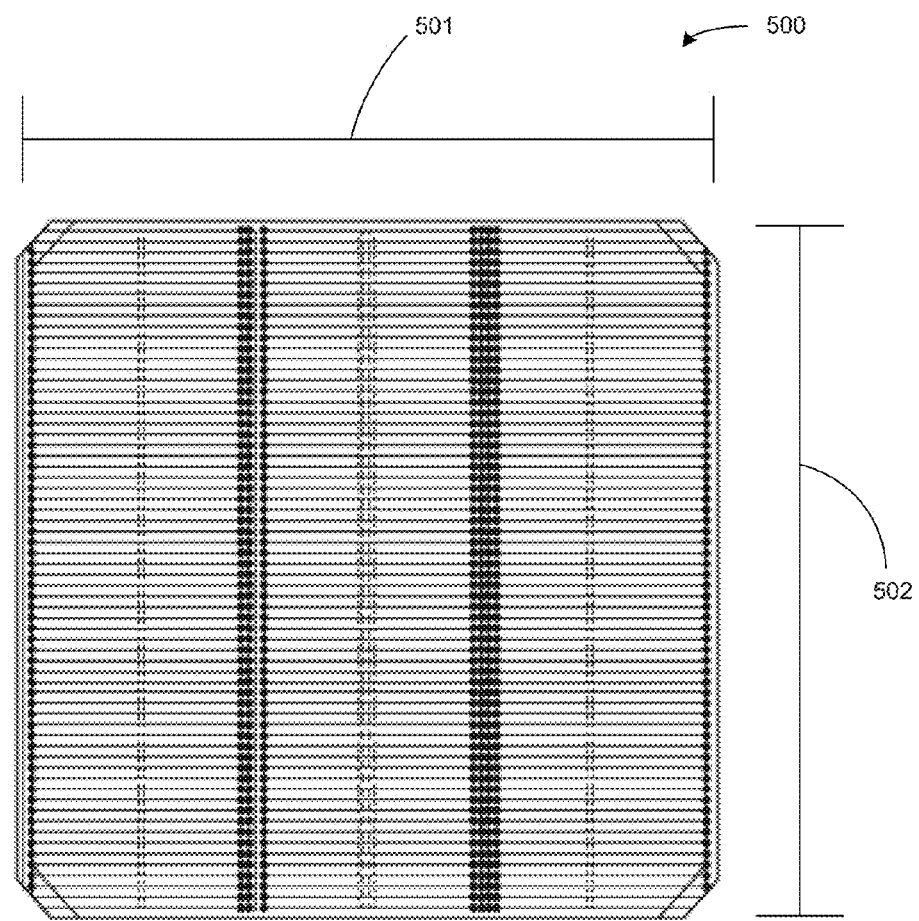
FIG. 5 shows a solar cell according to an embodiment of the invention.

FIG. 5 shows exemplary solar cell 500 with dimensions 501 and 502. Solar cell 500 may be similar to the solar cell described in FIGS. 1A and 1B. In some embodiments, both dimensions 501 and 502 may be 156 mm, so that exemplary solar cell is 156 mm×156 mm. In some embodiments, the final panel that results from using solar cells of FIG. 5 may be 1702 mm×980 mm and the shingle cell layout of such a panel may be 1668 mm by 946 mm. it will be understood, however, that these dimensions are exemplary and do not limit the scope of the invention. A panel with other dimensions may be created. In one embodiment, dimensions of a panel may be dependent upon the size of the solar cell from which the strips are extracted, and the amount of desired power that a panel should generate. Solar cells such as solar cell 500 may be placed in a number of coin stacks prior to assembly of a solar panel as will be described in detail below.

Figure 6:
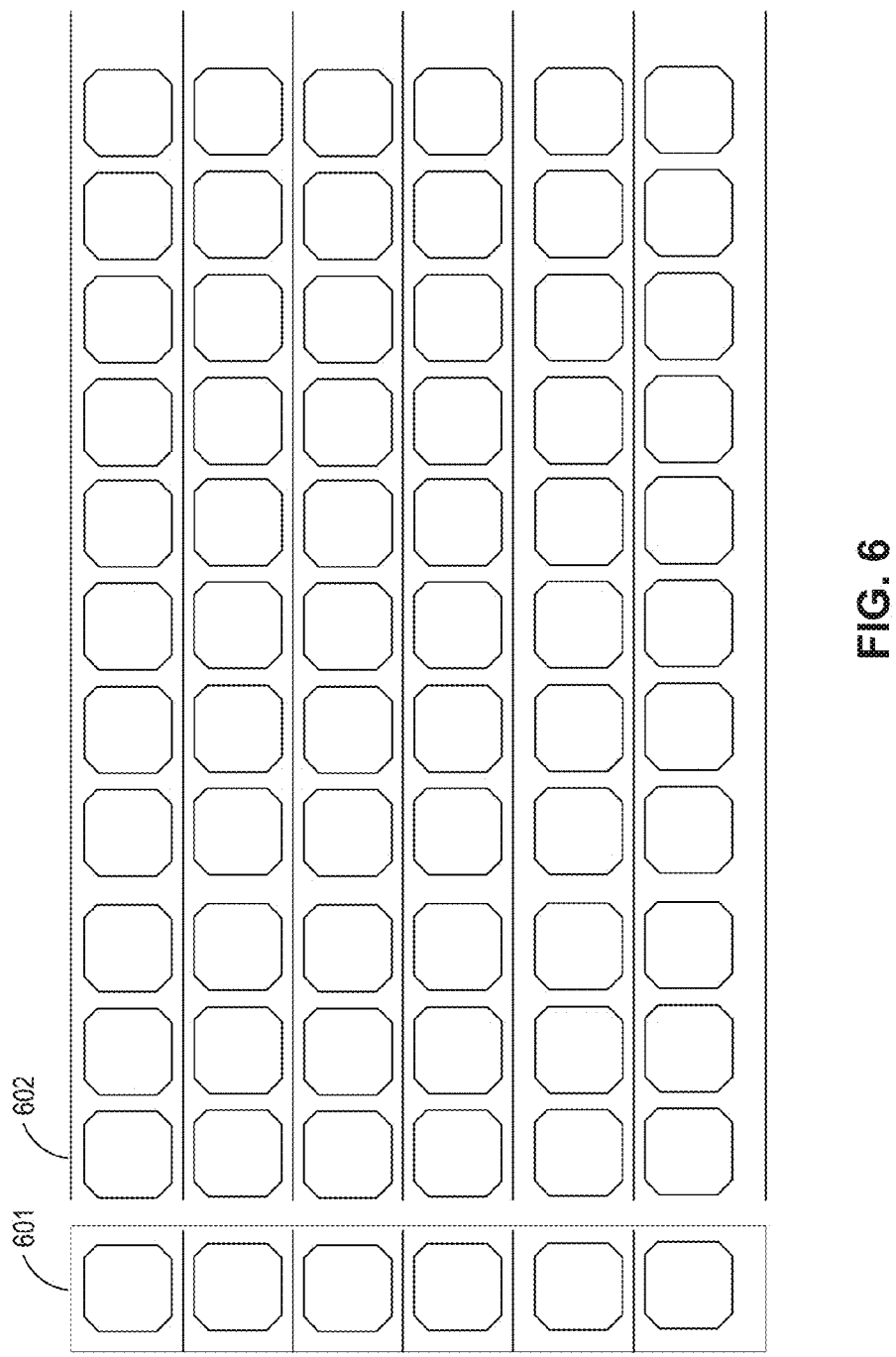
FIG. 6 shows placement of solar cells on a conveyor according an embodiment of the invention.

In step 401, solar cells which are placed in a coin stack can be lifted by a robotic arm or can be fed directly from a stack into a conveyor. Referring to FIG. 6, solar cells may be loaded from coin stack 601 on conveyor 602. FIG. 6 shows 6 coin stacks and 11 cells on each conveyor 602 that go through the process to form a complete panel. It will be understood by those skilled in the art that different number of coin stacks and cells per row on the conveyor is also possible.

Figure 7A:
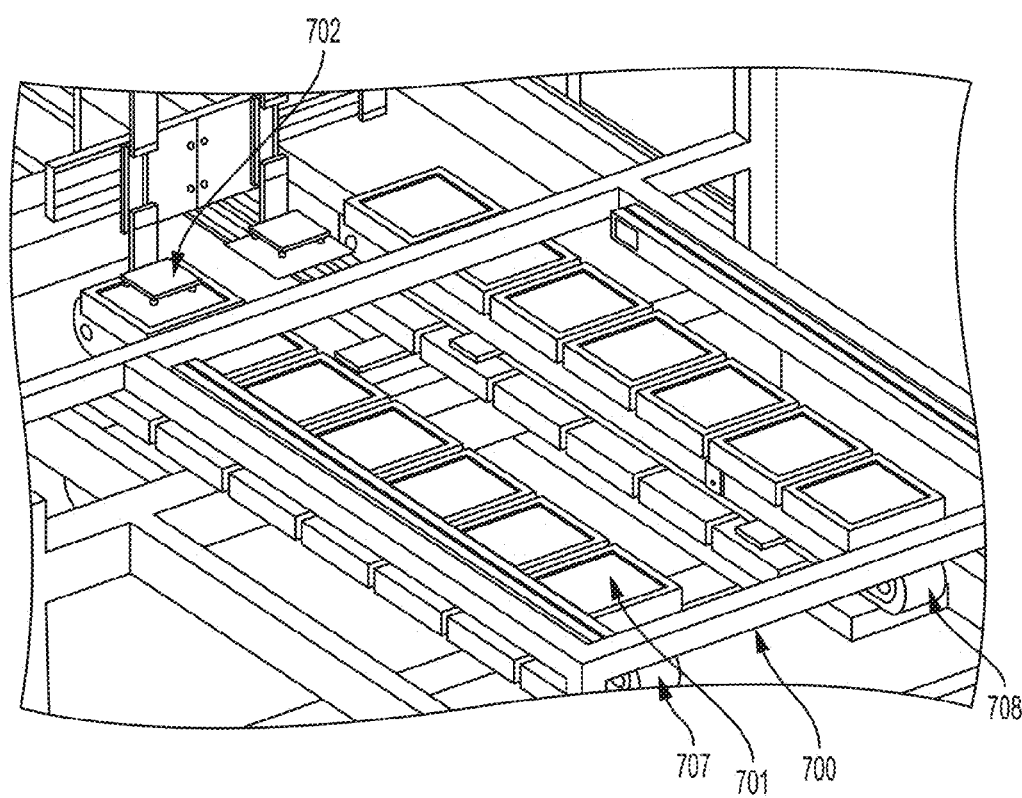
FIG. 7A shows placement of solar cells on a conveyor according an embodiment of the invention.

FIG. 7A shows loading station 700 where several coin stacks are placed on crawler wheels 707 and 708. A series of coins stacks 701 on each wheel may form a queue. Robotic arm 702 can lift the solar cells from each of the coin stacks and place them on conveyor 703 (shown in FIG. 7B). When all the cells from one coin stack are processed, the crawler wheel (707 and/or 708) that moves the coins stacks brings the next coin stack forward for processing. The empty coin stacks can rotate from underneath crawler wheels 707 and/or 708 and go back to the beginning of the queue.

FIG. 7A shows seven coin stacks 701 on each side of loading station 700. However, other variations for the number of coin stacks on each crawler wheel and the number of crawler wheels are also possible. FIG. 7B shows another embodiment where eight coin stacks are used. In the embodiment shown in FIG. 7B, there are two crawler wheels 707 and 708 each carrying four coin stacks. Each coin stack may contain a number of cells, for example, in one embodiment each coin stack contains 100 cells. In one embodiment, an operator can load the cells in the coins stacks that are mounted on crawler wheels 707 and 708. To prevent the possibility of injury, crawler wheels 707 and 708 may be housed in an area including light curtain 704. Light curtain 604 can stop the movement of crawler wheels 707 and 708 when any object comes in proximity of the light curtain.

Figure 7C:
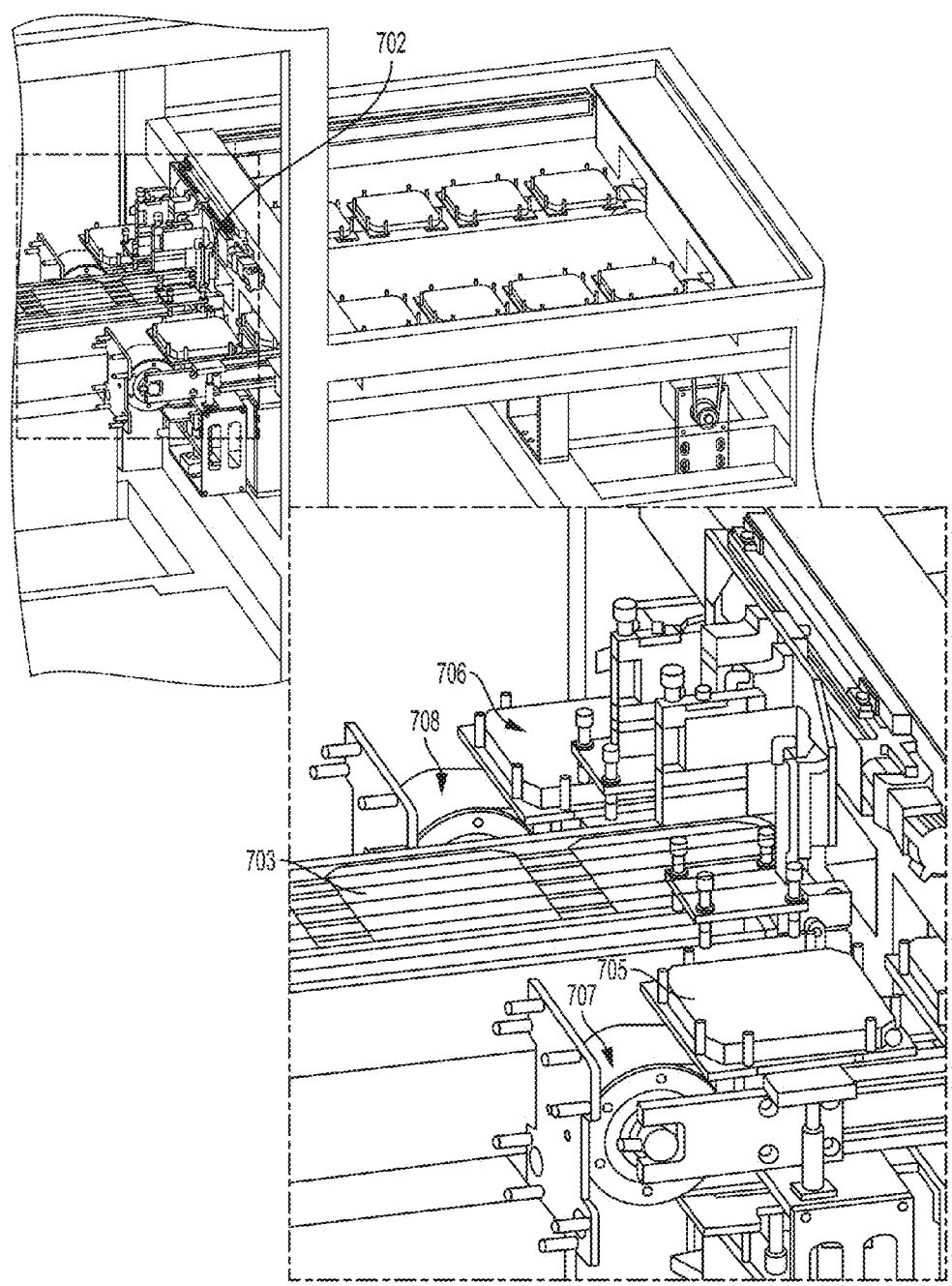
FIG. 7C shows placement of solar cells on a conveyor according an embodiment of the invention.

In one embodiment, as shown in FIGS. 7A and 7B, robotic arm 702 can lift and place the cells on conveyor 703 that transports the cells to a laser scribing module. As shown in FIG. 7C the coin stacks are mounted on top of rotating crawler wheels 707 and 708 such that when the cells from two coin stacks 705 and 706 are loaded on conveyor 703 the coin stack is moved back to the queue in loading station 700 via crawler wheels 707 and/or 708.

Figure 8:
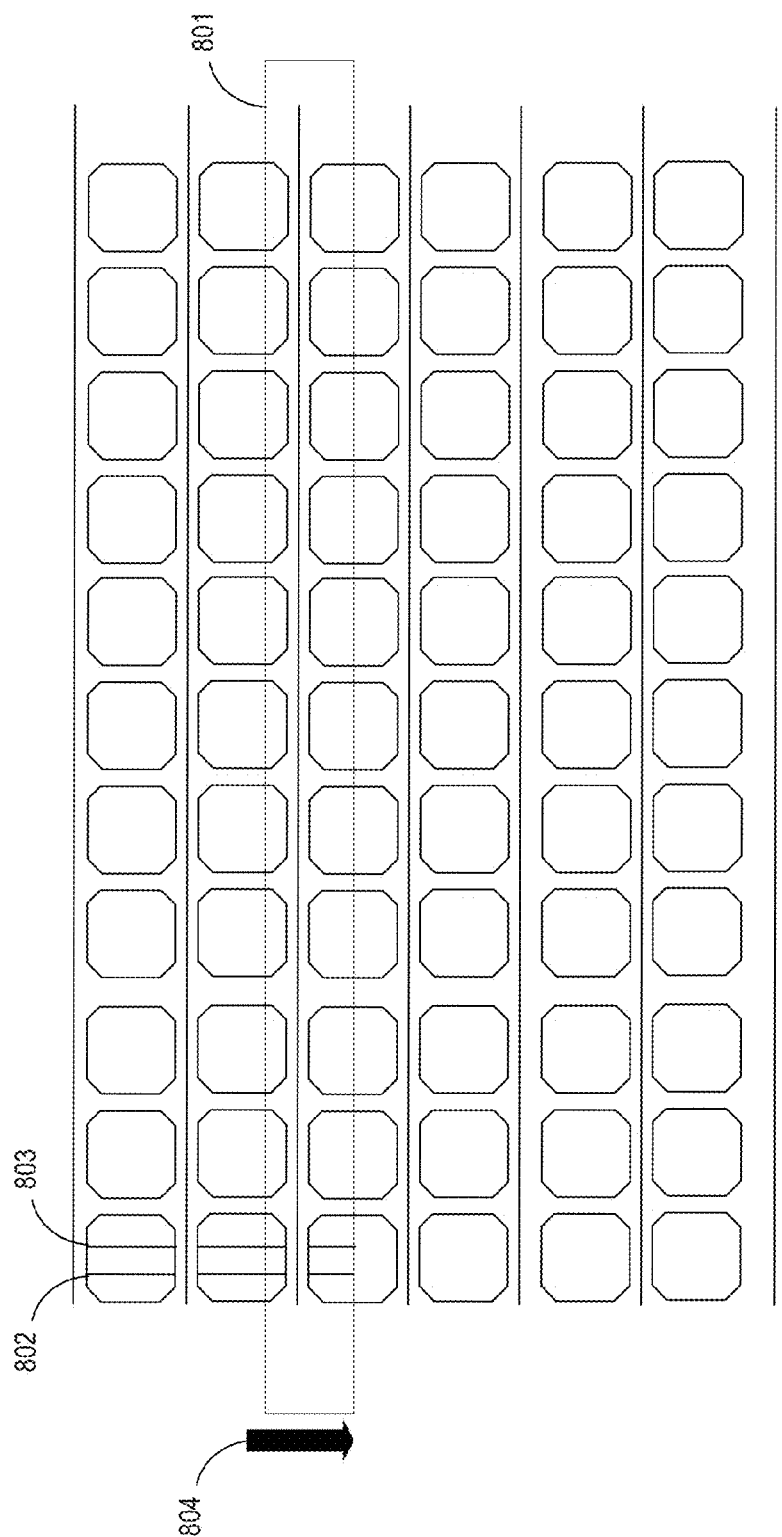
FIG. 8 shows laser scribing solar cells according to an embodiment of the invention.

In step 402, each solar cell is divided into two or more strips that are used to form the "shingled" cells. In some embodiments, the cells may be divided by scribing the cells. Systems and methods for scribing photovoltaic structures are described in U.S. patent application Ser. No. 14/804,306, entitled "SYSTEMS AND METHODS FOR SCRIBING PHOTOVOLTAIC STRUCTURES," filed Jul. 20, 2015, the disclosure of which is incorporated herein by reference in its entirety for all purposes. FIG. 8 shows one method of dividing the cells that involves laser scribing the cells. In one embodiment, the depth of scribe can be between 30 to 50 microns. Laser scribing module 801 which is positioned over the cells moves (in direction 804, for example) to scribe all the cells. Lines 802 and 803 show the direction in which the laser module scribes the cells. These lines may correspond to blank space 105 in FIG. 1A. As stated above, other methods may be used for dividing the cells into smaller cells. For example, only the edges of the solar cell may be laser scribed in one embodiment. In another embodiment, instead of laser scribing a line as shown in FIG. 8, the laser may form a dotted line where predetermined positions along lines 802 and 803 are laser scribed. In another embodiment, temperature differential may be used to divide the cells instead of laser scribing.

The direction of laser scribe may be along the length of the conveyor or along its width. For example, FIG. 8 shows scribe lines 802 and 803 that are along the width of each of the six conveyors. However, FIG. 9, described below, shows that the scribe lines are along the length of the conveyor.

Figure 9:
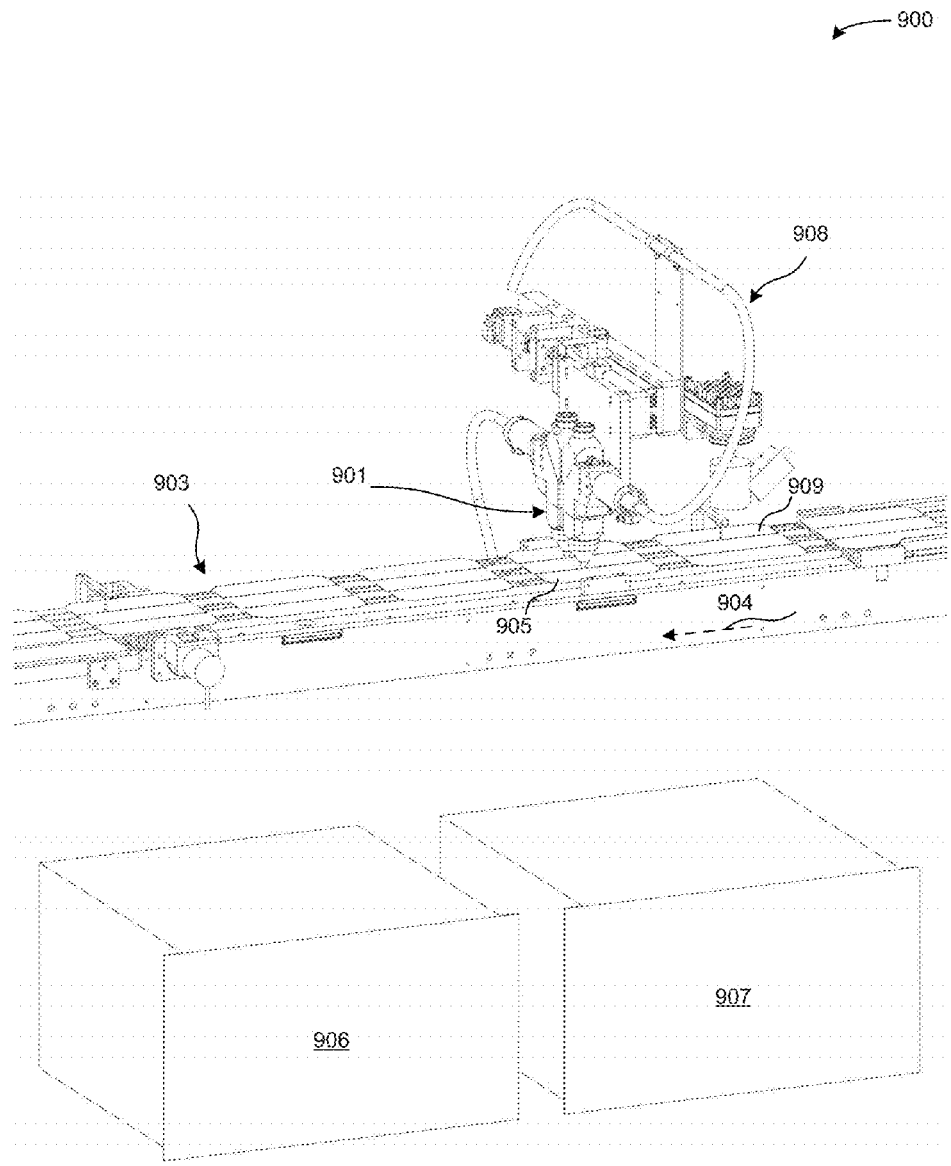
FIG. 9 shows laser scribing solar cells according to an embodiment of the invention.

FIG. 9 shows another embodiment where cells are placed on a conveyor of an automated solar panel manufacturing system. This embodiment may be at the next stage after automatically loading cells from coin stacks as described with respect to FIG. 7C. As shown in FIG. 9, the cells can be moved by conveyor 903 in direction 904 and a laser scribing module 901 can scribe the cells at predetermined locations similar to lines 802 and 803 in FIG. 8. In one embodiment, the depth of the scribe may be between 30 to 50 microns, but the laser scribing module is configured to scribe the cells at any depth as needed. In some embodiments, laser scribing module 901 may include or be coupled to laser generators 906 and 907, which generate the lasers used to scribe the cells.

In one embodiment, before cells are transported via conveyor 903 to the location where laser scribing module 901 is positioned, the cells may pass through verification module 908. verification module 908 may include a camera that can take a picture of the cells. The recorded image may then be compared via an image processing software application to a sample image of a cell being in a correct position on conveyor 903. As a result of that comparison, one or more mechanical arms on each side of the conveyor may adjust the position of the cell on the conveyor as needed so that when the cell is below laser scribing module 901, the cell is scribed at the intended position. In another embodiment, the width of the conveyor may be such that it matches the width of the cells so that no lateral alignment is needed, and when the cells are loaded on the conveyor, they remain in the intended position since there is no room for them to move while on the conveyor. In yet another embodiment, the verification module can be part of the laser scribing module assembly, and before the laser scribing process begins, the verification module can ensure that the solar cells are aligned properly on the conveyor.

As shown in FIG. 9, laser scribing module 901 may be positioned on top of conveyor 903, and while the solar cells are transported via conveyor 903 from under laser scribing module 901, they can be scribed. In one embodiment, the depth of the scribe may have an inverse relationship to the speed at which the conveyor moves. In other words, if a higher depth is desired, one way to reach the desired depth would be to move the conveyor slower so that the laser beam has more time to penetrate the substrate of the solar cells.

In one embodiment, laser scribing module 901 may include two laser scribing modules positioned on top of the conveyor and parallel with respect to each other as shown in FIG. 9. In this embodiment, two simultaneous laser beams may scribe a solar cell along two parallel lines. As a result, the solar cell can be divided into three strips of solar cells. Depending on the layout of the metal layers on the solar cells, it may be desired to divide the solar cells into two or more than three strips. In such embodiments, additional laser scribing modules can be positioned in parallel to scribe the solar cells at the desired locations. When the solar cells are scribed, the scribe lines divide the surface area of each solar cell into strips that have a same length compared to each other. In addition, each strip also may have the same width compared to each other. The total surface area of the strips may be the same if square-shaped solar cells are used. However, in some embodiments, the total area of each strip may be different if solar cells similar to the one shown in FIG. 5 is used. The solar cell shown in FIG. 5 has chamfered edges. This type of cell may result in three strips of cells where the two outer strips have the same surface area that is less than the strip that results from the middle portion of the solar cell.

In one embodiment, one laser scribing module may be used for scribing the solar cells. The laser scribing module may have a beam-splitter that provides two laser beams that can scribe the cell. In another embodiment, the laser scribing module may be placed axially or horizontally, and the solar cells may be positioned accordingly for scribing. Also, the laser units may be positioned such that they scribe the cell in two dimensions. In yet another embodiment, the laser scribing module may have more than two laser units depending on the number of strips that result from a single solar cell.

In one embodiment, the laser scribing module may have a feedback mechanism that determines whether the depth of the scribe is at the desired level. In one example, the feedback mechanism may include a vision system that estimates the depth of the scribe. The estimation may be done in real-time or may be based on processing a recorded image.

Figure 10:
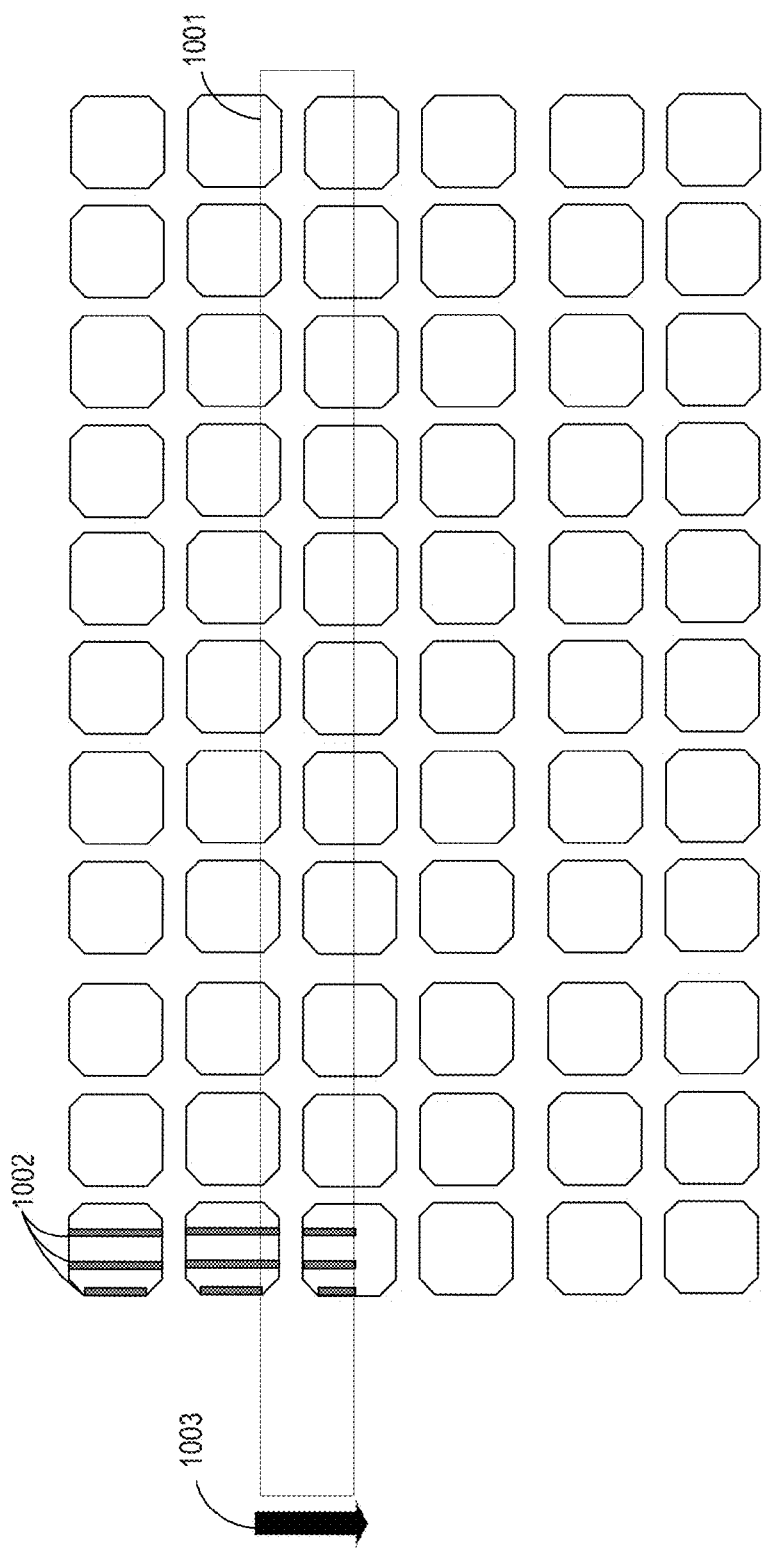
FIG. 10 shows applying conductive paste on solar cells according to an embodiment of the invention.
Figure 11:
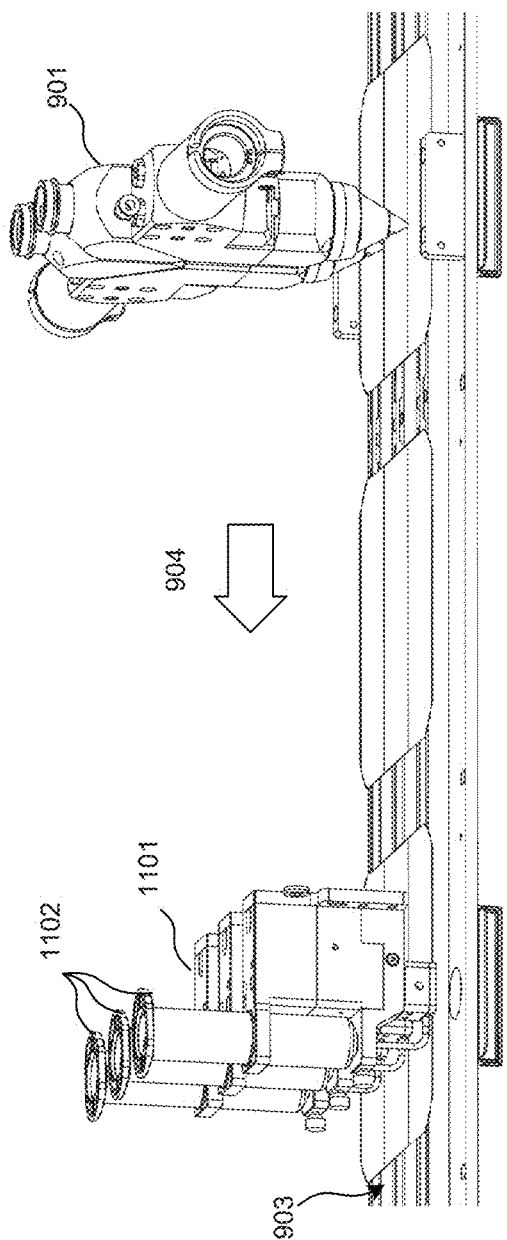
FIG. 11 shows applying conductive paste on solar cells according to an embodiment of the invention.

In step 403, conductive adhesive paste is applied on scribed cells. Systems and methods for applying conductive adhesive paste on photovoltaic structures are described in U.S. patent application Ser. No. 14/866,806, entitled "METHODS AND SYSTEMS FOR PRECISION APPLICATION OF CONDUCTIVE ADHESIVE PASTE ON PHOTOVOLTAIC STRUCTURES," filed Sep. 25, 2015, the disclosure of which is incorporated herein by reference in its entirety for all purposes. FIG. 10 shows application of conductive paste on one column, according to one embodiment. In FIG. 10, paste dispensing module 1001 can move over a string of cells and dispense conductive paste on the cells. Paste dispensing module 1001 may move in direction 1003 and dispense lines 1002 of conductive paste. FIG. 11 shows the application of the paste via paste dispensing module 1101, according to another embodiment. Paste dispensing module 1101 may be in the form of one or more syringes 1102 according to one embodiment. In another embodiment, paste dispensing module 1101 may be a jetting unit that dispenses the paste similar to the jetting mechanism of an inject printer. In the embodiment shown in FIG. 11, after being scribed (by laser scribing module 901 for example), solar cells can be moved via conveyor 903 in the direction 904 to a station where one or more syringes of paste dispensing module 1101 apply conductive paste on the busbars of the cell. The paste may be applied as the cell is being moved by conveyor 903, or while conveyor 903 is stationary. Exemplary busbars are shown in FIGS. 1A-1D. In one embodiment, paste dispensing module 1101 dispenses between 60 to 70 droplets of conductive paste on each busbar.

The number of the droplets is partly determined by the density of the conductive particles in the resin of the paste. Since the conductive paste establishes an electrical connection between the busbars of two shingled strips of cells, a minimum amount needs to be used to carry the electricity from one strip to another throughout a shingled string. In one embodiment, the conductive paste is comprised of a conductive core surrounded by an adhesive resin. In this embodiment, when the paste is applied on the busbar, the conductive core (which may be any type of conductive metal) establishes an electrical contact with the busbar while the adhesive resin protects the conductive core.

In another embodiment, the conductive paste may be a mix of resin and conductive particles. In this embodiment, each of the plurality of droplets of paste may have a volume of about $1.4235 \times 10^{-5}$ cubic centimeters and the density of the conductive particles may vary between 60% to 90% of the total volume of each droplet of paste. Also, if this type of paste is used, one potential issue may be overflow of paste from the surface of the busbars during the annealing process (described later). This is an undesirable effect and may result in short circuits and unwanted electrical connection with other parts of the cells. To prevent this, in one embodiment the diameter of each droplet that is dispensed on the busbar may be about 300 to 400 microns, and after the paste is cured during the annealing process (described later) the diameter may expand to about 700 microns which may be less than the width of a busbar.

In another embodiment, a laser scribing module may include a container for paste that feeds one or more nozzles. The container may be in the form of a changeable cartridge, or it may be connected to a refill mechanism that refills the container with paste. The dispensed paste may be in the form of droplets as described above, or it may be in the form of strands that cover the surface of the busbar. The distance between each deposition may be the same or may be variable. This variability may be achieved by the dispensing unit or it may be achieved by variable speed of the conveyor.

Figure 12:
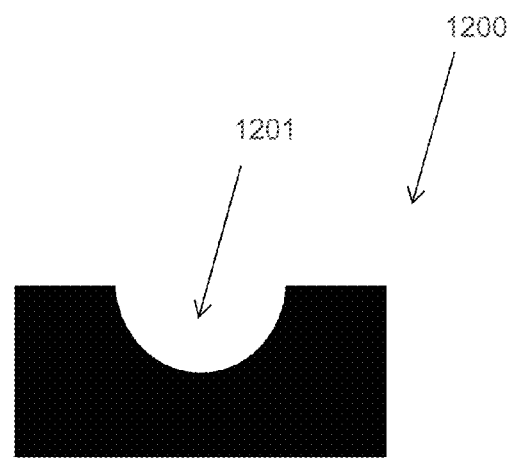
FIG. 12 shows a busbar of a solar cell according to an embodiment of the invention.
Figure 13:
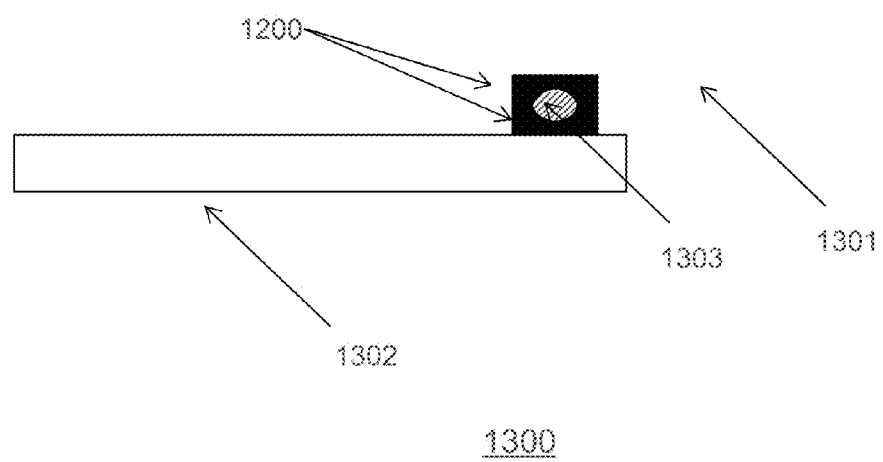
FIG. 13 shows a shingle formation of two strips of solar cells according to an embodiment of the invention.

In another embodiment, the busbars may have an internal channel that can form a recessed surface inside the busbars. FIG. 12 shows a cross-section of busbar 1200. This busbar has channel 1201 that can act as a receptacle to house a viscous adhesive. Channel 1201 may be in the form of any type of recessed surface within the busbar that can contain viscous material. FIG. 13 shows two shingled cells 1301 and 1302 each having busbar 1200 as shown in FIG. 12. When the two cells are "shingled", the channels inside each busbar 1200 form housing 1303 that keeps the conductive paste within the boundary of the busbars and prevents an overflow from the sides.

Figure 14:
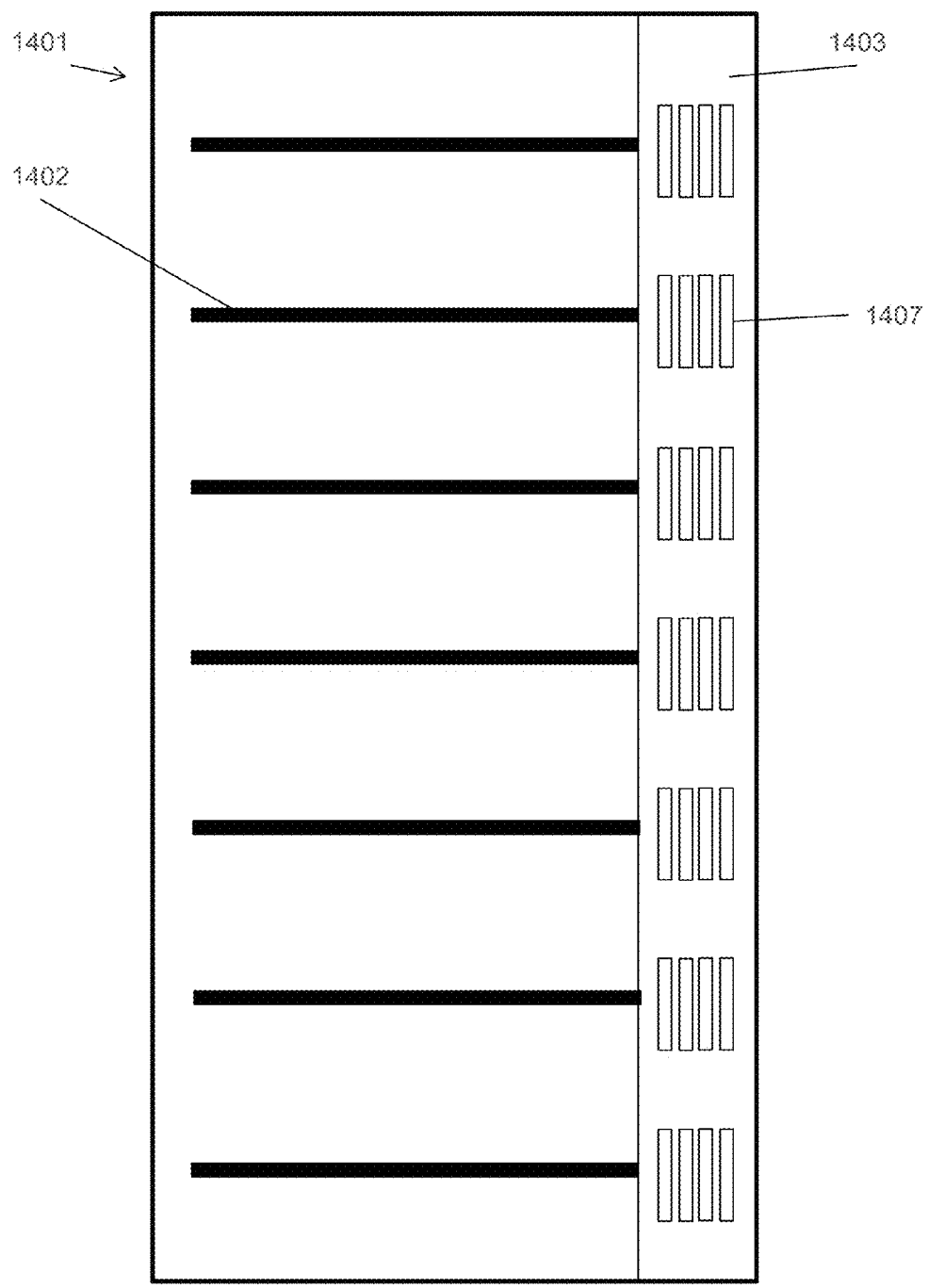
FIG. 14 shows a busbar of a solar cell according to an embodiment of the invention.

In another embodiment, the busbars may have several grooves that are formed via a mask at the time the busbar is formed on the surface of the solar cell. FIG. 14 shows an embodiment where busbar 1403 has four grooves 1407 at the locations where fingers 1402 and busbar 1403 intersect. The exemplary strip of solar cell shown in FIG. 14 has substrate 1401, fingers 1402, busbar 1403 and grooves 1407. As shown in FIG. 14, each set of grooves 1407 is placed on a location within busbar 1403 where fingers 1402 intersect busbar 1403. Each of grooves 1407 acts as a receptacle that can contain the conductive paste.

Figure 15A:
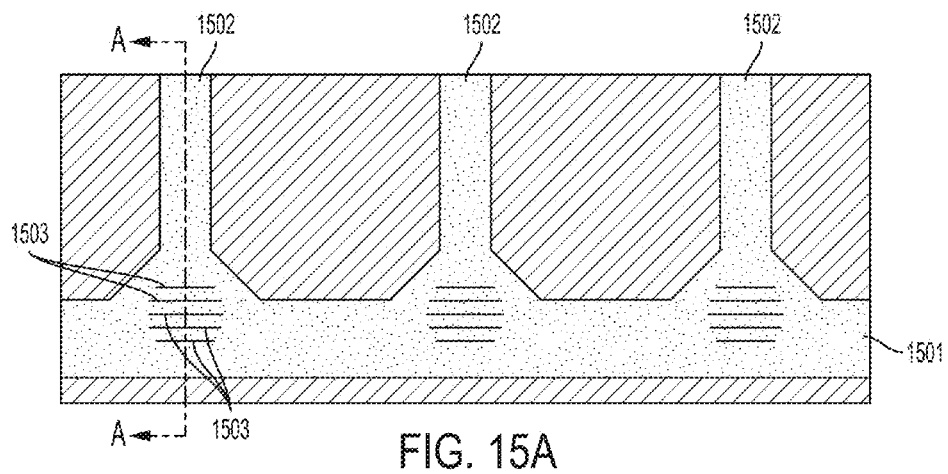
FIG. 15A shows a portion of a busbar of a solar cell according to an embodiment of the invention.

In one embodiment, the grooves may be formed inside the busbar via a mask. FIG. 15A shows a top-down view of busbar 1501 and finger 1502 intersection. In one embodiment, the depth of the groove may be between 20 to 30 microns. The width may be from 150 to 250 microns and the length may be up to 0.7 mm. As shown in FIG. 15A, the length of grooves 1503 may vary such that the overall shape of grooves 1503 from the top is circular. In one embodiment, grooves 1503 may be formed by dry film exposure or via screen-printing. The choice of method of forming the grooves may be material driven. For example, if the busbars and fingers are formed via Cu, then dry film exposure may be preferred. However, if Ag is used to form the busbars and fingers, screen-printing may be the preferred method.

Figure 15B:
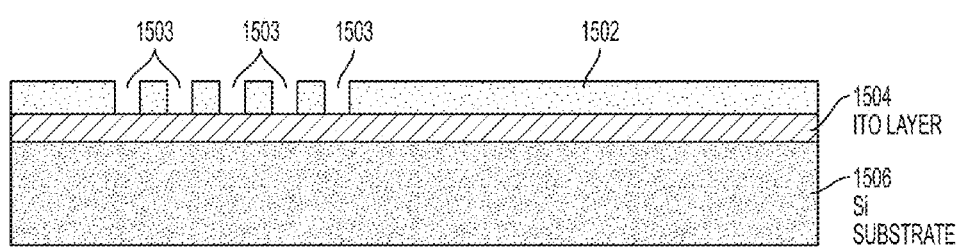
FIG. 15B shows a portion of a busbar of a solar cell according to an embodiment of the invention.

FIG. 15B shows the cross-section view through section A-A of busbar 1501 and finger 1502. As described above, and as can be seen in FIG. 15B, grooves 1503 help trap the conductive paste and prevent the possibility of cell-to-cell shunting if the paste is spread to the edge of the solar cell. This issue to some extent relates to the viscosity of the conductive paste, and depending on the viscosity of the paste, the number of the grooves may be adjusted such that a less viscous paste may require a lesser number of grooves. In yet another embodiment, instead of parallel grooves, the location where fingers and busbars intersect may include a recessed surface that may be formed with the methods described above. The shape of the recessed surface may be circular, square-shaped or any other shape that can effectively act as a receptacle for the conductive paste.

Similar to laser scribing module 901, paste dispensing module 1001 or 1101 may also be retrofitted with a verification module (not shown) that determines whether the solar cell is aligned properly on the conveyor. The verification module may be a separate module or may be part of paste dispensing module 1001 or 1101. The manner of operation may be the same as verification module 908 of laser scribing module 901 where an image of the solar cell on the conveyor may be compared to a reference image to determine whether the cell is positioned accurately on the conveyor.

As described above, the busbars may be connected to each other in a shingled string by soldering each busbar to the other. However, one technical advantage in connecting the busbars via a conductive paste is that it allows the string of cells to be more flexible. Solar panels go through "thermal cycling" during a 24-hour period as the temperature changes. The thermal cycling exerts pressure on the structure of the shingled cells. The conductive paste allows the string to withstand the structural stress that may be caused by the thermal cycling.

Figure 16A:
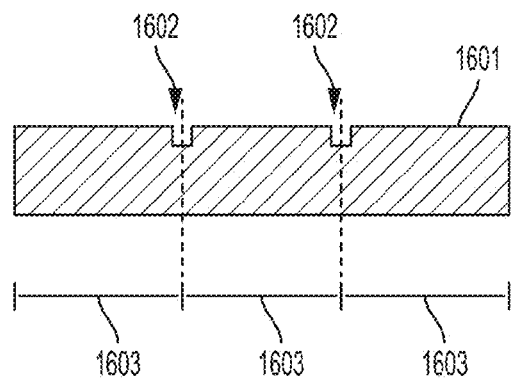
FIG. 16A shows a laser scribed solar cell according to an embodiment of the invention.
Figure 16B:
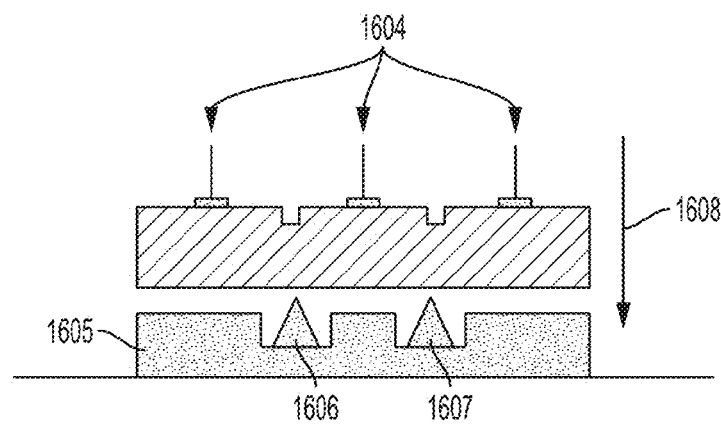
FIG. 16B shows dividing a solar cell into smaller solar cells according to an embodiment of the invention.
Figure 16C:
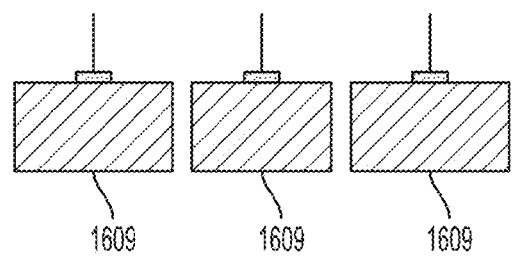
FIG. 16C shows divided smaller collar cells according to an embodiment of the invention.

In step 404, scribed cells are placed on a cleaving station to be cleaved. Systems and methods for cleaving photovoltaic structures are described in U.S. patent application Ser. No. 14/826,129, entitled "PHOTOVOLTAIC STRUCTURE CLEAVING SYSTEM," filed Aug. 13, 2015, the disclosure of which is incorporated herein by reference in its entirety for all purposes. In some embodiments, after application of conductive paste (described above), the cells can be picked up by a robotic arm that lifts the cells via a vacuum that may be integrated into the robotic arm, and can hold the cell with a vacuum while transferring it to the cleave apparatus. As cell rows are placed on the cleaving apparatus, pressure may be applied to cleave and a vacuum may turned on to hold cleaved shingles in place. FIG. 16A shows one cell 1601 that is laser scribed. Cell 1601 may be divided by scribes 1602 into three even portions 1603 as described above. FIG. 16B shows that cell 1601 may be lifted using vacuum heads 1604 and placed on cleaving station 1605 having wedges 1606 and 1607. Cell may then be pushed downward in direction 1608 and divided into three smaller cells 1609 as shown in FIG. 16C (similar to the cell shown in FIGS. 1C and 1D).

Figure 17A:
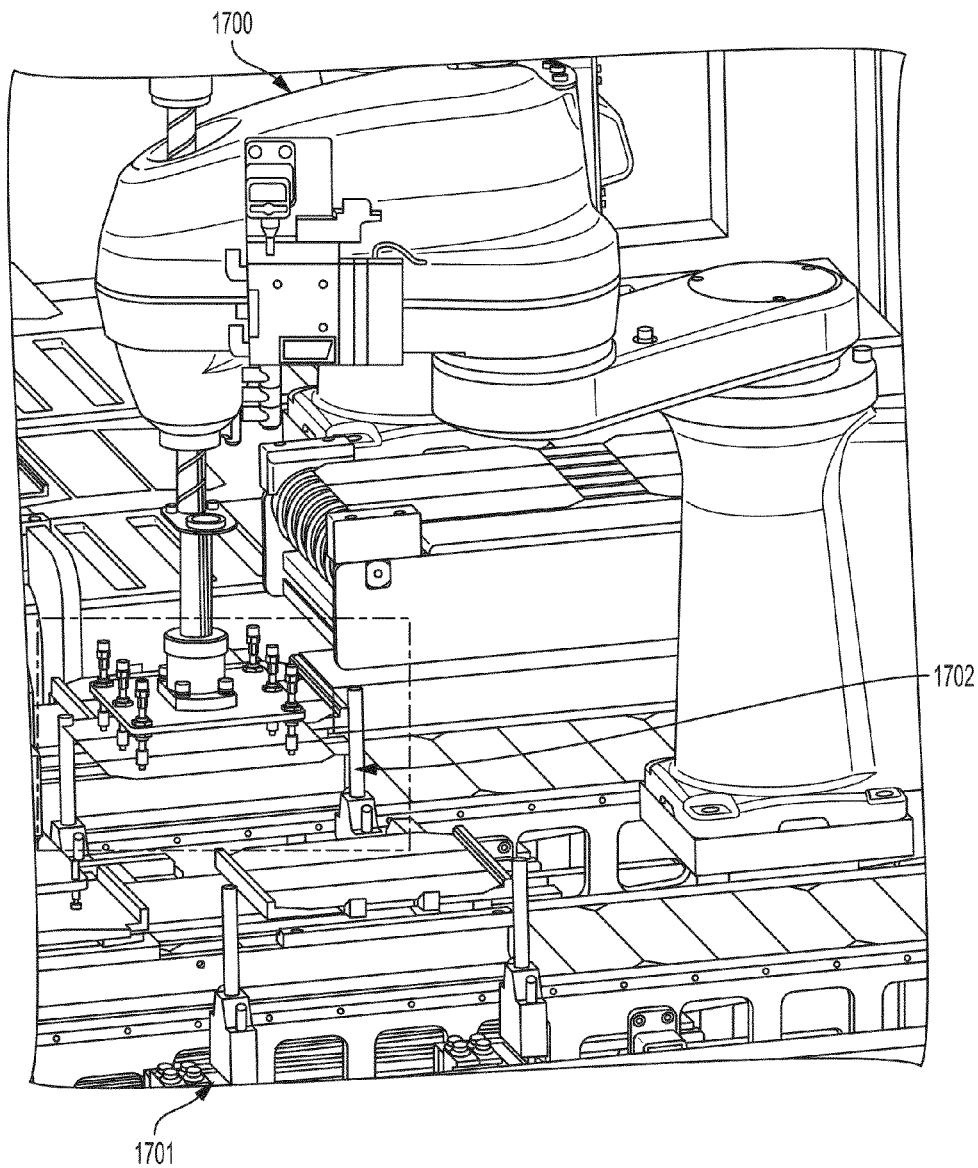
FIG. 17A shows a robotic arm for lifting solar cells according to an embodiment of the invention.
Figure 17B:
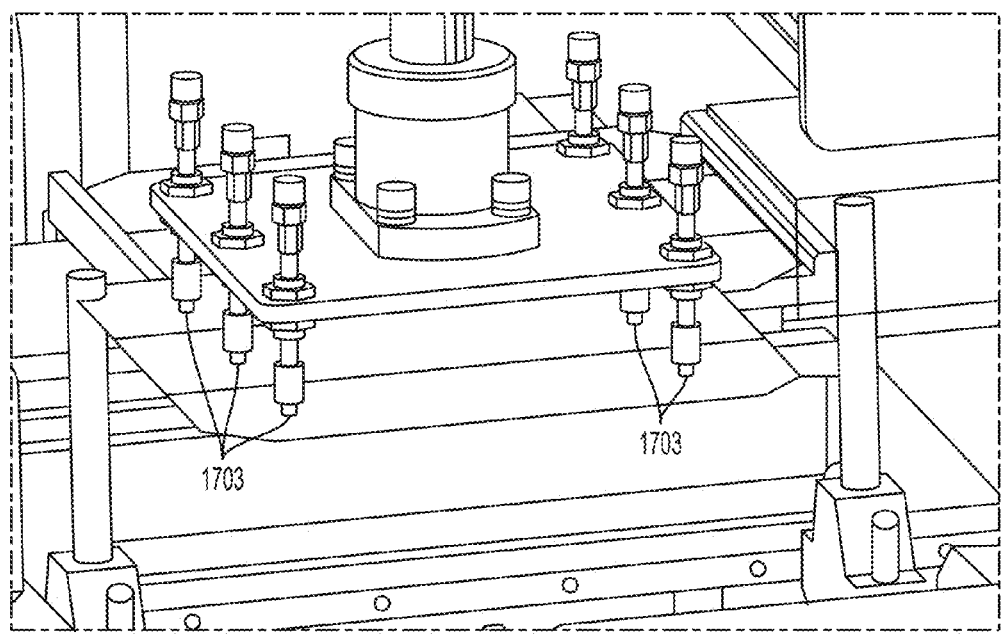
FIG. 17B shows a robotic arm for lifting solar cells according to an embodiment of the invention.

FIG. 17A shows an exemplary embodiment where robotic arm 1700 loads the cells on loading mechanisms 1701 and 1702. FIG. 17B shows robotic arm of FIG. 17A with more details. The lifting mechanism of robotic arm 1700 can include six vacuum heads 1703 that hold the cells during transport. Loading mechanisms 1701 and 1702 may also act as a buffer where the cells may be accumulated and ready to be transported to the cleaving station via robotic arm 1700.

Figure 18:
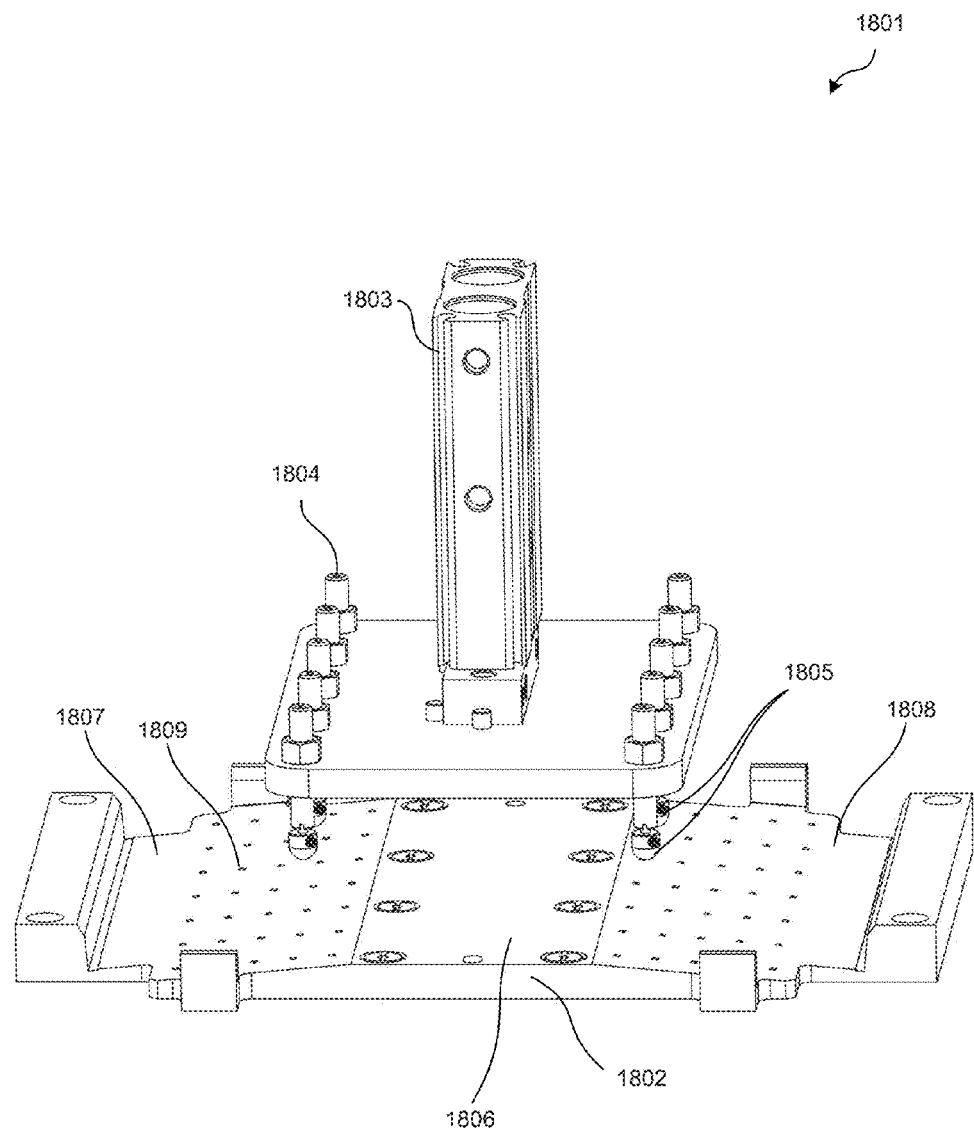
FIG. 18 shows an apparatus for dividing solar cells into smaller strips according to an embodiment of the invention.

FIG. 18 shows cleaving apparatus 1801 according to one embodiment. Cleaving apparatus 1801 may have base 1802, cleaving actuator 1803, spring plungers 1804 and cleave tips 1805. Base 1802 has a middle surface 1806 that is substantially flat and two side surfaces 1807 and 1808 that have an angle with respect to middle surface 1806. As shown in FIG. 18, two fulcrums edges are formed between middle surface 1806 and the side surfaces 1807 and 1808. Middle surface 1806 may support the middle portion of a cell, and each of side surfaces 1807 and 1808 may support the outer portions of a cell. When a cell is placed on base 1802, the scribed lines may be aligned on the two fulcrum edges between middle surface 1806 and side surfaces 1807 and 1808.

As shown in 18, side surfaces 1807 and 1808 of base 1802 may have holes 1809 that can allow the passage of air from beneath base 1802 in an upward direction. When a cell is placed on base 1802, cleaving actuator 1803 can apply pressure on the cell toward base 1802, while the cell may also be subjected to simultaneous air pressure in the opposite direction from side surfaces 1807 and 1808. The downward pressure from cleaving actuator 1803 and cleave tips 1805 can break the cell along the scribed lines which may happen to be on the same position as the fulcrum edges. As a result, each cell can be divided into three smaller strips of solar cells as described with respect to FIGS. 1A through 1D. The air-pressure from the sides of base 1802 ensures that the outer pieces of the cell are positioned correctly on cleaving apparatus 1801 after cleaving. In one embodiment, middle portion 1806 of base 1802 directly underneath cleaving actuator 1803 may have a vacuum built into the surface of base 1802 that can hold the cell in place and prevent the cell from breaking before the application of the pressure by cleaving actuator 1803.

In one embodiment, cleave tip 1805 may be partially housed inside spring plunger 1804 and a spring can be placed inside spring plunger 1804 to absorb some of the pressure exerted by cleaving actuator 1803. This mechanism prevents unnecessary and excessive pressure to the surface of the cell. In one embodiment, the amount of downward pressure can be adjusted by changing the spring inside spring plunger 1804.

Figure 19A:
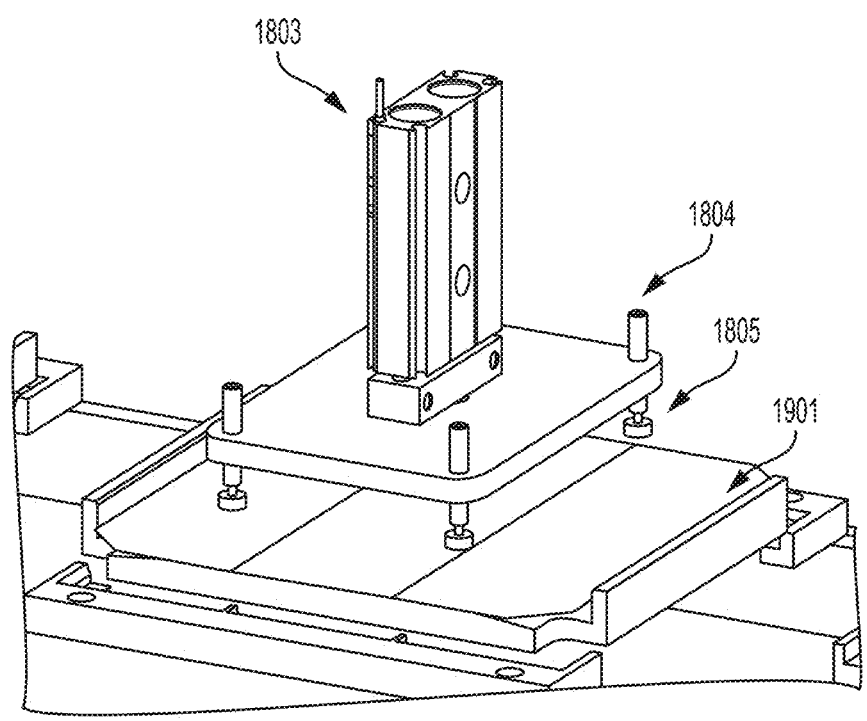
FIG. 19A shows an apparatus for dividing solar cells into smaller strips according to an embodiment of the invention.
Figure 19B:
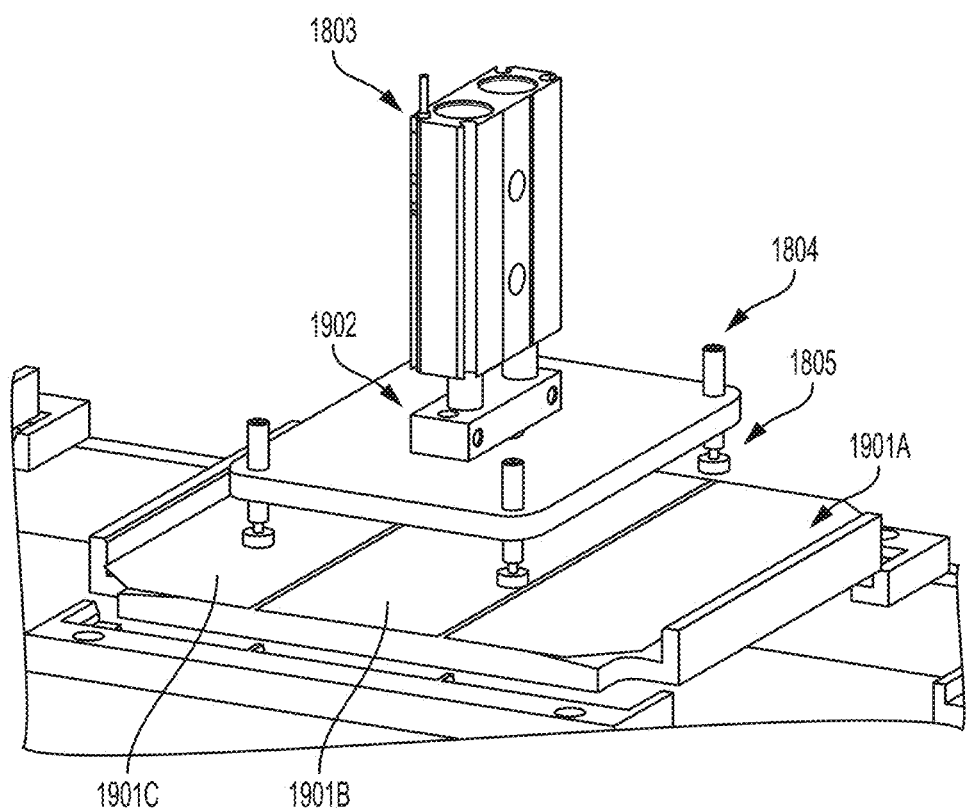
FIG. 19B shows an apparatus for dividing solar cells into smaller strips according to an embodiment of the invention.

FIG. 19A shows cell 1901 that is placed on cleaving station 1801 before application of pressure by cleaving actuator 1803. FIG. 19B illustrates a cleaved cell that can be divided into three pieces 1901A, B, and C (i.e. three strips of solar cells). As shown in FIG. 19B, middle piece 1901B stays on the middle of base 1802, while the other two pieces 1901A and C slide down the angled surface and are stopped by the side walls 1810 of cleaving apparatus 1801. As shown in FIG. 19A, cleave tips 1805 apply pressure to the two outer pieces within a cell which causes breakage along the scribed lines of the cell.

Figure 20:
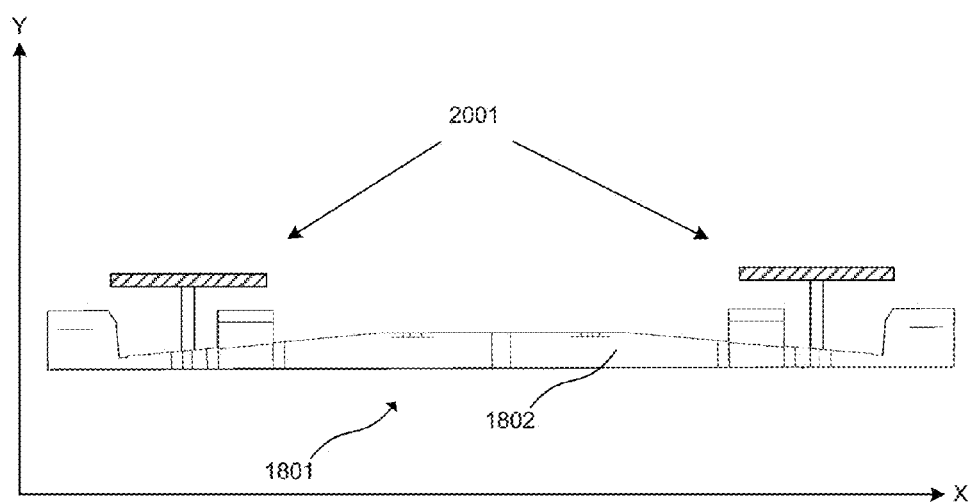
FIG. 20 shows an apparatus for dividing solar cells into smaller strips according to an embodiment of the invention.

FIG. 20 shows cleaving apparatus 1801 according to another embodiment. In this embodiment, cleaving apparatus 1801 can have two lift mechanisms 2001 housed inside cleaving apparatus 1801 which can come out of the side surfaces of base 1802 that have a downward angle. Lifting mechanisms 2001 may have a vacuum on their surface (not shown) that holds the piece of the cell that was cleaved (i.e. the strip of solar cell) while lifting it and rotating it along the Y-axis. After rotation, lifting mechanisms 2001 can retract and the strip of solar cell can be put back on the surface of base 1802.

Figure 21:
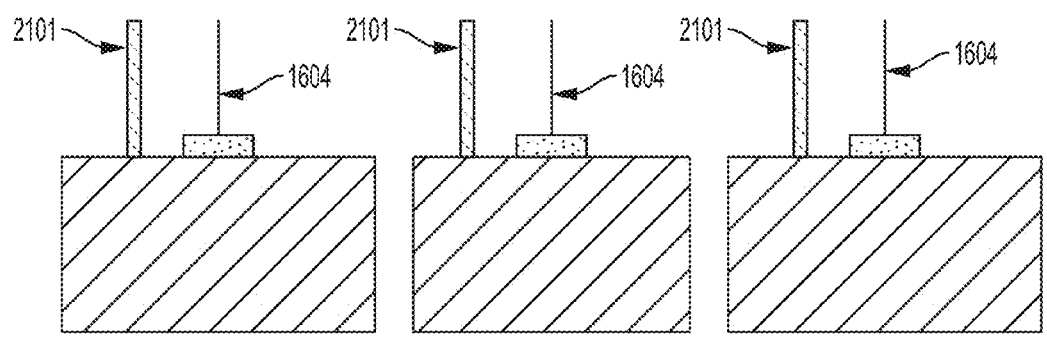
FIG. 21 shows probe testing solar cells according to an embodiment of the invention.

In optional step 405, after dividing one cell into three strips, the cells may be tested using a probe. As shown in FIG. 21, each strip may be tested using probe 2101. In one embodiment, the cells are placed on a separate station for the probe testing. In the embodiment shown in FIG. 21, the cells are probed tested while being lifted with vacuum 1604. In one embodiment, if one of the cells fails the probe test, the entire cell row (11 cells as shown in FIGS. 6, 8, and 10) are disposed. In another embodiment, a coin stack of replacement cells supplies a replacement cell if any one of the cells fails the probe testing.

Figure 22A:
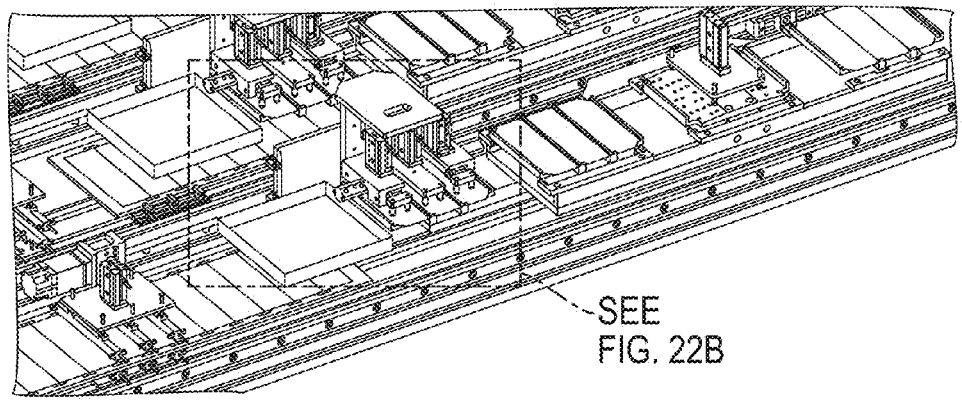
FIGS. 22A and 22B show a device for probe testing solar cells according to an embodiment of the invention.
Figure 22B:
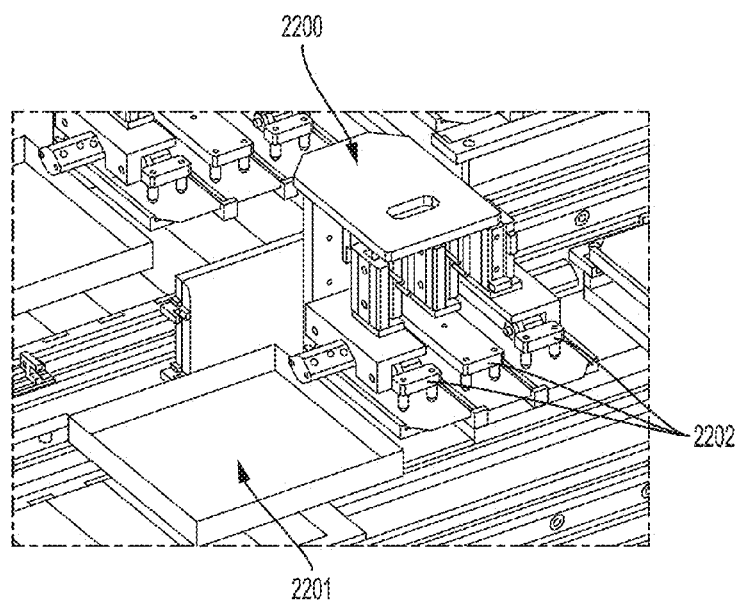

FIGS. 22A and 22B show probe testing unit 2200 according to one embodiment. Probe testing unit 2200 may have three testing units 2202 each having multiple probes. During the testing operation, one probe applies a voltage to one busbar on the strip of solar cell and the same or another probe will measure the current while the strip of solar cell is on a grounded plate on testing unit 2200. In operation, once the strips of solar cells are placed on testing unit 2200, the probes can be lowered and establish an electrical contact with the surface of the strips. A defective strip of solar cell can then be identified based on the reading of the probes. A strip of solar cell may be considered defective if a measured current through the strip is less than a predetermined level of current. As shown in FIG. 22B, testing unit 2200 can test three strips of solar cells simultaneously. If any of the strips of solar cells fail, that strip can then be deposited into disposal bin 2201 also shown in FIG. 22B.

In step 406, the strips are shingled. Systems and methods for shingling photovoltaic structures are described in U.S. patent application Ser. No. 14/866,776, entitled "SYSTEMS AND METHODS FOR CASCADING PHOTOVOLTAIC STRUCTURES," filed Sep. 25, 2015, the disclosure of which is incorporated herein by reference in its entirety for all purposes. In one embodiment, a vacuum mechanism may lift, shift and align the cells to form a shingle assembly. FIG. 23A shows vacuum mechanism 2301 lifting the cells with an offset and FIG. 23B shows the shifting and aligning of the cells with vacuum mechanism 2301 to form a shingle assembly. In FIG. 23B, the cells are shifted and shingled over the other such that they cover the conductive paste when placed on top of one another. This process can be performed for an entire row of shingled cells or the process may be divided into multiple sub-processes such that two or more cells are lifted and aligned to form a partial shingle row and the partial row is then lifted and aligned with another partial row to form a complete shingled row of cells.

Figure 24A:
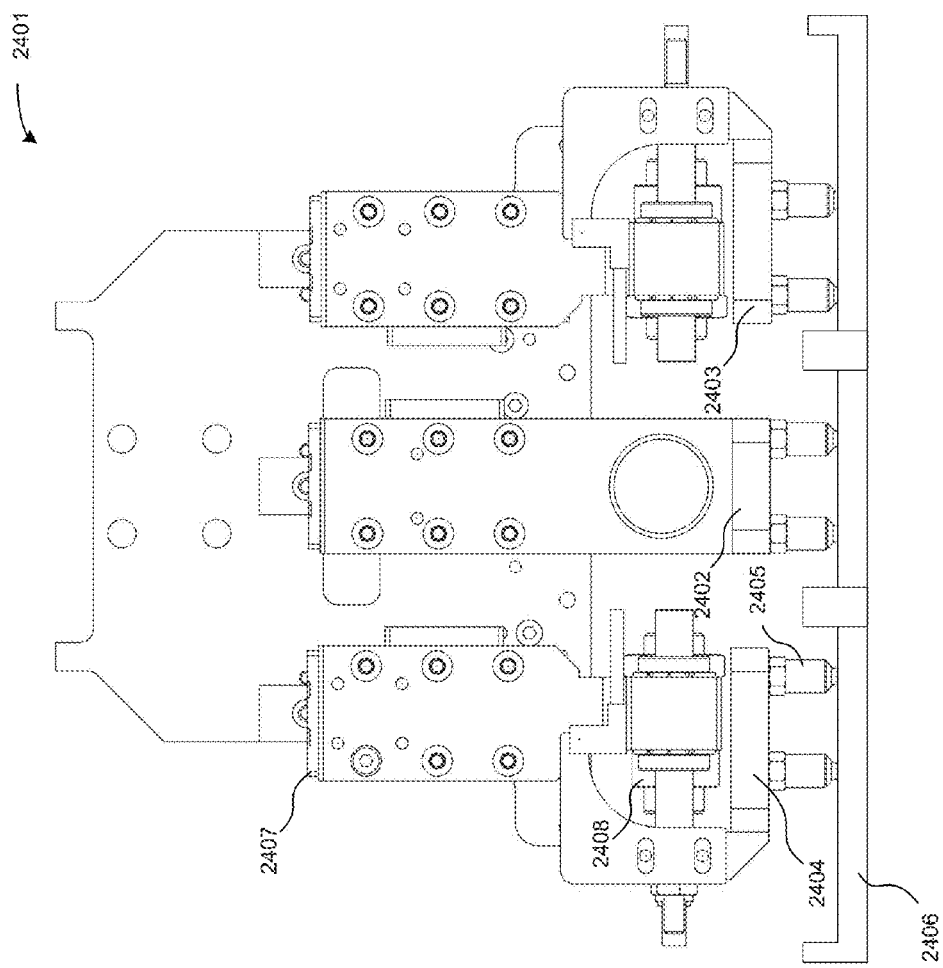
FIG. 24A shows a shingling module for assembly of shingled strings of solar cells according to an embodiment of the invention.

FIG. 24A shows shingling module 2401 that can lift, shift and align the cells to form a shingle assembly according to one embodiment. Shingling module 2401 may be a precision automated system that shingles the strips of solar cells. As shown in FIG. 24A, shingling module 2401 includes center mechanical arm 2402, mechanical arm 2404 on the left side and mechanical arm 2403 on the right side. Each mechanical arm may have one or more suction cups 2405. Shingling module 2401 also may have table 2406 that houses the strips of solar cells.

Figure 24B:
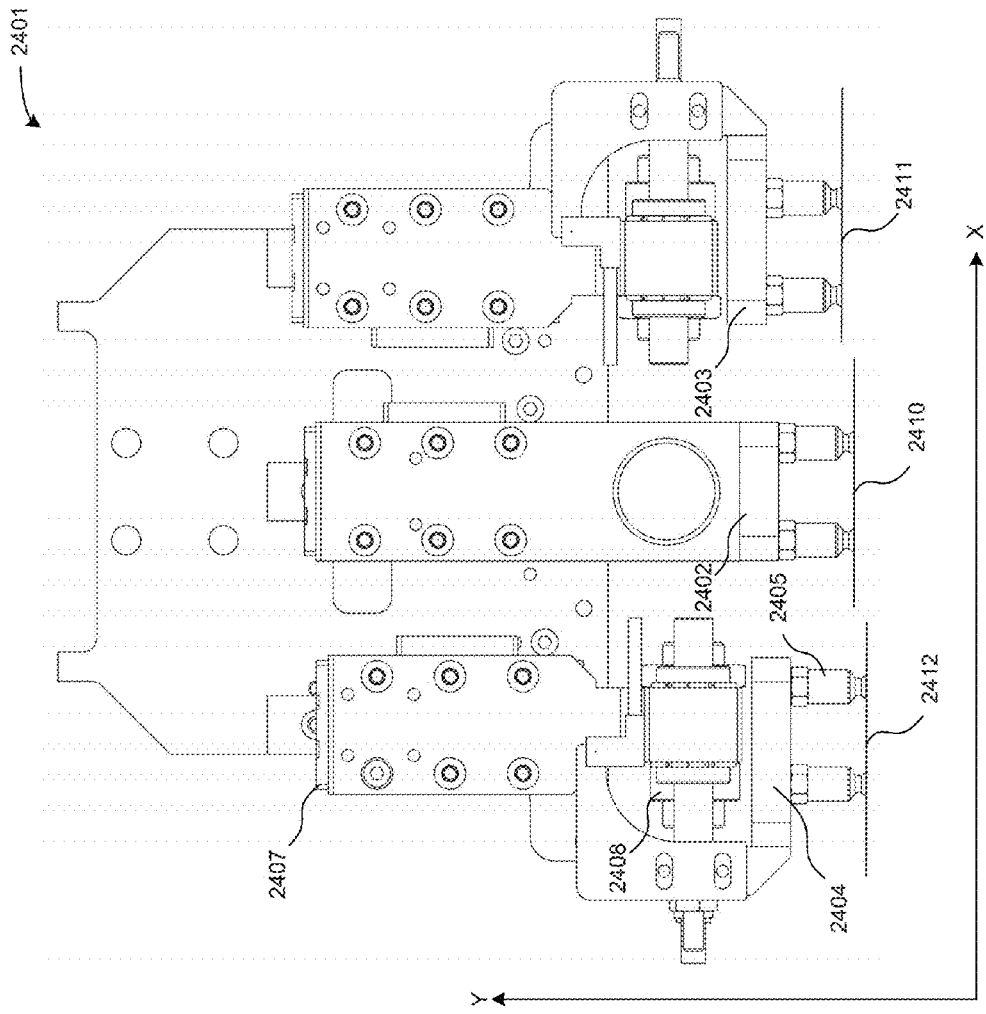
FIG. 24B shows a shingling module for assembly of shingled strings of solar cells according to an embodiment of the invention.
Figure 24D:
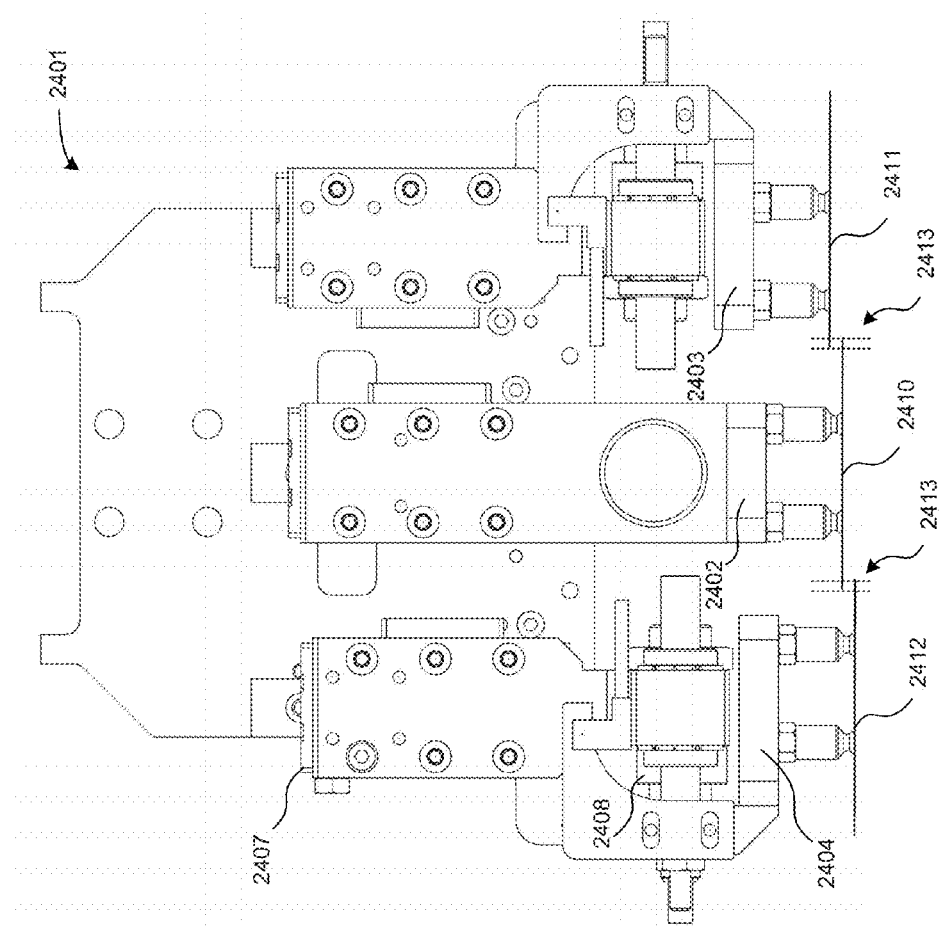
FIG. 24D shows a shingling module for assembly of shingled strings of solar cells according to an embodiment of the invention.

In one embodiment, each of the mechanical arms is capable of moving both in the vertical and horizontal direction. As shown in FIG. 24B, each mechanical arm may lift the strips via suction cups 2405 that apply a holding force to the surface of the strips of solar cells. Each of the mechanical arms can lift the strip it is holding (2410, 2411, and 2412) to a predetermined height, and as a result, the stepped formation shown in FIG. 24B is created. In one embodiment, shown in FIG. 24C, mechanical arms 2403 and 2404 move toward mechanical arm 2402 by a predetermined distance until the strips overlap. The predetermined distance may be about 2 millimeters in one embodiment, which may correspond to the width of the busbar on each strip. FIG. 24D also shows another view of the strips while being lifted and overlapped in a shingled formation by moving mechanical arms 2403 and 2404 toward mechanical arm 2402 by a predetermined distance causing overlap 2413.

When the solar cell strips are overlapped by the appropriate distance, shingling module 2401, can lower the mechanical arms on a substantially flat surface. When the strips are lowered, the conductive paste on each busbar binds the busbars of the strips. As a result, a shingle assembly similar to FIG. 2B is formed.

Figure 25:
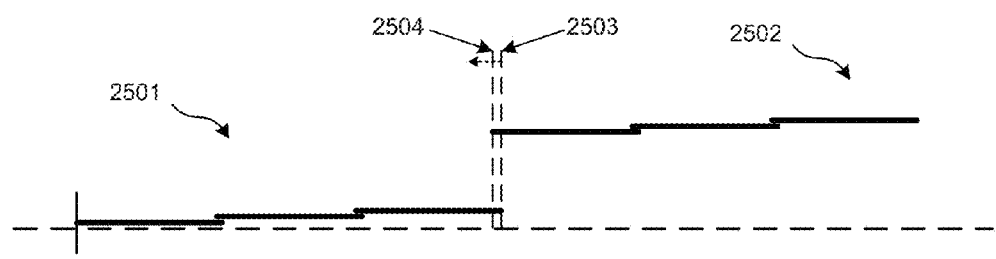
FIG. 25 shows two strings of shingled solar cells according to an embodiment of the invention.

In the embodiment shown in FIG. 24E, every three strips of solar cells are formed into a shingle assembly and placed on a flat surface. This process is repeated to form a longer string of shingled cells. Stated differently, each shingle assembly which includes three strips of solar cells can be placed on another shingle assembly which may be on the flat surface. This results in a longer string of shingled solar cells for every cycle of operation of shingling module 2401. This is also shown in FIG. 25. FIG. 25 shows one shingle assembly 2501 that is placed on a flat surface. Another shingle assembly 2502 can also be placed on top of shingle assembly 2501 to form a longer string. As shown in FIG. 25, shingle assembly 2502 also overlaps the shingle assembly 2501 by an amount equal to the distance between points 2503 and 2504, which may be 2 mm in some embodiments.

In one embodiment, the stepped formation shown in FIG. 24D may be formed on a location, with respect to the flat surface under the mechanical arms, such that when the shingled assembly is placed on the flat surface, the strip of solar cell on the left overlaps the shingle assembly that is already placed on the flat surface. In another embodiment, the step formation shown in FIG. 24D may be formed first, and then the mechanical arms of shingling module 2401 may shift all of the strips until the appropriate amount of overlap with respect to the shingle assembly that is already on the flat surface is achieved. Then, the strips are placed on the flat surface to form a longer string.

Figure 26:
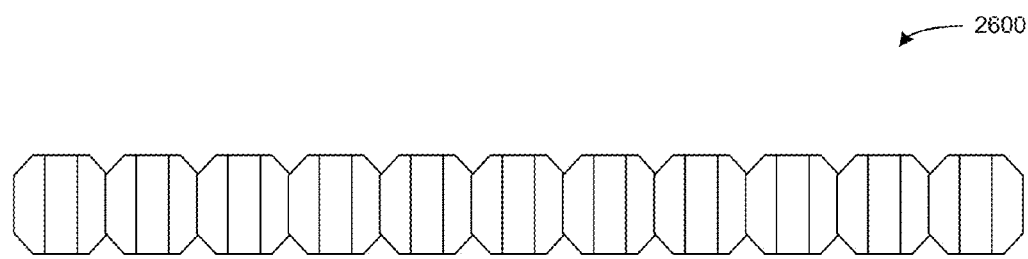
FIG. 26 shows one string of shingled solar cells according to an embodiment of the invention.

In one embodiment, shingling module 2401 may have more mechanical arms such that an entire string may be formed during one cycle. In this embodiment, the mechanical arms lift the strips, create a stepped formation while the strips are lifted, move the strips to achieve a proper amount of overlap and place the strips to form a string of shingled cells. In another embodiment, the process may be divided into multiple sub-processes such that two or more strips are lifted and aligned to form a partial shingled string and the partial string is then lifted and aligned with another partial string to form a complete shingled string similar to the string 2600 shown in FIG. 26.

Shingling module 2401 may control the movement of the mechanical arms in a number of ways. In one embodiment, the movement of the mechanical arms in horizontal and vertical directions may be controlled by a firmware that controls the movement of each mechanical arm from a first three-dimensional coordinate to a second three-dimensional coordinate. In another embodiment, shingling module 2401 may be retrofitted with a vision system that measures the distance of each mechanical arm with respect to another mechanical arm, or any other reference point, and provides near real-time feedback to a control module that directs the movement of the mechanical arm. In another embodiment, any combination of the above-noted methods may be used, in addition to other methods of movement control, to direct the movement of the mechanical arms and achieve the desired level of precision.

Figure 27A:
FIG. 27A shows alignment of solar cells prior to shingling according to an embodiment of the invention.
Figure 27B:
FIG. 27B shows one string of shingled solar cells according to an embodiment of the invention.

In one embodiment, shingled module 2401 may shingle the strips as shown in FIG. 27B. FIG. 27B shows a string where instead of a continuous stepped formation, the strips overlap on two edges of one surface. This configuration may need a different metal grid pattern where each strip has two busbars on one side to accommodate the particular configuration shown in FIG. 27B. In one embodiment, as shown in FIG. 27A, shingling module 2401 arranges the strips such that each strip overlaps two other strips on one side. One advantage of the configuration shown in FIG. 27B may be that a string may not require a tab at one end. Given that the opposite polarities of the string are accessible from one side, the need for a tab may be eliminated.

One problem solved by shingling module 2401, and a technical advantage that results from the operation of shingling module 2401, is the level of precision that shingling module can achieve in overlapping the strips. Shingling module 2401 overlaps the strips by the proper distance so that the busbars of each strip of solar cell are substantially aligned. Performing this process manually is prone to human error and the level of precision required in overlapping the busbars for a string to properly operate cannot be achieved in a manual process.

In one embodiment, the probe testing operation (described above) may be performed by shingling module 2401. In this embodiment, each mechanical arm can also have a probe that can apply a predetermined voltage to the busbars. When the strips of solar cells are lowered on a surface that is grounded, the probe may apply the voltage and testing of the cells may be done at the time of shingle formation. As an optional step, if one of the strips of solar cells fails the test, the entire shingle assembly (i.e. the three strips of solar cells) may be discarded.

Once a complete string is assembled, a conductive tab can be attached to one end of the string. The conductive tab can be attached to a busbar on one side of the string and can provide an electrical contact on the opposite side of the string. Given that each strip of cell has one busbar on each side, when a series of strips are shingled, the busbars at the far ends of the string are positioned on the opposite side of the string with respect to each other. However, a string should be electrically accessible from one side. As a result, the tab allows one of the busbars at one end of the string to be electrically accessible from the other side of the string. Systems and methods for attaching tabs to photovoltaic structures are described in U.S. patent application Ser. No. 14/930,616, entitled "SYSTEM AND APPARATUS FOR PRECISION AUTOMATION OF TAB ATTACHMENT FOR FABRICATIONS OF SOLAR PANELS," filed Nov. 2, 2015, the disclosure of which is incorporated herein by reference in its entirety for all purposes.

Figure 28:
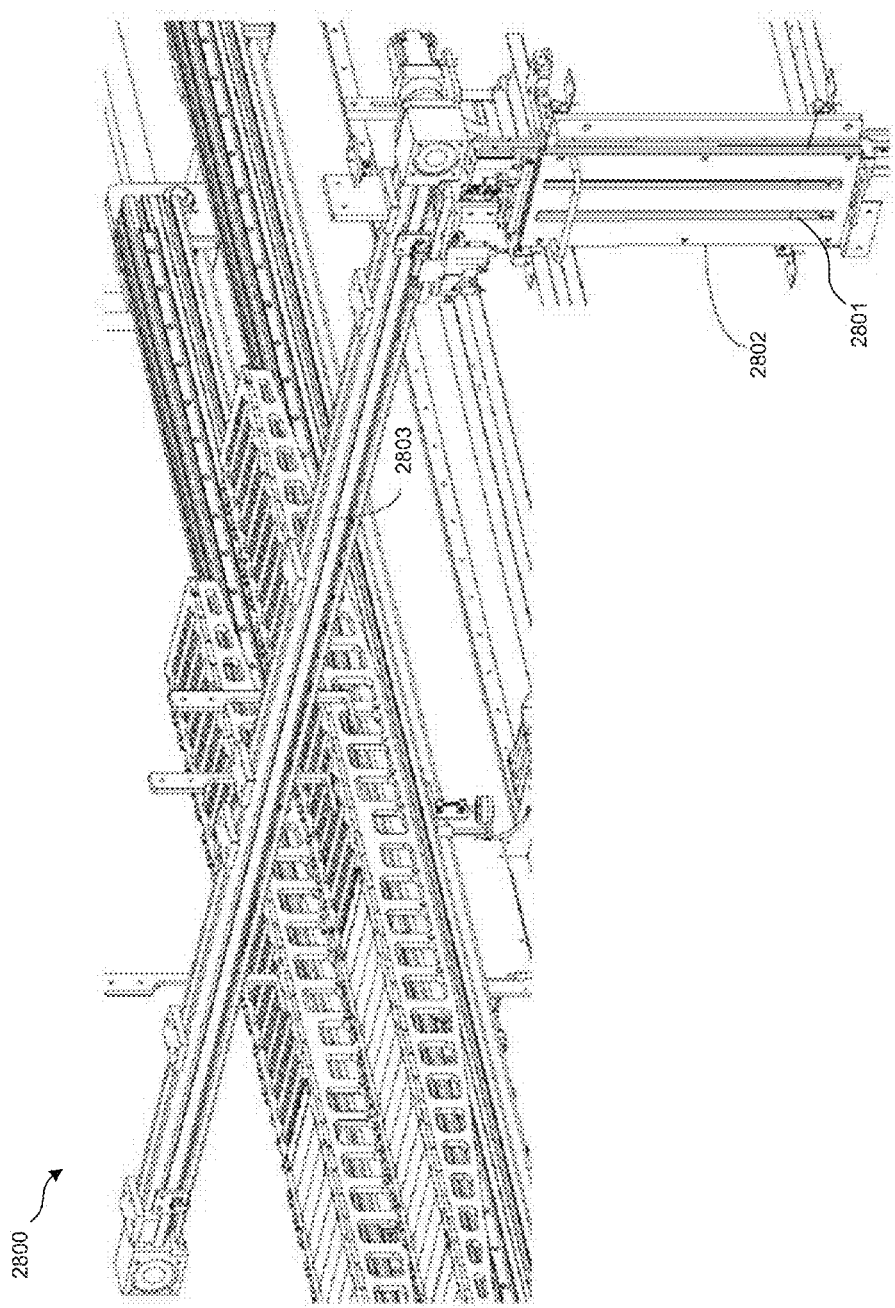
FIG. 28 shows an apparatus for applying tabs on strings of shingled solar cells according to an embodiment of the invention.

FIG. 28 shows tabbing module 2800 in accordance with one embodiment. Tabbing module 2800 includes tab stack elevator 2801, tab cassette 2802, and tab actuator 2803. Tab cassette 2802 is similar to a cartridge that stores a number of tabs. Tab cassette 2802 includes a spring mechanism (not shown) that pushes the tabs as they are fed into the tab actuator 2803 and places the tabs on the strings. Tab stack elevator 2801 raises the tabbing module 2800 to place the tab actuator on top of the string. In one embodiment, as shown in FIG. 28, the tab cassette 2802 can be positioned vertically while the tab actuator 2803 can be positioned horizontally with respect to the tab cassette 2802. As the tabs move up in the cassette, they can travel in a horizontal direction inside tab actuator 2803 and can be placed on top of the busbar on the last strip in the string.

In step 407, the shingle assembly is annealed. In one embodiment, shown in FIG. 29A, string 2902 is placed on heated plate 2901 that is substantially flat and heated up to 160° Celsius. The heat cures the conductive paste that binds the busbars between two strips of solar cells, and results in annealed string 2902 shown in FIG. 29B. This annealing process may be repeated for each shingle string. In another embodiment, the string is annealed by a targeted annealing module that applies heat to selective areas of the string of shingled cells. For example, the string of shingled cells may be placed on an annealing platform and a number of heat-tearing bars may apply heat to the areas of the string where two strips overlap. Systems and methods for targeted annealing of photovoltaic structures are described in U.S. patent application Ser. No. 14/866,817, entitled "SYSTEMS AND METHODS FOR TARGETED ANNEALING OF PHOTOVOLTAIC STRUCTURES," filed Sep. 25, 2015, the disclosure of which is incorporated herein by reference in its entirety for all purposes.

Figure 30A:
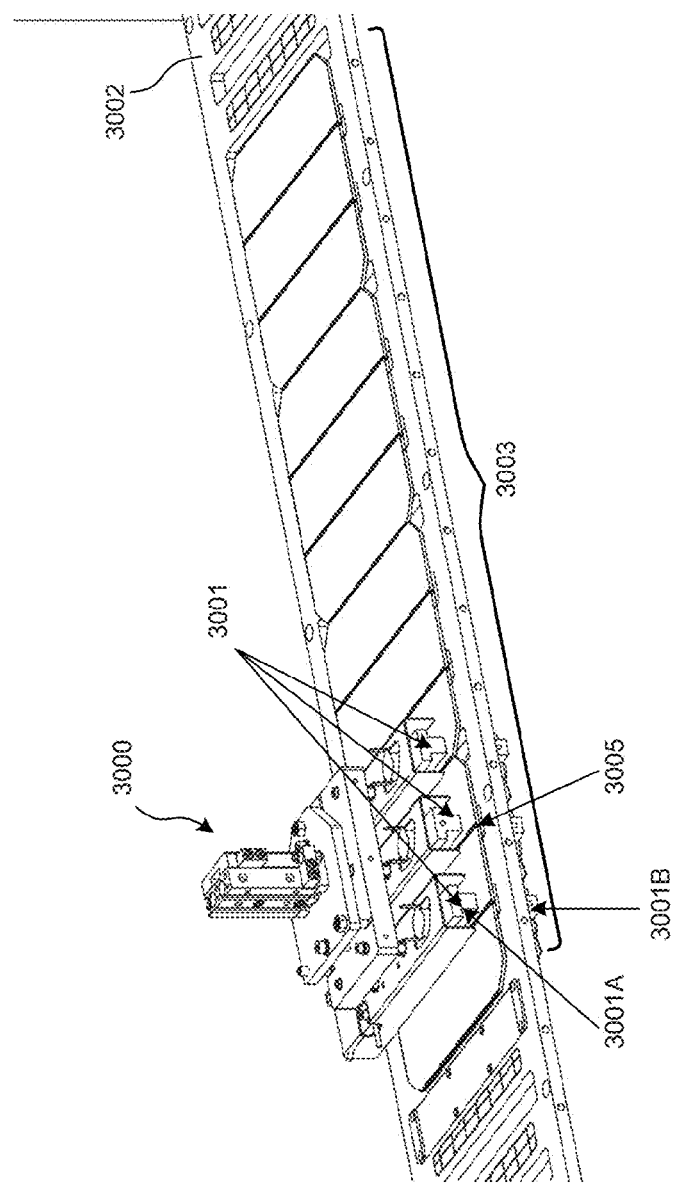
FIG. 30A shows a targeted annealing module according to an embodiment of the invention.
Figure 30B:
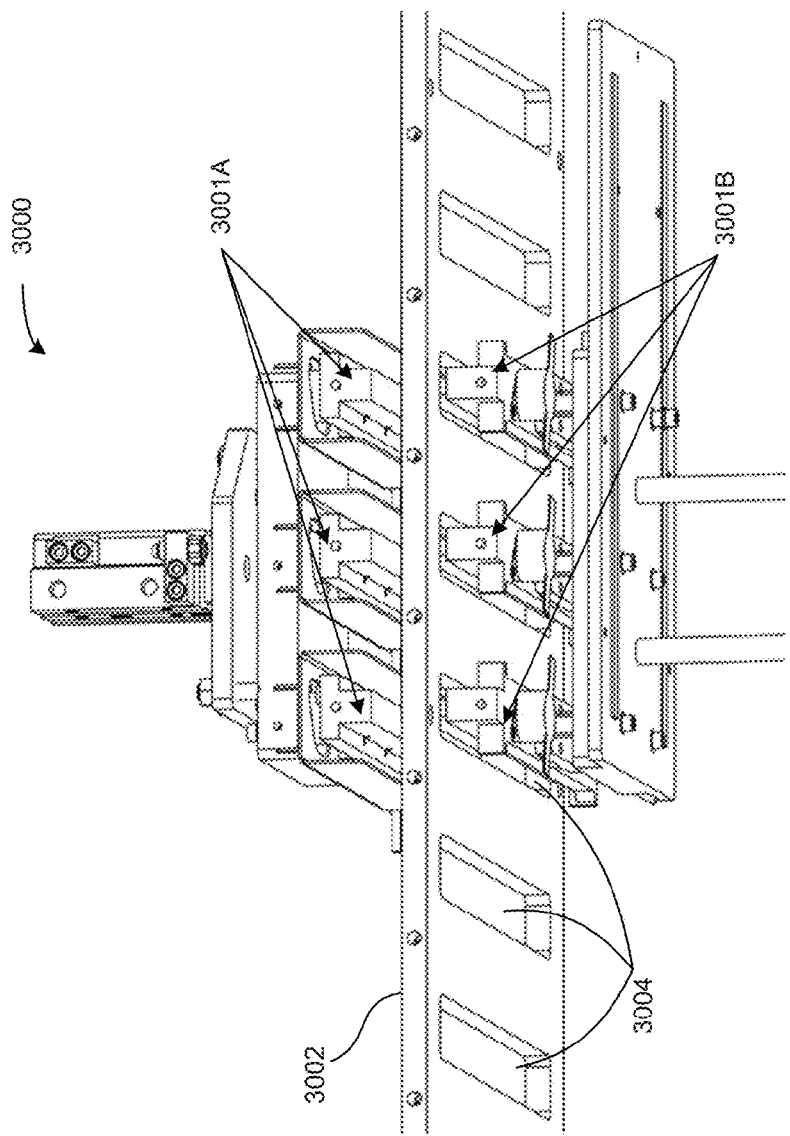
FIG. 30B shows a targeted annealing module according to an embodiment of the invention.

FIGS. 30A and 30B show targeted annealing module 3000, according to one embodiment, that includes heat-treating bars 3001 having top bars 3001A and bottom bars 3001B (shown more clearly in FIG. 30B), and surface 3002 that is substantially flat. As shown in FIG. 30A, string 3003 can be placed on surface 3002. Referring to FIG. 30B, surface 3002 may have a series of openings 3004 that allow heat-treating bars 3001 to contact the string from under surface 3002. Heat-treating bars 3001 can be positioned such that as they approach the string, they apply heat to both sides of the string around the area where strips overlap. One such area is shown in FIG. 30A as area 3005. In one embodiment, heat-treating bars can cure the overlapping areas of the strips up to 160° Celsius.

In one embodiment, the string of shingled cell can move in a horizontal direction on surface 3002 to align the overlapped areas on openings 3004. After the alignment is complete, heat-treating bars 3001 can establish contact with the string to cure the conductive paste that bind the strips. In another embodiment, targeted annealing module 3000 may have more heat-treating bars such that one set of heat-treating bars is dedicated to each overlapped area of the string. In this embodiment, the annealing process for the entire string can be performed in one cycle.

The heat causes the paste in between busbars of the strips of solar cells to cure. In one embodiment, the conductive paste may be in a form of a resin that includes a number of conductive particles. The conductive particles may be coated with a protection layer that evaporates when the paste is thermally cured and thereby results in electrical conductivity between the conductive particles that are suspended inside the resin.

One problem solved by targeted annealing module 3000, and a technical advantage that results, is that it prevents damage to the photovoltaic structure of the solar cells because of heat. The unique design of the targeted annealing module 3000 allows the targeted application of heat only to the areas of the solar cells that need to be cured. Furthermore, the temperature of the heat-treating bars and the amount of time that the heat-treating bars touch the surface of the solar cells can be calibrated to achieve the optimum level of curing.

Figure 31:
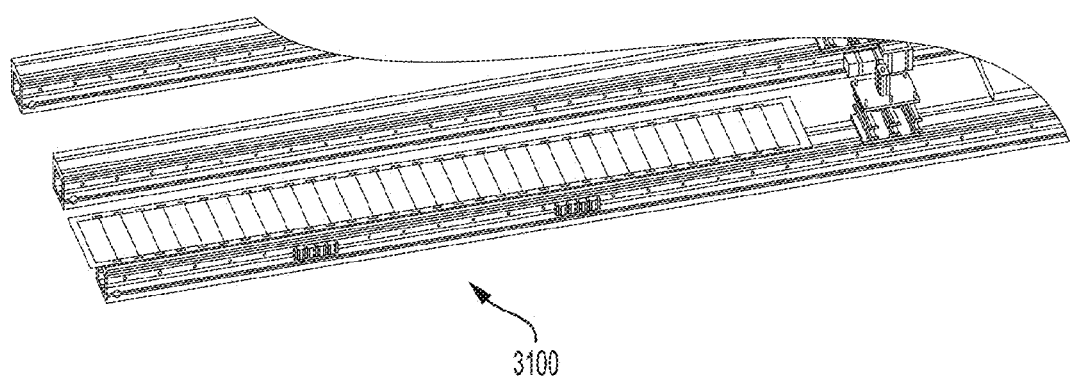
FIG. 31 shows one string of shingled solar cells according to an embodiment of the invention.
Figure 32A:
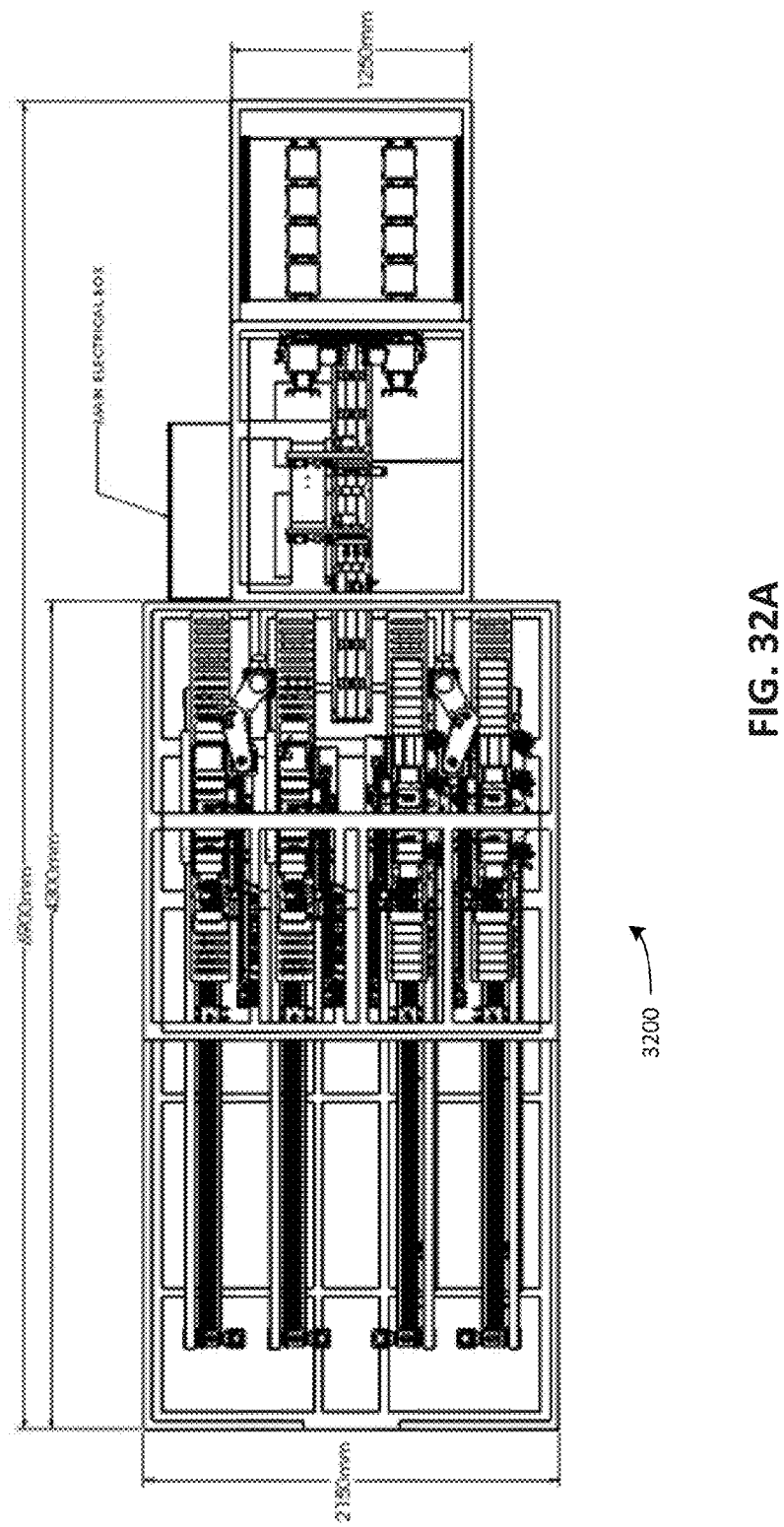
FIG. 32A shows a precision automation system for assembly of shingled solar cells according to an embodiment of the invention.
Figure 32B:
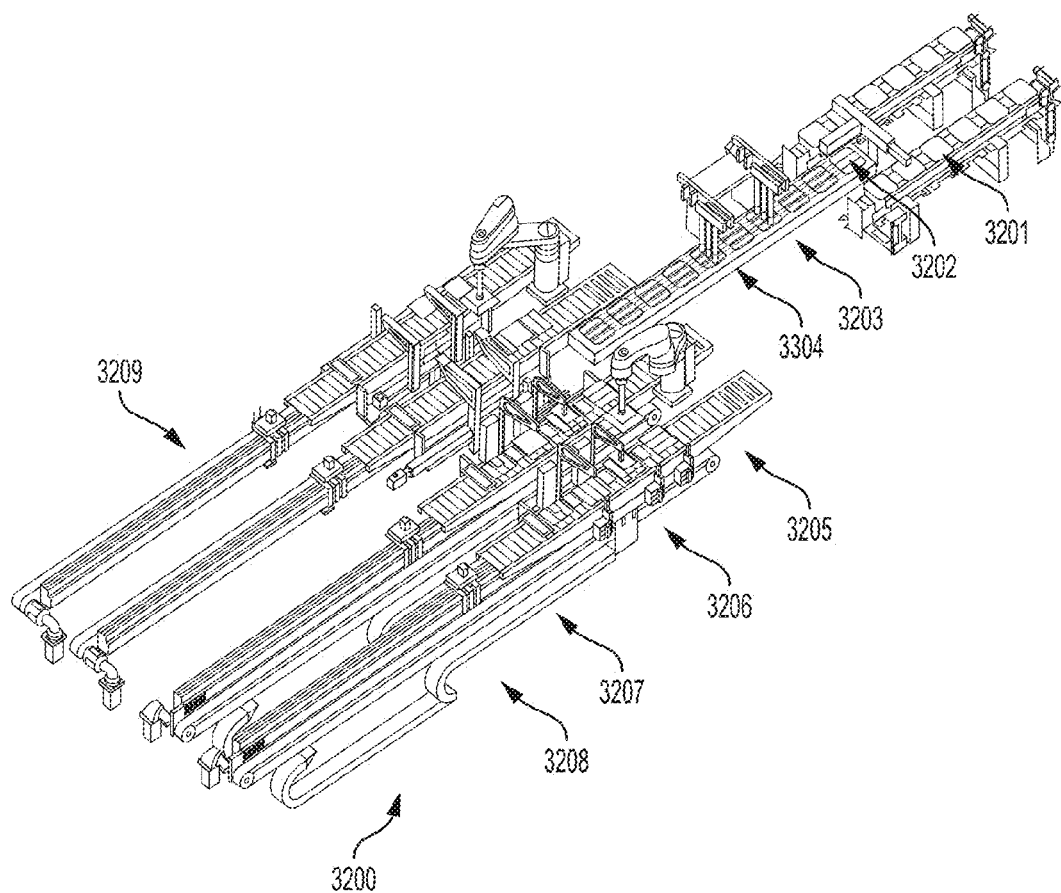
FIG. 32B shows a precision automation system for assembly of shingled solar cells according to an embodiment of the invention.

FIG. 31 shows complete string 3100 after annealing that is ready to be placed in a panel. FIGS. 32A and 32B show the foot print of precision automated system 3200 that comprises storage and loading mechanisms of solar cells 3201, unloading of the cells to the scribe belt 3202, laser scribe module 3203, paste dispensing module 3204, robotic loading to four conveyor lanes 3205, cleaving and testing modules 3206, shingling module 3207, and targeted annealing module 3208. As shown in FIGS. 32A and 32B, scribing module 3203 and paste dispensing module 3204 may be placed on one conveyor while the other operations are performed in parallel on four conveyors. Depending on the time needed for each operation, and the speed of the module that performs that operation, the system may be designed in a manner such that an optimum level of throughput is achieved.

In step 408, the shingle rows are picked and placed on a frame for lamination. In an embodiment, the strings are placed on a backsheet. The strings are then electrically connected together and a glass cover can be placed on top of the strings. The backsheet and the glass cover are then placed in a frame. Systems and methods for placement of backsheet on PV modules are described in U.S. patent application Ser. No. 14/877,870, entitled "SYSTEMS, AND METHOD FOR PRECISION AUTOMATED PLACEMENT OF BACKSHEET ON PV MODULES," filed Oct. 7, 2015, the disclosure of which is incorporated herein by reference in its entirety for all purposes.

Figure 33A:
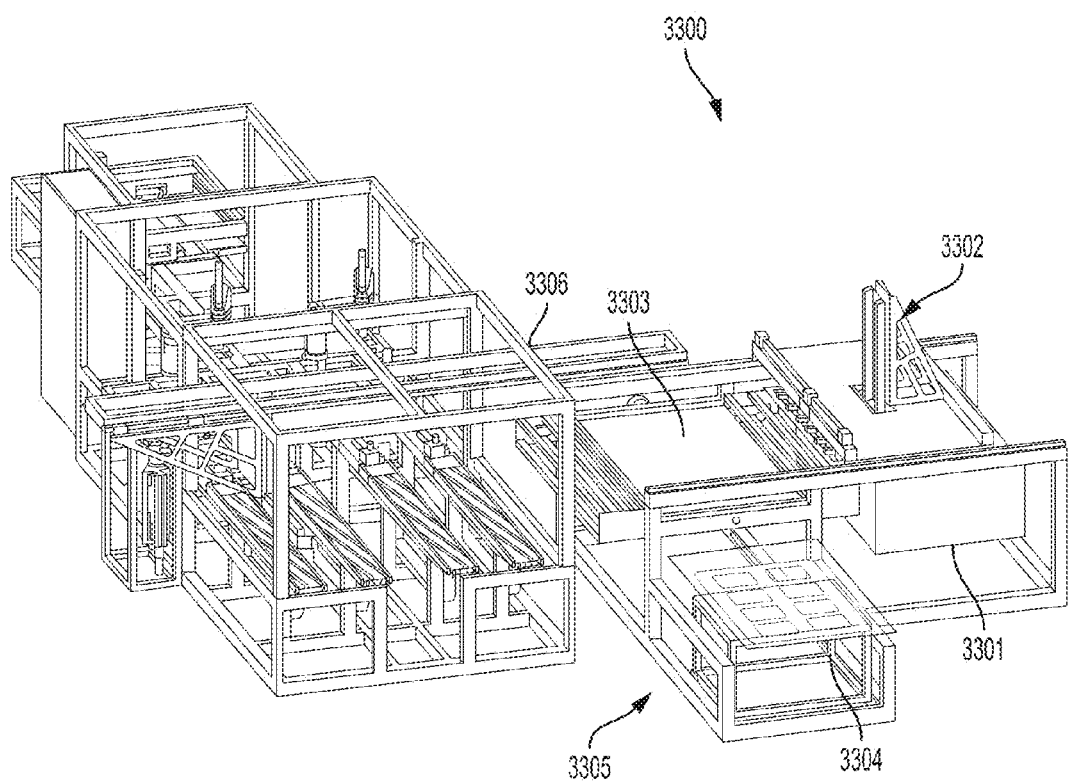
FIG. 33A shows a precision automation system for assembly of shingled solar cells and a layup tool for placement of strings of shingled solar cells on a backsheet according to an embodiment of the invention.
Figure 33B:
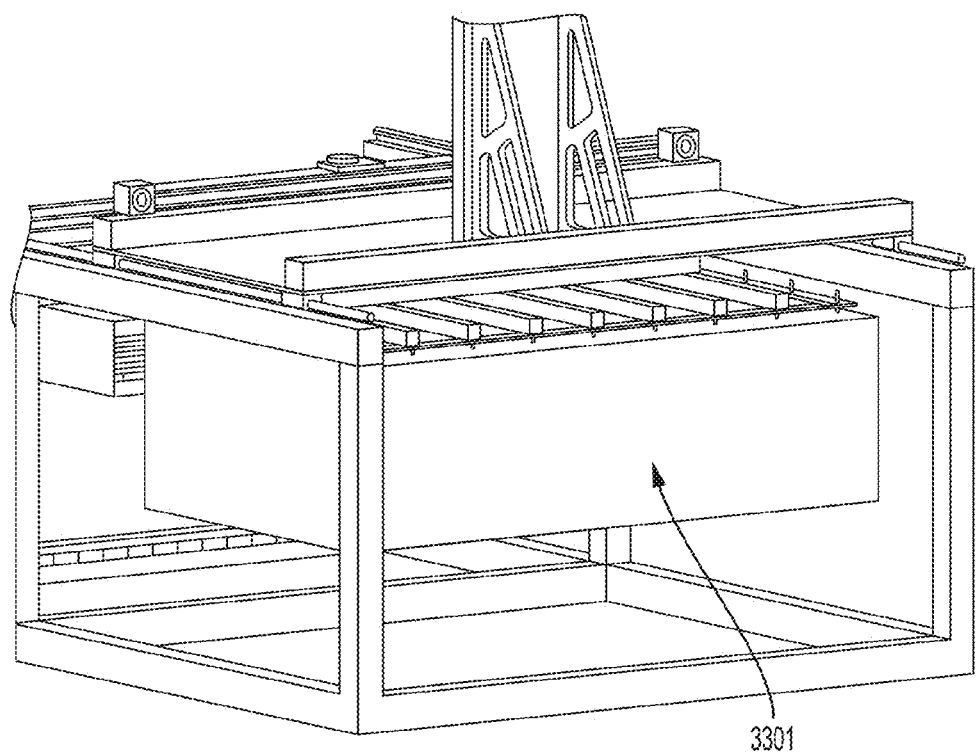
FIG. 33B shows a layup tool for placement of strings of shingled solar cells on a backsheet according to an embodiment of the invention.
Figure 33C:
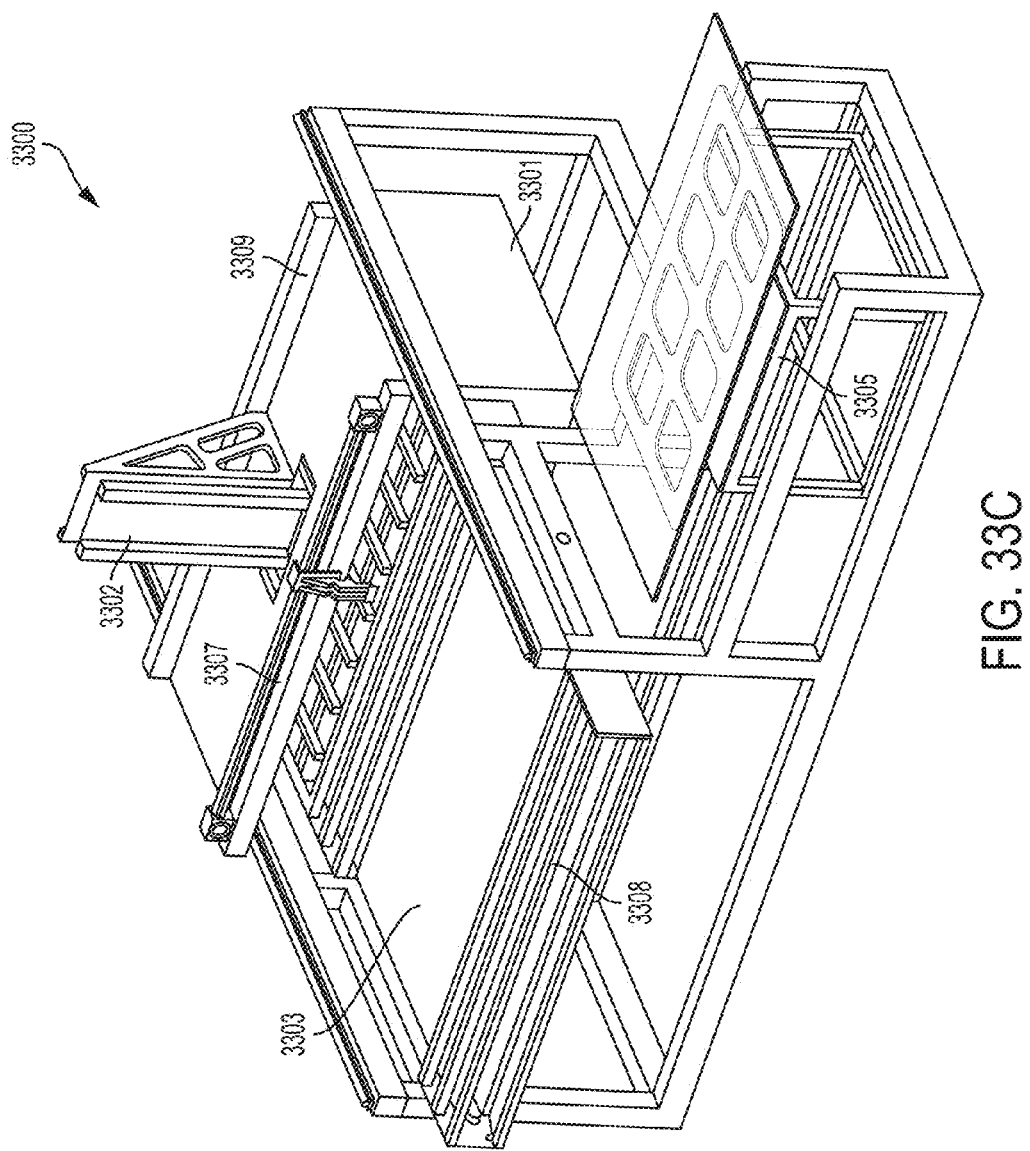
FIG. 33C shows a layup tool for placement of strings of shingled solar cells on a backsheet according to an embodiment of the invention.

FIGS. 33A-33C show automated layup tool 3300 according to one embodiment. Automated layup tool 3300 may include backsheet stack 3301, backsheet pick and place module 3302, vacuum table 3303, glass shuttle and lift 3305, string pick and place module 3306, paste dispense module 3307, support fixture 3308, and heating module 3309.

Figure 35:
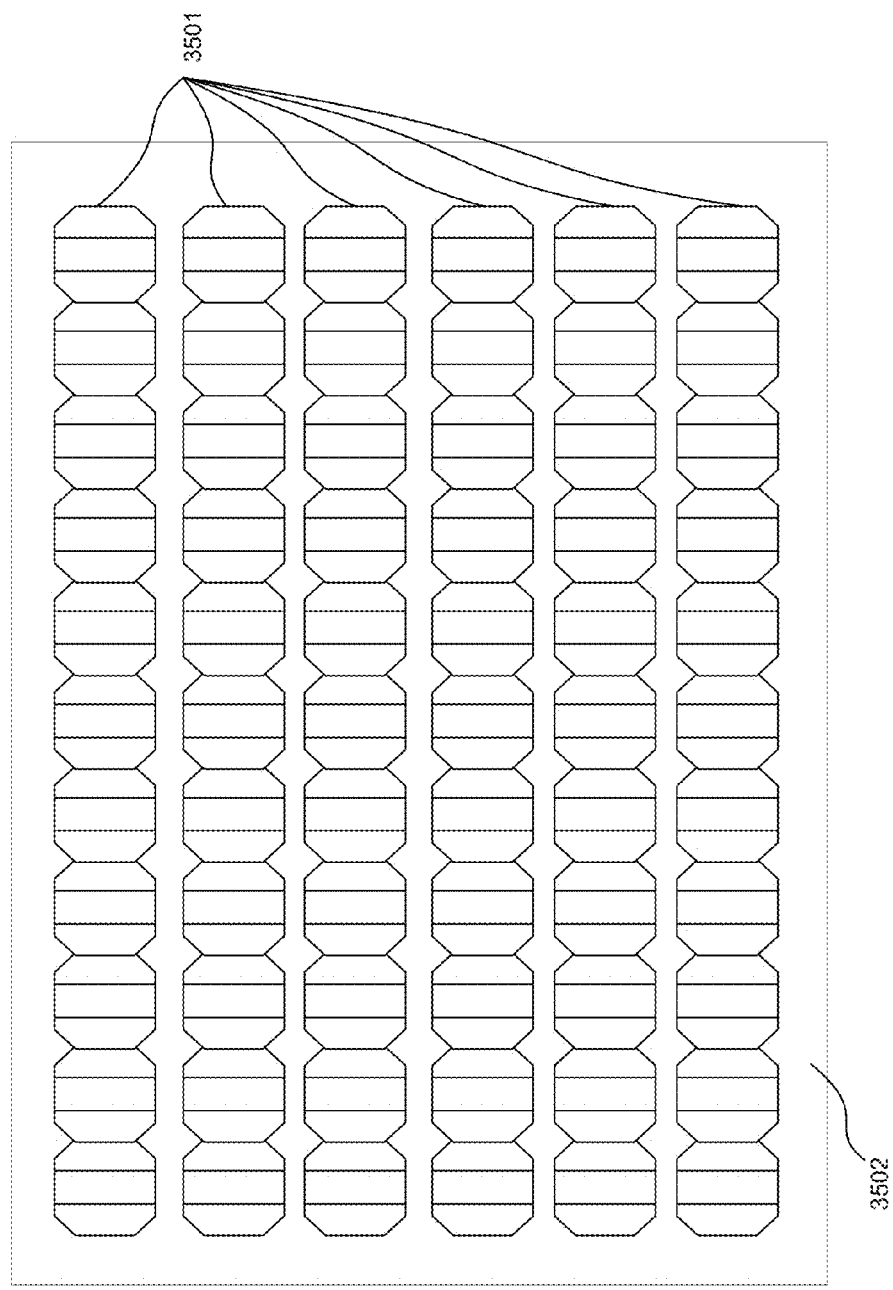
FIG. 35 shows a series of strings of shingled solar cells on a backsheet according to an embodiment of the invention.

In one embodiment, backsheet pick and place module 3302, picks a backsheet from backsheet stack 3301 and places the backsheet on vacuum table 3303. In one embodiment, backsheet pick and place module 3302 can lift a backsheet from inside backsheet stack 3301, and while the backsheet is lifted, backsheet pick and place module 3302 can move toward vacuum table 3303, and place the backsheet on vacuum table 3303. Paste dispense module 3307 may then dispense adhesive on predetermined areas of the backsheet. String pick and place module 3306 can then lift the strings of shingled cells and place them on the backsheet which may be on vacuum table 3303. FIG. 35 shows strings 3501 that are placed on backsheet 3502 according to one embodiment. After the strings are placed on the backsheet, heating module 3309 can then move toward a location above the backsheet and apply heat to cure the paste. String support fixture 3308 can then slide in from each side of vacuum table 3303 to cover the backsheet that is placed on vacuum table 3303. While vacuum table 3303 is applying a holding force to the backsheet, it can rotate 180 degrees so that the backsheet and the strings of shingled cells that are attached to the backsheet are in a face-down position. Glass shuttle and lift 3305 may then slide under vacuum table 3303 and carry glass cover 3304. When glass cover 3304 is under the strings of shingled cells, glass shuttle and lift 3305 can lift glass cover 3304 and attach it to the backsheet. At this time, the strings may be covered by a backsheet on one side and glass cover on the other side. The completed assembly may then be transferred out of the unit and a junction box may be attached to the backsheet.

In one embodiment, string support fixture 3308 can include an inflatable tube that inflates inside support fixture 3308 and prevents the backsheet and strings of shingled cells from moving while being rotated by string support fixture 3308. It will be understood by those skilled in the art, that various operations of layup tool 3300 described above can be altered and modified depending on other designs for the string. Therefore, it will be understood that the order of steps in which the operation of the layup tool is described is not meant to be limiting.

Figure 34:
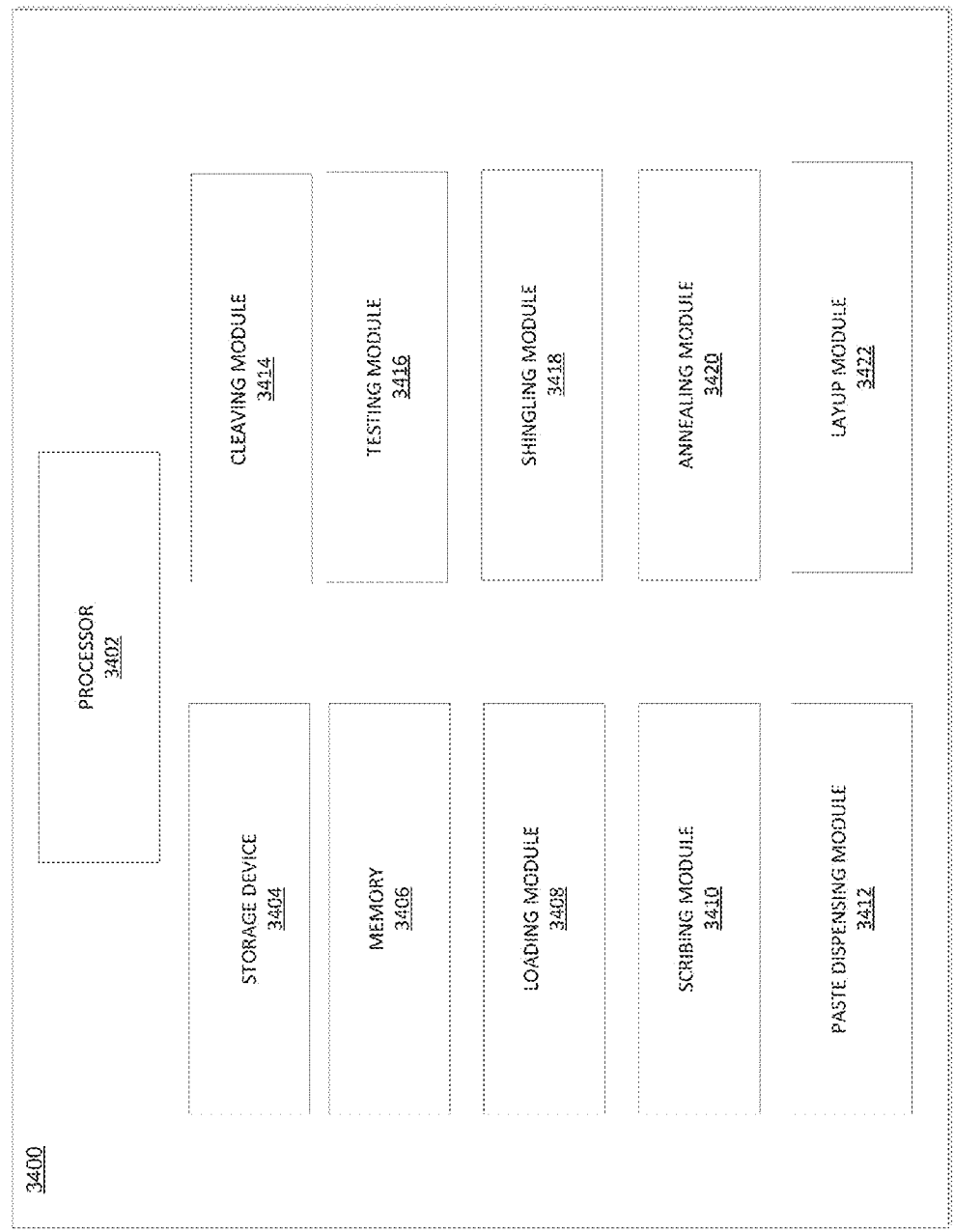
FIG. 34 shows a control system that can facilitate assembly of a solar panel according to an embodiment of the invention.

FIG. 34 shows control system 3400 that can facilitate assembly of a solar panel. Control system 3400 can include a plurality of modules which may communicate with one another via a wired or wireless communication channel. Control system 3400 may be realized using one or more integrated circuits, and may include fewer or more modules than those shown in FIG. 34. Further, control system 3400 may be integrated in a computer system, or realized as a separate device which is capable of communicating with other computer systems and/or devices, such as the devices of systems 3200 and 3300.

Control system 3400 can include processor 3402, storage device 3404, and memory 3406. Memory 3406 can include a volatile memory (e.g., RAM) that serves as a managed memory, and can be used to store one or more memory pools. In some embodiments, storage device 3406 can store an operating system, and instructions for monitoring and controlling the assembly of a solar panel, such as the methods or portions of methods depicted at FIG. 4, and at FIGS. 6-33C.

Control system 3400 can include loading module 3408, which controls operation of one or more devices associated with loading solar cells onto a conveyor. Such devices, for example, can include robotic arms and/or solenoids for applying suction to solar cells and motors for actuating aspects of solar cell loading. For example, loading module 3408 can operate one or more motors for vertically and linearly positioning a robotic arm and one or more solenoids for controlling suction applied by a grabbing portion of the robotic arm to securely hold a solar cell. Loading module 3408 can be accompanied by a vision system (e.g., one or more cameras) that can capture images of solar cells in association with the loading and/or other aspects. However, other types of sensor systems can be used in conjunction with loading module 3408.

Control system 3400 can include scribing module 3410, which controls operation of one or more devices associated with scribing solar cells, which can include scribing modules 801, 901, and 3203 described above, and the devices and components described with respect to these modules. Such devices, for example, can include laser generators and motors for actuating aspects of laser scribing tools as described above. Scribing module 3410 can be accompanied by a vision system (e.g., one or more cameras) that can capture images of cells in association with the laser scribing. However, other types of sensor systems can be used in conjunction with scribing module 3410.

Control system 3400 can include paste dispensing module 3412, which controls operation of one or more devices associated with dispensing conductive paste on solar cells, which can include modules 1001, 1101, 3304 described above and the devices and components described with respect to these modules. Such devices, for example, can include one or more syringes or jetting units and motors for actuating aspects of dispensing paste as described above. Paste dispensing module 3412 can be accompanied by a vision system (e.g., one or more cameras) that can capture images of cells in association with the paste dispensing. However, other types of sensor systems can be used in conjunction with paste dispensing module 3412.

Control system 3400 can include cleaving module 3414, which controls operation of one or more devices associated with cleaving solar cells, which can include cleaving apparatus 1801, and the devices and components described with respect to apparatus 1801. Such devices, for example, can include cleaving actuators, spring plungers, cleave tips, and lift mechanisms described above with respect to cleaving apparatus 1801. Cleaving module 3414 can be accompanied by a vision system (e.g., one or more cameras) that can capture images of cells in association with the cleaving. However, other types of sensor systems can be used in conjunction with cleaving module 3414.

Control system 3400 can include testing module 3416, which controls operation of one or more devices associated with electrical testing of solar cells, which can include testing unit 2200 described above, and the devices and components described above with respect to testing unit 2200. Such devices, for example, can include probes to electrically contact solar cells and provide currents thereto and associated actuators to vertically and horizontally position the probes to electrically contact the solar cells, and arms and actuators to remove cells that are found to be defective, as described above. Testing module 3416 can be accompanied by a vision system (e.g., one or more cameras) that can capture images of cells in association with the testing. However, other types of sensor systems can be used in conjunction with testing module 3416.

Control system 3400 can include shingling module 3418, which controls operation of one or more devices associated with shingling solar cells into strings, which can include vacuum mechanism 2301, shingling module 2401, and the devices and components described above with respect to mechanism 2301 and module 2401. Such devices, for example, can include mechanical arms with one or more suction cups to hold solar cells in place and actuators to position the mechanical arms holding solar cells in desired positions to form strings. Shingling module 3418 can be accompanied by a vision system (e.g., one or more cameras) that can capture images of cells in association with the shingling. However, other types of sensor systems can be used in conjunction with shingling module 3418.

Control system 3400 can include annealing module 3420, which controls operation of one or more devices associated with annealing strings, which can include annealing module 3000 and devices and components described above with respect to module 3000. Such devices, for example, can include heat-treated bars, heaters for controlling the temperature of heat-treated bars, and actuators for aligning and positioning the bars on the strings Annealing module 3420 can be accompanied by a vision system (e.g., one or more cameras) that can capture images of cells in association with the annealing. However, other types of sensor systems can be used in conjunction with annealing module 3420.

Control system 3400 can include layup module 3422, which controls operation of one or more devices associated with placing the string on a backsheet, electrically connecting the strings, and placing a glass cover on top of the strings, which can include automated layup tool 3300. Such devices may include backsheet pick and place module 3302, vacuum table 3303, glass shuttle and lift 3305, string pick and place module 3306, paste dispense module 3307, support fixture 3308, and heating module 3309. Layup module 3422 can be accompanied by a vision system (e.g., one or more cameras) that can capture images of cells in association with the pick and place, vacuuming, glass shuttle and lift, paste dispensing, and heating. However, other types of sensor systems can be used in conjunction with layup module 3422.

Other variations are within the spirit of the present invention. Thus, while the invention is susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions, and equivalents falling within the spirit and scope of the invention, as defined in the appended claims.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

APPENDIX OF ASPECTS

In an aspect, a method is provided for creating shingled solar cells. The method may include scribing a solar cell at predetermined locations, applying a conductive paste on the solar cell, dividing the solar cell into two or more strips of solar cells, lifting the two or more strips of solar cells, shifting the two or more strips of solar cells toward each other such that the two or more strips of solar cells are arranged in a step formation while being lifted, and placing the two or more strips of solar cells on a surface to form a shingled string of solar cells.

In many embodiments of the method, the solar cell may be scribed using a laser beam, wherein the laser beam penetrates the surface of the solar cell up to a predetermined depth. In some embodiments of the method, the laser beam may penetrate the solar cell up to 30 microns. In some embodiments of the method, the laser beam may penetrate the solar cell up to 50 microns. In some embodiments of the method, the laser beam may penetrate the solar cell at a depth between 30 to 50 microns.

In many embodiments of the method, the conductive paste may be applied on a plurality of busbars on the solar cell. In some embodiments of the method, the conductive paste may be applied at predetermined locations on the plurality of busbars. In some embodiments of the method, the conductive paste may be dispensed in the form of droplets on the plurality of busbars via a paste dispensing module.

In many embodiments of the method, the solar cell may be divided into three strips of solar cells simultaneously.

In many embodiments of the method, each of the two or more strips of solar cells may be lifted at a different height such that the height at which each of the two or more strips of solar cells may be lifted may be different from other remaining strips of solar cells.

In many embodiments of the method, each of the two or more strips of solar cells may be moved toward each other such that they overlap by about two millimeters.

In many embodiments of the method, the strips of solar cells are arranged in a step formation after being lifted.

In many embodiments, the method may further include annealing the shingled string of solar cells to cure the conductive paste. In some embodiments, the shingled string of solar cells may be annealed at predetermined locations within surface area of the shingled strings of solar cells. In some embodiments, the shingled string of solar cells may be annealed at predetermined locations on both sides within the surface area of the shingled string of solar cells.

In another aspect, a method is provided for creating shingled solar cells. The method may include scribing a solar cell at predetermined locations, applying a conductive paste on the solar cell, dividing the solar cell into three strips, lifting the three strips, shifting the three strips toward each other such that the three strips are arranged in a step formation while being lifted, and placing the three strips on a surface to form a shingled solar cell.

In many embodiments of the method, the solar cell may be scribed along two lines, each line located at an equal distance from the edge of the solar cell. In some embodiments, the two lines may divide the solar cell into three strips, and each strip may have the same width compared to each other and each strip may have the same length compared to each other. In some embodiments, each strip may have a busbar running along the length of the strip and substantially close to the edge of the strip along its length.

In many embodiments of the method, each strip may have two sides, and each side may include a busbar running along the length of the strip and substantially close to the edge of the strip along its length, and a plurality of fingers running along the width of the strip, wherein the fingers are parallel with respect to each other and orthogonal to the busbar.

In many embodiments of the method, the busbar may include copper. In many embodiments of the method, the fingers may include copper. In many embodiments of the method, the busbars and fingers may be made of copper and may be deposited on the solar cell at the same time.

In many embodiments of the method, the conductive paste may be applied on the surface of the busbar. In some embodiments, the conductive paste may be deposited on the busbar by depositing a predetermined amount of droplets of paste on the surface of the busbar.

In still another aspect, a method is provided for assembly of a solar panel. The method may include placing a solar cell on a conveyor, dividing the solar cell into two or more smaller solar cells, applying conductive paste to the edge of each of the smaller solar cells, lifting the smaller solar cells with a vacuum mechanism, shifting the smaller solar cells horizontally using the vacuum mechanism, and aligning the smaller solar cells, using the vacuum mechanism, to form a shingled string of solar cells.

In many embodiments of the method, the solar cell may be divided into two or more smaller solar cells by laser scribing the solar cell at a predetermined location. In some embodiments, the solar cell may be laser scribed at a depth of 30 microns. In some embodiments, the solar cell may be laser scribed only at the edges of the solar cell. In some embodiments, the solar cell may be laser scribed at two more predetermined locations resulting in a dotted line formed as the result of the laser scribing. In some embodiments, the method may further include lifting the solar cell, using a vacuum mechanism, after laser scribing, and cleaving the solar cell by placing the solar cell on a wedge along the region that is scribed and applying pressure.

In many embodiments of the method, the solar cell may be divided into two or more smaller solar cells by achieving a temperature differential at a predetermined region of the solar cell such that the cell breaks into smaller solar cells.

In many embodiments, the method may further include probe testing the solar cell after dividing the solar cell into two or more smaller solar cells. In some embodiments, the probe testing is conducted while the solar cell is lifted by the vacuum mechanism.

In some embodiments, the method may further include placing the shingled string of solar cells, using the vacuum mechanism, on a heated plate to anneal the shingled string of solar cells.

In another aspect, a system is provided for assembly of a solar panel. The system may include a conveyor mechanism for housing one or more solar cells, a laser scribing mechanism configured to scribe the solar cells at one or more predetermined locations, and a vacuum mechanism configured to lift the one or more solar cells and apply pressure against raised edge of a surface while lifting the one or more solar cells to divide the solar cells into two or more smaller solar cells. The vacuum mechanism may shift and align the two or more smaller solar cells to form a shingled string of solar cells.

In many embodiments, the system may further include an adhesive application mechanism configured to apply adhesive at predetermined locations on the two or more smaller solar cells.

In many embodiments, the system may further include a probe testing mechanism configured to probe test the two or more smaller solar cells while the two or more smaller solar cells are being lifted via the vacuum mechanism.

In many embodiments, the system may further include an annealing mechanism including a heated surface configured to house the shingled string of solar cells and apply a predetermined temperature to one side of the shingled string of solar cells. In some embodiments, the temperature of the heated surface may be 160° C.

In many embodiments, the system may further include a housing configured to house a stack of solar cells wherein the solar cells are transferred from the housing to the conveyor. In some embodiments, the system may include eight housings configured to house a stack of solar cells. In some embodiments, the system may include four housings configured to house a stack of solar cells.

In many embodiments of the system, the laser mechanism may scribe the solar cells at a depth of 30 microns. In many embodiments of the system, the laser mechanism may scribe the solar cells at the outer edges.

In another aspect, a system is provided for automated precision scribing of solar cells. The system may include a laser scribing module configured to emit a laser beam capable of scribing a surface up to a predetermined depth, and a conveyor adapted to provide support for solar cells and transport solar cells from a starting point to an end point along a substantially horizontal line. The laser scribing module may be positioned on top of the conveyor, and while the solar cells are transported via the conveyor from the starting point to the end point, the laser scribing module may scribe the surface of the solar cells.

In many embodiments of the system, the predetermined depth may be about 30 microns. In many embodiments of the system, the predetermined depth may be about 50 microns. In many embodiments of the system, the predetermined depth may be between 30 to 50 microns.

In many embodiments, the system may further include a verification module configured to determine whether the solar cells are positioned accurately below the laser scribing module such that the laser beam will scribe the solar cells at the accurate position within the surface area of the solar cells. In some embodiments, the verification module may include a camera configured to take a photograph of a solar cell on the conveyor and compare the position of the solar cell on the conveyor with a reference photograph to determine whether the solar cell is accurately positioned on the conveyor.

In many embodiments of the system, the width of the conveyor may be about the same width as a width of a solar cell. In some embodiments, while the solar cell is placed on top of the conveyor, it may be unable to shift laterally.

In many embodiments of the system, the predetermined depth may depend on the speed of movement of the conveyor such that depth of the scribe has an inverse relationship to the speed at which the conveyor moves.

In many embodiments of the system, the solar cells may be scribed along a line substantially close to where a busbar is located on the solar cells.

In many embodiments of the system, the start point and the end point may define a length equal to at least three times the length of a solar cell.

In another aspect, a system is provided for automated precision scribing of solar cells. The system may include a first laser scribing module, a second laser scribing module, a conveyor adapted to provide support for solar cells and transport solar cells from a starting point to an end point along a substantially horizontal line. The first laser scribing module and the second laser scribing module may be positioned on top of the conveyor and parallel with respect to each other, and while the solar cells are transported via the conveyor from the starting point to the end point, the first laser scribing module and the second laser scribing module may scribe the surface of the solar cells along two parallel lines within the surface of the solar cells.

In many embodiments of the system, the first laser scribing module and the second laser scribing module may be configured to emit laser beam capable of scribing a surface up to a predetermined depth.

In many embodiments of the system, the two parallel lines may each be positioned at an equal distance from the edges of the solar cells.

In many embodiments of the system, the two parallel lines may divide a solar cell into three strips of solar cells such that each strip has a same width compared to the other strips, and wherein each strip has a same length compared to the other strips. In some embodiments, each strip of solar cells may include a busbar substantially close to the edge that defines the length of the strip, and may further include a plurality of fingers parallel with respect to each other and orthogonal to the busbar.

In another aspect, a system is provided for automated precision dispensing of conductive paste. The system may include a paste dispensing module configured to dispense droplets of paste and a conveyor adapted to provide support for solar cells and transport solar cells from a starting point to an end point along a substantially horizontal line. The paste dispensing module may be configured to deposit a plurality of droplets of paste on the surface of the solar cells while the solar cells are transported by the conveyor from the starting point to the end point.

In many embodiments of the system, the diameter of each of the plurality of droplets of paste may be about 300 microns. In many embodiments of the system, the diameter of each of the plurality of droplets of paste may be about 400 microns. In many embodiments of the system, each of the plurality of droplets of paste may have a diameter between 300 to 400 microns. In many embodiments of the system, each of the plurality of droplets of paste may have a volume of about $1.4235 \times 10^{-5}$ cubic centimeters.

In many embodiments of the system, each of the plurality of droplets of paste has a number of conductive particles dispensed within each droplet. In some embodiments, the density of the conductive particles within each droplet may be 60% of the total volume of each droplet. In some embodiments, the density of the conductive particles within each droplet may be 90% of the total volume of each droplet. In some embodiments, the density of the conductive particles within each droplet may be between 60% to 90% of the total volume of each droplet. In some embodiments, the density of the conductive particles within each droplet may be between 50% to 90% of the total volume of each droplet.

In many embodiments, the system may further include a verification module configured to determine whether the solar cells are positioned accurately below the paste dispensing module such that the plurality of droplets of paste are deposited on the solar cells at the accurate position within the surface area of the solar cells. In some embodiments, the verification module may include a camera configured to take a photograph of a solar cell on the conveyor and compare the position of the solar cell on the conveyor with a reference photograph to determine whether the solar cell is accurately positioned on the conveyor.

In many embodiments of the system, the width of the conveyor may be about the same width as a width of a solar cell, and while the solar cell is placed on top of the conveyor, it may be unable to shift laterally.

In many embodiments of the system, the distance between the locations at which each of droplet of paste is deposited on the surface of the solar cell may have an inverse relationship with respect to the speed at which the conveyor moves from the starting point to the end point.

In many embodiments of the system, the starting point and the end point may define a length equal to at least three times the length of a solar cell. In many embodiments of the system, the starting point and the end point may define a length equal to at least two times the length of the solar cell.

In another aspect, a system is provided for automated precision dispensing of conductive paste. The system may include a first paste dispensing module, a second paste dispensing module, and a conveyor adapted to provide support for solar cells and transport solar cells from a starting point to an end point along a substantially horizontal line. The first paste dispensing module and the second paste dispensing module may be positioned on top of the conveyor and parallel with respect to each other, and while the solar cells are transported via the conveyor from the starting point to the end point, the first paste dispensing module and the second paste dispensing module may deposit droplets of paste on the surface of the solar cells along two parallel lines within the surface of the solar cells.

In many embodiments of the system, the droplets of paste may be deposited on the surface of a busbar which is on the surface of a solar cell. In some embodiments, 65 droplets of paste may deposited on the surface of the busbar.

In many embodiments of the system, the diameter of each of the droplets of paste may be about 300 microns. In many embodiments of the system, the diameter of each of the droplets of paste may be about 400 microns. In many embodiments of the system, the diameter of each of the droplets of paste may be between 300 to 400 microns. In many embodiments of the system, each of the droplets of paste may have a volume of about $1.4235 \times 10^{-5}$ cubic centimeters.

In many embodiments of the system, each of the droplets of paste may have a number of conductive particles dispensed within each droplet. In some embodiments, the density of the conductive particles within each droplet may be 60% of the total volume of each droplet. In some embodiments, the density of the conductive particles within each droplet may be 90% of the total volume of each droplet. In some embodiments, the density of the conductive particles within each droplet may be between 60% to 90% of the total volume of each droplet. In some embodiments, the density of the conductive particles within each droplet may be between 50% to 90% of the total volume of each droplet.

In another aspect, a cleaving apparatus configured to separate a portion of a solar cell is provided. The apparatus may include a first surface, a second surface connected to the first surface, a third surface connected to the second surface, wherein the first surface and the third surface are connected to the second surface at an angle such that where the first surface and the second surface connect, the connection forms a first fulcrum edge, and where the second surface and the third surface content, the connection forms a second fulcrum edge, and a plurality of holes distributed on the first surface and the third surface and configured to pass air from a first side of the first surface and the third surface to a second side of the first surface and the third surface respectively. When a solar cell is placed on the cleaving apparatus, a middle portion of the solar cell is supported by the second surface while outer portions of the solar cell are positioned on top of the first surface and the third surface, but do not establish a contact with the first surface and the third surface.

In many embodiments, the apparatus may further include an actuator having a plurality of plungers configured to apply a force that is vertical with respect to the second surface, and the plurality of plungers may apply the force to outer portions of the solar cell positioned on top of the first surface and the third surface such that the force breaks the solar cell along a first line that is positioned on top of the first fulcrum edge and a second line that is positioned on top of the second fulcrum edge. In some embodiments, each of the plurality of plungers may include a cylindrical housing that house a spring and a tip coupled to the spring, such that a downward movement of the actuator causing a force that is applied against a surface compresses the spring.

In many embodiments of the apparatus, the first surface may include a vacuum mechanism that causes the solar cell to attach to the second surface.

In many embodiments of the apparatus, the first surface and the third surface may include a raised edge at a side that is not connected to the second surface. In some embodiments, when a solar cell is broken, the air coming out of the second side of the first surface and the second side of the third surface may cause the broken portions of the solar cells to slide down a downward angle defined by the connection of the first surface and the third surface to the second surface such that the broken portions of the solar cells are stopped by the raised edge of the first surface and the third surface.

In many embodiments, the apparatus may further include an actuator that includes a plurality of plungers, wherein each of the plurality of plungers may include a cylindrical housing that houses a spring wherein the cylindrical housing defines a vacuum tube coupled to a vacuum system, and a vacuum tip coupled to the cylindrical housing and configured to simultaneously apply suction to a surface and compress the spring while being pushed against the surface. In some embodiments, the plurality of plungers may be configured to hold a solar cell by applying suction to the surface of the solar cell.

In many embodiments, the apparatus may further include a plurality of lifting mechanisms housed below the surface of the first surface and the third surface and configured to raise from within the first surface and the third surface, wherein the plurality of lifting mechanisms are configured to lift a solar cell.

In another aspect, a solar cell cleaving device is provided. The cleaving device may include a cell-holding mechanism operable to hold a first cell segment of a solar cell, at least two cleave tips operable to separate a second cell segment of the solar cell from the first cell segment, and a cleave actuator operable to press the at least two cleave tips against the second cell segment of the solar cell.

In many embodiments, the device may further include a cell-segment catching platform comprising a plurality of air-emitting jets operable to catch the second cell segment of the solar cell after the at least two cleave tips separate the second cell segment from the first cell segment of the solar cell.

In many embodiments of the device, the cell-holding mechanism may include at least one air-suction mechanism operable to maintain a suction hold on the solar cell.

In many embodiments of the device, the cell-cleaving device may partition the solar cell into three cell segments, wherein the first cell segment is a center segment of the solar cell, and wherein the second cell segment is one of two side segments of the solar cell. In many embodiments of the device, the cell-cleaving device may partition the solar cell into two cell segments, wherein the first cell segment is a first half of the solar cell, and wherein the second cell segment is a second half of the solar cell.

In another aspect, a solar cell scribing device is provided. The solar cell scribing device may include a conveyor operable to transport a sequence of solar cells from a cell-loading mechanism to one or more cell-cleaving devices, and a scribing head operable to scribe a well along a busbar of the solar cell while the conveyor is transporting the solar cell.

In many embodiments of the device, the scribing head includes a laser head operable to emit a laser beam that scribes the well on a surface of the solar cell.

In many embodiments, the device may further include a two-axis arm operable to move the scribing head to scribe the well along the busbar of the solar cell. In some embodiments, the two-axis arm may be further operable to move the scribing head along a first axis to align the scribing head with the busbar while the conveyor is transporting the solar cell. In some embodiments, the two-axis arm may be further operable to move the scribing head along a second axis to scribe the well along the busbar while the conveyor is transporting the solar cell toward the cell-cleaving device.

In many embodiments, the device may further include an image sensor operable to capture one or more images of the solar cell while the conveyor is transporting the solar cell toward the cell-cleaving device. In some embodiments, the device further includes a scribe-controlling mechanism operable to guide the scribing head along the busbar, while the conveyor is transporting the solar cell toward the cell-cleaving device, using the one or more images captured by the image sensor as input. In some embodiments, the image sensor is mounted on the scribing head.

In another aspect, a precision automated system is provided for shingling solar cells. The system may include a first mechanical arm configured to move in a vertical direction and a horizontal direction and housing a vacuum mechanism, wherein the mechanical arm includes at least a suction-cup at one end and configured to apply a holding force to a surface, and a second mechanical arm configured to move in a vertical direction and a horizontal direction and housing a vacuum mechanism, wherein the mechanical arm includes at least a suction-cup at one end and configured to apply a holding force to a surface. The first mechanical arm may lift a first solar cell from a surface and the second mechanical arm may lift the second mechanical arm from the surface, and the second mechanical arm may align the second solar cell such that it overlaps the first solar cell while being lifted. The first mechanical arm and the second mechanical arm may place the first solar cell and the second solar cell on the surface while the second solar cell overlaps the first solar cell.

In many embodiments of the system, the second solar cell may overlap the first solar cell by about two millimeters.

In many embodiments of the system, the first mechanical arm may be stationary and the second mechanical arm lifts the second solar cell in a vertical direction and moves the second solar cell horizontally toward the first mechanical arm holding the first solar cell. In some embodiments, the system may further include a measurement module that measures the movement of the first mechanical arm and the second mechanical arm when moving from a starting point to an end point. In some embodiments, the starting point and the end point may be three-dimensional coordinates.

In another aspect, a solar cell shingling device is provided. The device may include a first cell-lifting device operable to lift a first solar cell segment from a first platform, a second cell-lifting device operable to lift, from the first platform, a second solar cell segment that follows the first solar cell segment on the first platform, and a control mechanism operable to control the first cell-lifting device and the second cell-lifting device to layer a leading edge of the second solar cell segment on top of a trailing edge of the first solar cell segment, while transporting the first and second solar cell segments toward a second platform.

In many embodiments of the device, the first cell-lifting device may lift the first solar cell segment to a first elevation, and the second cell-lifting device may lift the second solar cell segment to a second elevation higher than the first elevation.

In many embodiments of the device, the control mechanism may be further operable to rest the first and second solar cell segments on the second platform, with the leading edge of the second solar cell segment layered on top of the trailing edge of the first solar cell segment.

In many embodiments of the device, the cell-holding mechanism may include at least one air-suction mechanism operable to maintain a suction-hold on the solar cell segment.

In many embodiments of the device, the second cell-lifting device may be stationary, and the first cell-lifting device may move toward the second cell-lifting device to place the first solar cell segment under the second solar cell segment. In many embodiments of the device, the first cell-lifting device may be stationary, and the second cell-lifting device may move toward the first cell-lifting device to place the second solar cell segment over the first solar cell segment.

In many embodiments of the device, the first platform and the second platform may define a surface area of a conveyer belt. In many embodiments of the device, the first platform may include one or more solar cell trays.

In another aspect, an automated testing system is provided for testing a solar cell. The system may include a probe configured to move from a starting point to an end point and to apply a predefined voltage to a conductive surface and a grounded surface configured to support a solar cell. When a solar cell is placed on the grounded plate, the probe may contact a busbar on first side of the solar cell and the grounded plate supports a second side of the solar cell.

In many embodiments of the system, the probe may contact the busbar at the end point, and when the probe contacts the busbar, the probe may be configured to measure a current through the solar cell.

In many embodiments of the system, the amount of the current through the solar cell may determine the structural integrity of the solar cell.

In another aspect, a system is provided for attaching a tab to a string of solar cells. The system may include a conveyor module configured to deliver a string of solar cells, wherein an edge of a respective solar cell overlaps an edge of a neighboring solar cell, a tab cartridge configured to store a plurality of conductive metal tabs and to facilitate retrieval of the tabs via an opening, and a tab attachment module configured to retrieve a tab from the opening of the tab cartridge and attaching the retrieved tab to an edge of a solar cell at an end of the string of solar cells. In many embodiments of the system, the tab may be configured to allow electrical access to a busbar placed on a first side of the solar cell through the second side of the solar cell.

In another aspect, a solar cell annealing device is provided. The device may include a first heat-treating bar operable to be heated to a first curing temperature, a second heat-treating bar operable to be heated to a second curing temperature, a first actuator operable to lower the first heat-treating bar to a top surface of two shingled solar cell segments, aligned along an overlap between the two shingled solar cell segments, and a second actuator operable to raise the first heat-treating bar to a bottom surface of two shingled solar cell segments, aligned along an overlap between the two shingled solar cell segments.

In many embodiments, the device may further include a platform operable to support the two shingled solar cell segments, wherein the platform comprises at least one opening operable to allow the second heat-treating bar access to the bottom surface of the two shingled solar cell segments.

In many embodiments of the device, the platform may include a sequence of two or more openings with spacing equal to a spacing between neighboring overlapping sections of a string of shingled solar cell segments.

In many embodiments of the device, the first heat-treating bar may be oriented overhead the center platform, and the second heat-treating bar may be oriented below the center platform.

In many embodiments of the device, a respective heat-treating bar may include a compression spring operable to supply compression between the heat-treating bar and a corresponding actuator while the corresponding actuator presses the respective heat-treating bar against the shingled solar cell segments.

In many embodiments, the device may further include a transport mechanism operable to move the first and second heat-treating bars to other shingled solar cell segments of a string of shingled solar cell segments.

In another aspect, a system is provided for manufacturing solar cell panels. The system may include a backsheet loading module configured to place a backsheet on a platform, a paste dispensing module configured to dispense conductive paste on predetermined regions on the backsheet, a solar cell placement module configured to place a plurality of solar cell strings on the backsheet, an annealing module configured to facilitate localized annealing of predetermined regions on the solar cells, a rotating module configured to flip the backsheet and solar cells, and a glass shuttle module configured to place a piece of glass on a first side of the solar cell panel.

In many embodiments of the system, the rotating module may include an inflatable tube configured to inflate and hold the solar cells in place while the rotating module rotates the backsheet 180 degrees from a first side to a second side, the second side being the opposite surface of the first side.

In many embodiments of the system, the platform may include at least one vacuum mechanism configured to apply a suction force to the backsheet.

In many embodiments of the system, the glass module may be configured to move from a first position to a second position, the second position being below the platform that holds the backsheet, and when the rotating module flips the backsheet, the backsheet is placed on a first side of the piece of glass.

In another aspect, a solar cell is provided. The solar sell may include a metal layer on a first side of the solar cell, wherein the metal layer has a recessed surface that forms a receptacle and is configured to house viscous conductive paste on a metal layer and to prevent spilling of the conductive paste.

In many embodiments of the solar cell, the recessed surface may form a channel that runs across the length of the metal layer. In many embodiments of the solar cell, the recessed surface may form a channel that runs from a starting point to an end point, wherein the distance from the starting point to the end point is less than the length of the metal layer.

In another aspect, a solar cell is provided. The solar cell may include a first side having a width and a length, wherein the length is larger than the width, a metal layer, wherein the metal layer runs along the length of the first side and substantially positioned on the edge of the first side, a first set of plurality of grooves within a first position on the surface of the metal layer; and a second set of plurality of grooves within a second position on the surface of the metal layer, wherein the first set of plurality of grooves and the second set of plurality of grooves are configured to house a viscous conductive paste.

In many embodiments of the solar cell, the first set of plurality of grooves may have a width and a length, the length being larger than the width and wherein the length is parallel to the length of the metal layer.

In many embodiments of the solar cell, the first set of plurality of grooves may have a width and a length, the length being larger than the width and wherein the length is orthogonal to the length of the metal layer.

In another aspect, a method is provided for creating shingled solar cells. The method may include scribing a solar cell at predetermined locations, applying a conductive paste on the solar cell, dividing the solar cell into two or more strips of solar cells, shifting the two or more strips of solar cells toward each other such that the two or more strips of solar cells are arranged in a stepped, and placing the two or more strips of solar cells on a surface to form a shingled string of solar cells.

In many embodiments of the method, the two or more strips of solar cells may be shifted toward each other while resting on a surface. In many embodiments of the method, the two or more strips of solar cells may be shifted toward each other while each of the two or more strips of solar cells are suspended at a different elevation with respect to each other.

In another aspect, a method is provided for assembly of a solar panel. The method may include placing a solar cell on a conveyor, dividing the solar cell into two or more smaller solar strips, applying conductive paste to the edge of each of the smaller solar strips, shifting the smaller solar cells using the vacuum mechanism, and aligning the smaller solar strips, using the vacuum mechanism, to form a shingled string of solar cells.

In many embodiments of the method, the two or more smaller solar strips may be square-shaped. In many embodiments of the method, the two or more smaller solar strips may each have a same length and a same width. In many embodiments of the method, the two or more smaller solar strips may each have a width and a length, wherein the length is larger than the width.

In another aspect, a system is provided for assembly of solar panel. The system may include a conveyor mechanism for supporting one or more solar cells, a solar cell dividing mechanism configured to divide the solar cells at one or more predetermined locations, and a vacuum mechanism configured to lift the one or more solar cells and apply pressure against raised edge of a surface while lifting the one or more solar cells to divide the solar cells into two or more smaller solar cells. The vacuum mechanism may shift and align the two or more smaller solar cells to form a shingled string of solar cells.

In another aspect, a system is provided for automated precision scribing of solar cells. The system may include a laser scribing module configured to emit a laser beam capable of scribing a surface up to a predetermined depth, and a conveyor adapted to provide support for solar cells and transport solar cells from a starting point to an end point. The laser scribing module may be positioned adjacent to the conveyor, and configured to scribe the surface of the solar cells.

In another aspect, a system is provided for automated precision scribing of solar cells. The system may include a first laser scribing module, a second laser scribing module, and a conveyor adapted to provide support for solar cells and transport solar cells from a starting point to an end point. The first laser scribing module and the second laser scribing module may be positioned adjacent to the conveyor, and while the solar cells are transported via the conveyor from the starting point to the end point, the first laser scribing module and the second laser scribing module may scribe the surface of the solar cells along two regions within the surface of the solar cells.

In many embodiments of the system, the two regions may each define a straight line. In many embodiments of the system, the two regions may each define a curved line.

In another aspect, a system is provided for automated precision dispensing of conductive paste. The system may include a paste dispensing module configured to dispense paste, and a conveyor adapted to provide support for solar cells and transport solar cells from a starting point to an end point along a substantially horizontal line. The paste dispensing module may be configured to deposit paste on the surface of the solar cells while the solar cells are placed on the conveyor.

In many embodiments of the system, the paste dispending module may dispense droplets of paste on the surface of the solar cells.

In many embodiments of the system, when the droplets of paste are deposited on the surface of the solar cells, the droplets of paste may have an equal distance with respect to each other. In many embodiments of the system, when the droplets of paste are deposited on the surface of the solar cells, the droplets of paste may not have an equal distance with respect to each other.

In many embodiments of the system, the paste dispensing module may dispense one or more stands of paste on the surface of the solar cells. In some embodiments, when the strands of paste are deposited on the surface of the solar cells, the strands of paste may have an equal distance with respect to each other. In some embodiments, when the strands of paste are deposited on the surface of the solar cells, the strands of paste may not have an equal distance with respect to each other. In some embodiments, the strands of paste each have a width and a length, the length being larger than the width. In some embodiments, one or more of the strands of paste may each have a different length with respect to each other.

In another aspect, a system is provided for automated precision dispensing of conductive paste. The system may include a first paste dispensing module, a second paste dispensing module, and a conveyor adapted to provide support for solar cells and transport solar cells from a starting point to an end point. The first paste dispensing module and the second paste dispensing module may be positioned adjacent to the conveyor, and while the solar cells are transported via the conveyor from the starting point to the end point, the first paste dispensing module and the second paste dispensing module may deposit paste on the surface of the solar cells along two regions within the surface of the solar cells.

In many embodiments of the system, the two regions may each define a straight line. In some embodiments, the two regions may each define a straight line parallel with respect to each other.

In many embodiments of the system, the two regions each define a curved line.

In another aspect, a cleaving apparatus configured to separate a portion of a solar cell is provided. The apparatus may include a first surface, a second surface connected to the first surface, a third surface connected to the second surface, wherein the first surface and the third surface are connected to the second surface at an angle such that where the first surface and the second surface connect, the connection forms a first fulcrum edge, and where the second surface and the third surface content, the connection forms a second fulcrum edge, and a plurality of holes distributed on the first surface and the third surface and configured to pass air from a first side of the first surface and the third surface to a second side of the first surface and the third surface respectively. When a solar cell is placed adjacent to the cleaving apparatus, a middle portion of the solar cell is supported by the second surface while outer portions of the solar cell are positioned on top of the first surface and the third surface, but do not establish a contact with the first surface and the third surface.

In another aspect, a solar cell scribing device is provided. The device may include a conveyor operable to transport a sequence of solar cells from a cell-loading mechanism to one or more cell-cleaving devices, and a scribing head operable to scribe a well along a busbar of the solar cell while the conveyor is supporting the solar cell.

In another aspect, a precision automated system is provided for shingling solar cells. The system may include a first mechanical arm configured to move in a first direction and a second direction and housing a vacuum mechanism, wherein the mechanical arm includes at least a suction-cup at one end and configured to apply a holding force to a surface, and a second mechanical arm configured to move in a first direction and a second direction and housing a vacuum mechanism, wherein the mechanical arm includes at least a suction-cup at one end and configured to apply a holding force to a surface. The first mechanical arm may lift a first solar cell from a surface and the second mechanical arm may lift a second solar cell from the surface, and the second mechanical arm may align the second solar cell such that it overlaps the first solar cell while being lifted. The first mechanical arm and the second mechanical arm may place the first solar cell and the second solar cell on the surface while the second solar cell overlaps the first solar cell.

In another aspect, a solar cell shingling device is provided. The device may include a first moving device operable to lift a first solar cell segment from a first platform, a second moving device operable to lift, from the first platform, a second solar cell segment that follows the first solar cell segment on the first platform, and a control mechanism operable to control the first moving device and the second moving device to layer a leading edge of the second solar cell segment on top of a trailing edge of the first solar cell segment, while transporting the first and second solar cell segments toward a second platform.

What is claimed is:

1. A system for automated assembly of a solar panel, the system comprising:
   a conveyor module for conveying one or more solar cells;
   a laser scribing module configured to scribe the solar cells conveyed by the conveyor module at one or more predetermined scribing locations,
   a cleaving module configured to apply pressure along regions of the solar cells that are scribed by the laser scribing module to divide the solar cells into two or more strips; and
   a vacuum module configured to shift and align the two or more strips to form a string of the two or more strips such that the two or more strips partially overlap and are in physical contact, wherein the vacuum module comprises a first mechanical arm configured to lift a first of the two or more strips from a surface, a second mechanical arm configured to lift a second of the two or more strips from the surface, and the first mechanical arm and the second mechanical arm align the second strip to partially overlap the first strip, and wherein the first mechanical arm and the second mechanical arm place the first strip and the second strip on the surface while the second strip partially overlaps the first strip.

2. The system of claim 1, the system further comprising:
   an adhesive application module configured to apply adhesive at predetermined adhesive locations on the two or more strips.

3. The system of claim 2, the system further comprising:
   an annealing module configured to cure the adhesive by applying heat to a surface of the string of strips.

4. The system of claim 3, wherein the annealing module comprises a heated surface configured to house the string of strips and apply a predetermined temperature to one side of the string of strips.

5. The system of claim 3, wherein the annealing module comprises heated bars configured to apply a predetermined temperature to two sides of the string of strips at the predetermined adhesive locations.

6. The system of claim 1, the system further comprising:
a probe testing module configured to probe test the two or more strips while the two or more strips are being lifted via the vacuum module.

7. A system for automated assembly of a solar panel, the system comprising:
a conveyor module for conveying one or more solar cells;
a laser scribing module configured to scribe the solar cells conveyed by the conveyor module at one or more predetermined scribing locations;
a cleaving module configured to apply pressure along regions of the solar cells that are scribed by the laser scribing module to divide the solar cells into two or more strips; and
a shingling module configured to reposition the two or more strips to form a string of the two or more strips such that the two or more strips partially overlap and are in physical contact, wherein the shingling module comprises a first mechanical arm configured to lift a first of the two or more strips from a surface, a second mechanical arm configured to lift a second of the two or more strips from the surface, and the first mechanical arm and the second mechanical arm align the second strip to partially overlap the first strip, and wherein the first mechanical arm and the second mechanical arm place the first strip and the second strip on the surface while the second strip partially overlaps the first strip.

8. The system of claim 7, further comprising:
an adhesive application module configured to apply adhesive at predetermined adhesive locations on the two or more strips.

9. The system of claim 8, the system further comprising:
an annealing module configured to cure the adhesive by applying heat to a surface of the string of strips.

10. The system of claim 9, wherein the annealing module comprises a heated surface configured to house the string of solar strips and apply a predetermined temperature to one side of the string of strips.

11. The system of claim 9, wherein the annealing module comprises heated bars configured to apply a predetermined temperature to two sides of the string of strips at the predetermined adhesive locations.

12. The system of claim 7, the system further comprising:
a probe testing module configured to probe test the two or more solar strips.

* * * * *